(12) United States Patent
Levermore

(10) Patent No.: US 12,139,627 B2
(45) Date of Patent: Nov. 12, 2024

(54) PEROVSKITE INK FORMULATIONS

(71) Applicant: EXCYTON LIMITED, Durham (GB)

(72) Inventor: Peter Levermore, Durham (GB)

(73) Assignee: EXCYTON LIMITED, Durham (GB)

( * ) Notice: Subject to any disclaimer, the term of this patent is extended or adjusted under 35 U.S.C. 154(b) by 374 days.

(21) Appl. No.: 17/616,339

(22) PCT Filed: Jun. 4, 2020

(86) PCT No.: PCT/GB2020/051354
§ 371 (c)(1),
(2) Date: Dec. 3, 2021

(87) PCT Pub. No.: WO2020/245592
PCT Pub. Date: Dec. 10, 2020

(65) Prior Publication Data
US 2022/0235238 A1    Jul. 28, 2022

(30) Foreign Application Priority Data

Jun. 6, 2019  (GB) .................................... 1908046

(51) Int. Cl.
| | |
|---|---|
| *H01L 51/00* | (2006.01) |
| *C09D 11/033* | (2014.01) |
| *C09D 11/037* | (2014.01) |
| *C09D 11/322* | (2014.01) |
| *C09D 11/36* | (2014.01) |
| *C09D 11/50* | (2014.01) |

(Continued)

(52) U.S. Cl.
CPC ............ *C09D 11/50* (2013.01); *C09D 11/033* (2013.01); *C09D 11/037* (2013.01); *C09D 11/322* (2013.01); *C09D 11/36* (2013.01); *H10K 50/115* (2023.02); *H10K 71/135* (2023.02); *H10K 71/40* (2023.02)

(58) Field of Classification Search
None
See application file for complete search history.

(56) References Cited

U.S. PATENT DOCUMENTS

2008/0165235 A1  7/2008  Rolly et al.
2010/0002324 A1  1/2010  Rozhin et al.
(Continued)

FOREIGN PATENT DOCUMENTS

| CN | 107674500 | 2/2018 |
|----|-----------|--------|
| CN | 108912845 | 11/2018 |
| WO | 2018095380 | 5/2018 |

OTHER PUBLICATIONS

Protesescu, Loredana, et al. "Nanocrystals of cesium lead halide perovskites ($CsPbX_3$, X= Cl, Br, and I): novel optoelectronic materials showing bright emission with wide color gamut." Nano letters 15.6 (2015): 3692-3696.
(Continued)

*Primary Examiner* — Asok K Sarkar
(74) *Attorney, Agent, or Firm* — Meunier Carlin & Curfman LLC

(57) ABSTRACT

A perovskite ink is provided. The perovskite ink comprises a first polar solvent. The first polar solvent has a boiling point of 150° C. or more and a melting point of 30° C. or less. The perovskite ink further comprises a first light emitting perovskite material mixed in the first polar solvent at a concentration in the range of 0.01 wt. % to 10 wt. %.

20 Claims, 26 Drawing Sheets

(51) Int. Cl.
    *H01L 51/50*   (2006.01)
    *H10K 50/115*  (2023.01)
    *H10K 71/13*   (2023.01)
    *H10K 71/40*   (2023.01)

(56) References Cited

U.S. PATENT DOCUMENTS

| | | | |
|---|---|---|---|
| 2017/0358759 A1* | 12/2017 | Lee | C01G 21/16 |
| 2018/0166512 A1 | 6/2018 | Hack et al. | |
| 2018/0331312 A1 | 11/2018 | Pan et al. | |
| 2019/0018287 A1 | 1/2019 | Lüchinger et al. | |
| 2019/0062581 A1 | 2/2019 | Zhang | |
| 2019/0148602 A1* | 5/2019 | Mu | C09K 11/665 |
| | | | 362/362 |
| 2019/0267556 A1* | 8/2019 | Kim | H10K 85/633 |
| 2019/0276696 A1 | 9/2019 | Pan et al. | |
| 2020/0059673 A1 | 2/2020 | Lejeune | |
| 2020/0243482 A1 | 7/2020 | Nakamura et al. | |

OTHER PUBLICATIONS

Non-Final Office Action issued in U.S. Appl. No. 17/049,423 on May 24, 2022.
International Search Report and Written Opinion issued for Application No. PCT/GB2020/051354, dated Jul. 27, 2020.
International Preliminary Report on Patentability issued for Application No. PCT/GB2020/051354, dated Dec. 16, 2021.
Search report issued for Application No. GB1908046, dated Sep. 30, 2019.
Soneira et al., iPhone X OLED Display Technology Shoot-Out, DisplayMate Technologies Corporation, http://www.displaymate.com/iPhoneX ShootOut la.htm [accessed Apr. 20, 2018].
Adjokatse, Sampson, Hong-Hua Fang, and Maria Antonietta Loi. "Broadly tunable metal halide perovskites for solid-state light-emission applications." Materials Today 20.8 (2017): 413-424.
Byeong Jo Kim et al., Selective dissolution of halide perovskites as a step towards recycling solar cells, Nature Communications, vol. 7, Article 11735 (2016).
Akkerman, Quinten A., et al. "Genesis, challenges and opportunities for colloidal lead halide perovskite nanocrystals." Nature materials 17.5 (2018): 394-405.
Hirose, Tomoya, et al. "20-4: High-efficiency Perovskite QLED Achieving BT. 2020 Green Chromaticity." SID Symposium Digest of Technical Papers. vol. 48. No. 1. 2017, 284-287.
Kumar, Sudhir, et al. "Efficient blue electroluminescence using quantum-confined two-dimensional perovskites." ACS nano 10.10 (2016): 9720-9729.
Yan, Fei, and Hilmi Volkan Demir. "LEDs using halide perovskite nanocrystal emitters." Nanoscale 11.24 (2019): 11402-11412.
Mathies, Florian, et al. "Multipass inkjet printed planar methylammonium lead iodide perovskite solar cells." Journal of Materials Chemistry A 4.48 (2016): 19207-19213.
Zhenfu, Zhao, et al. "Perovskite quantum dots as fluorescent materials for multi-colored lighting." Journal of Materials Science 53.22 (2018): 15430-15441.
Palazon, Francisco, et al. "Polymer-free films of inorganic halide perovskite nanocrystals as UV-to-white color-conversion layers in LEDs." Chemistry of Materials 28.9 (2016): 2902-2906.
Deng, Yehao, et al. "Surfactant-controlled ink drying enables high-speed deposition of perovskite films for efficient photovoltaic modules." Nature Energy 3.7 (2018): 560-566.
Wang, Nana, et al. "Perovskite light-emitting diodes based on solution-processed self-organized multiple quantum wells." Nature Photonics 10.11 (2016): 699-704.

* cited by examiner (a) DCI-P3

(b) Rec. 2020

(a)

(b)

| 1505  (a) Cyclohexanone | 1510  (b) Cyclohexanol |
| --- | --- |
| 1515  (c) MEA | 1520  (d) Benzonitrile |
| 1525  (e) EG | 1530  (f) Formamide |

| | |
|---|---|
| 1535  (g) Cyrene | 1540  (h) DG |
| 1545  (i) Glycerol | |

| 1601 | 1602 |
|---|---|
|  |  |
| 1603 | 1604 |
|  |  |
| 1605 | 1606 |
|  |  |

| 1607  | 1608  |
| --- | --- |
| 1609  | 1610  |
| 1611  | 1612  |

| 1613 | 1614 |
|---|---|
|  |  |
| 1615 | 1616 |
|  |  |
| 1617 | 1618 |
|  |  |

| 1625 | 1626 |
|---|---|
|  |  |
| 1627 | 1628 |
|  |  |
| 1629 | 1630 |
|  |  |

| 1631 | 1632 |
|---|---|
|  |  |
| 1633 | 1634 |
|  |  |
| 1635 | 1636 |
|  |  |

| 1637  | 1638  |
| --- | --- |
| 1639  | 1640  |
| 1641  | 1642  |

| 1643 | 1644 |
|---|---|
|  |  |
| 1645 | 1646 |
|  |  |
| 1647 | 1648 |
|  |  |

| 1649  | 1650  |
|---|---|
| 1651  | |
| | |

PEROVSKITE INK FORMULATIONS

TECHNICAL FIELD

The present invention relates to perovskite ink formulations comprising perovskite light emitting material. The present invention also relates to methods of assembling perovskite emissive layers from perovskite ink formulations comprising perovskite light emitting material. The present invention also relates to perovskite light emitting devices comprising perovskite emissive layers, and in particular to methods of fabricating perovskite light emitting devices comprising perovskite emissive layers assembled from perovskite ink formulations.

BACKGROUND

Perovskite materials are becoming increasingly attractive for application in optoelectronic devices. Many of the perovskite materials used to make such devices are earth-abundant and relatively inexpensive, so perovskite optoelectronic devices have the potential for cost advantages over alternative organic and inorganic devices. Additionally, inherent properties or perovskite materials, such as an optical band gap that is readily tunable across the visible, ultra-violet and infra-red, render them well suited for optoelectronics applications, such as perovskite light emitting diodes (PeLEDs), perovskite solar cells and photodetectors, perovskite lasers, perovskite transistors, perovskite visible light communication (VLC) devices and others. PeLEDs comprising perovskite light emitting material may have performance advantages over conventional organic light emitting diodes (OLEDs) comprising organic light emitting material. For example, strong electroluminescent properties, including unrivalled high colour purity enabling displays with wider colour gamut, excellent charge transport properties and low non-radiative rates.

PeLEDs make use of thin perovskite films that emit light when voltage is applied. PeLEDs are becoming an increasingly attractive technology for use in applications such as displays, lighting and signage. As an overview, several PeLED materials and configurations are described in Adjokatse et al., which is included herein by reference in its entirety.

One potential application for perovskite light-emitting materials is a display. Industry standards for a full-colour display require for sub-pixels to be engineered to emit specific colours, referred to as "saturated" colours. These standards call for saturated red, green and blue sub-pixels, where colour may be measured using CIE 1931 (x, y) chromaticity coordinates, which are well known in the art. One example of a perovskite material that emits red light is methylammonium lead iodide ($CH_3NH_3PbI_3$). One example of a perovskite material that emits green light is formamidinium lead bromide ($CH(NH_2)_2PbBr_3$). One example of a perovskite material that emits blue light is methylammonium lead chloride ($CH_3NH_3PbCl_3$). In a display, performance advantages, such as increased colour gamut, may be achieved where PeLEDs are used in place of or in combination with OLEDs and QLEDs.

The present invention relates to perovskite ink formulations comprising perovskite light emitting material. The present invention also relates to methods of assembling perovskite emissive layers from perovskite ink formulations comprising perovskite light emitting material. The present invention also relates to perovskite light emitting devices comprising perovskite emissive layers, and in particular to methods of fabricating perovskite light emitting devices comprising perovskite emissive layers assembled from perovskite ink formulations.

As used herein, the term "perovskite" includes any perovskite material that may be used in an optoelectronic device. Any material that may adopt a three-dimensional (3D) structure of $ABX_3$, where A and B are cations and X is an anion, may be considered a perovskite material. FIG. 1 depicts an example of a perovskite material with a 3D structure of $ABX_3$. The A cations may be larger than the B cations. The B cations may be in 6-fold coordination with surrounding X anions. The A anions may be in 12-fold coordination with surrounding X anions.

There are many classes of perovskite material. One class of perovskite material that has shown particular promise for optoelectronic devices is the metal halide perovskite material class. For metal halide perovskite material, the A component may be a monovalent organic cation, such as methylammonium ($CH_3NH_3^+$) or formamidinium ($CH(NH_2)_2^+$), an inorganic atomic cation, such as caesium ($Cs^+$), or a combination thereof, the B component may be a divalent metal cation, such as lead ($Pb^+$), tin ($Sn^+$), copper ($Cu^+$), europium ($Eu^+$) or a combination thereof, and the X component may be a halide anion, such as $I^-$, $Br^-$, $Cl^-$, or a combination thereof. Where the A component is an organic cation, the perovskite material may be defined as an organic metal halide perovskite material. $CH_3NH_3PbBr_3$ and $CH(NH_2)_2PbI_3$ are non-limiting examples of organic metal halide perovskite materials. Where the A component is an inorganic cation, the perovskite material may be defined as an inorganic metal halide perovskite material. $CsPbI_3$, $CsPbCl_3$ and $CsPbBr_3$ are non-limiting examples of inorganic metal halide perovskite materials.

As used herein, the term "perovskite" further includes any material that may adopt a layered structure of $L_2(ABX_3)_{n-1}BX_4$ (which may also be written as $L_2A_{n-1}B_nX_{3n+1}$), where L, A and B are cations, X is an anion, and n is the number of $BX_4$ monolayers disposed between two layers of cation L. FIG. 2 depicts examples of perovskite materials with a layered structure of $L_2(ABX_3)_{n-1}BX_4$ having different values for n. For metal halide perovskite material, the A component may be a monovalent organic cation, such as methylammonium ($CH_3NH_3^+$) or formamidinium ($CH(NH_2)_2^+$), an atomic cation, such as caesium ($Cs^+$), or a combination thereof, the L component may be an organic cation such as 2-phenylethylammonium ($C_6H_5C_2H_4NH_3^+$) or 1-napthylmethylammonium ($C_{10}H_7CH_2NH_3^+$), the B component may be a divalent metal cation, such as lead ($Pb^+$), tin ($Sn^+$), copper ($Cu^+$), europium ($Eu^+$) or a combination thereof, and the X component may be a halide anion, such as $I^-$, $Br^-$, $Cl^-$, or a combination thereof. $(C_6H_5C_2H_4NH_3)_2(CH(NH_2)_2PbBr_3)_{n-1}PbBr_4$ and $(C_{10}H_7CH_2NH_3)_2(CH_3NH_3PbI_2Br)_{n-1}PbI_3Br$ are non-limiting examples of metal halide perovskite material with a layered structure.

Where the number of layers n is large, for example n greater than approximately 10, perovskite material with a layered structure of $L_2(ABX_3)_{n-1}BX_4$ adopts a structure that is approximately equivalent to perovskite material with a 3D structure of $ABX_3$. As used herein, and as would generally be understood by one skilled in the art, perovskite material having a large number of layers may be referred to as a 3D perovskite material, even though it is recognized that such perovskite material has reduced dimensionality from n=∞. Where the number of layers n=1, perovskite material with a layered structure of $L_2(ABX_3)_{n-1}BX_4$ adopts a two-dimensional (2D) structure of $L_2BX_4$. Perovskite material having a single layer may be referred to as a 2D perovskite material. Where n is small, for example n in the range of approximately 2-10, perovskite material with a layered structure of $L_2(ABX_3)_{n-1}BX_4$ adopts a quasi-two-dimensional (Quasi-2D) structure. Perovskite material having a small number of layers may be referred to as a Quasi-2D perovskite material. Owing to quantum confinement effects, the energy band gap is lowest for layered perovskite material structures where n is highest.

Perovskite material may have any number of layers. Perovskites may comprise 2D perovskite material, Quasi-2D perovskite material, 3D perovskite material or a combination thereof. For example, perovskites may comprise an ensemble of layered perovskite materials having different numbers of layers. For example, perovskites may comprise an ensemble of Quasi-2D perovskite materials having different numbers of layers.

As used herein, the term "perovskite" further includes films of perovskite material. Films of perovskite material may be crystalline, polycrystalline or a combination thereof, with any number of layers and any range of grain or crystal size.

As used herein, the term "perovskite" further includes nanocrystals of perovskite material such as perovskite nanocrystals that have a discrete structure equivalent to or resembling the 3D perovskite structure of $ABX_3$ or the more general layered perovskite structure of $L_2(ABX_3)_{n-1}BX_4$. Nanocrystals of perovskite material may include perovskite nanoparticles, perovskite nanowires, perovskite nanoplatelets, or a combination thereof.

Nanocrystals of perovskite material may be of any shape or size, with any number of layers and any range of grain or crystal sizes. Preferably, the number of layers of a perovskite nanocrystal may be in the range of n=2 to n=20. More preferably, the number of layers of a perovskite nanocrystal may be in the range of n=2 to n=10 to maximize the effects of quantum confinement. Preferably, a perovskite nanocrystal has a substantially spherical or cuboid shape. By a substantially spherical or cuboid shape it is meant that each of the X, Y and Z dimensions of the perovskite nanocrystal are substantially the same. By substantially the same it is meant that each one of the X, Y and Z dimensions of the perovskite nanocrystal are within a factor of 5 of each one of the other X, Y and Z dimensions. Preferably, each one of the X, Y and Z dimensions of the perovskite nanocrystal are within a factor of 2 of each one of the other X, Y and Z dimensions. This substantially spherical or cuboid perovskite nanocrystal geometry is in contrast to 2D, Quasi-2D and 3D perovskite materials, wherein at least one of the X, Y and Z dimensions may be substantially different than at least one of the other X, Y and Z dimensions, and in some cases may be orders of magnitude different.

FIG. 3 depicts an example of nanocrystal of perovskite material with a layered structure that resembles $L_2(ABX_3)_{n-1}BX_4$, where n=5 and L cations are arranged at the surface of the perovskite nanocrystal. The term "resembles" is used because for a nanocrystal of perovskite material, the distribution of L cations may differ from that of perovskite material with a formal layered structure of $L_2(ABX_3)_{n-1}BX_4$. For example, in a nanocrystal of perovskite material, there may be a greater proportion of L cations arranged along the sides of the nanocrystal.

Several types of perovskite material may be stimulated to emit light in response to optical or electrical excitation. That is to say that perovskite light emitting material may be photoluminescent or electroluminescent. As used herein, the term "perovskite light emitting material" refers exclusively to electroluminescent perovskite light emitting material that is emissive through electrical excitation. Wherever "perovskite light emitting material" is referred to in the text, it should be understood that reference is being made to electroluminescent perovskite light emitting material. This nomenclature may differ slightly from that used by other sources. In particular, the present invention relates to perovskite ink formulations comprising perovskite light emitting material.

A perovskite ink formulation may be considered to contain perovskite light emitting material if an electroluminescent perovskite emissive layer may be assembled from the perovskite ink formulation by methods including but not limited to those disclosed herein. A perovskite ink formulation may not be electroluminescent, but it may still be considered to contain perovskite light emitting material if an electroluminescent perovskite emissive layer may be assembled from the perovskite light emitting material mixed in the perovskite ink formulation. Furthermore, perovskite light emitting material may not be electroluminescent while mixed in a perovskite ink formulation, but the perovskite ink formulation may still be considered to contain perovskite light emitting material if an electroluminescent perovskite emissive layer may be assembled from the perovskite light emitting material mixed in the perovskite ink formulation.

Perovskite light emitting material may comprise perovskite material, including nanocrystals of perovskite material. Perovskite light emitting material may further comprise perovskite precursor material. As used herein, the term "perovskite precursor material" refers to precursor material that may participate in a chemical reaction to assemble perovskite material, and in particular to precursor materials that may participate in a chemical reaction to assemble perovskite light emitting material in an electroluminescent perovskite emissive layer. Examples of perovskite precursor materials include $CH_3NH_3I$ and $PbI_2$ which may assemble an electroluminescent perovskite emissive layer comprising perovskite material $CH_3NH_3PbI_3$, and $CH(NH_2)_2Br$ and $PbBr_2$ which may assemble an electroluminescent perovskite emissive layer comprising perovskite material $CH(NH_2)_2PbBr_3$.

In one embodiment, an electroluminescent layer may be assembled from perovskite light emitting material mixed in a perovskite ink formulation, wherein the perovskite light emitting material comprises perovskite material. In one embodiment, an electroluminescent layer may be assembled from perovskite light emitting material mixed in a perovskite ink formulation, wherein the perovskite light emitting material comprises nanocrystals of perovskite material. In one embodiment, an electroluminescent layer may be assembled from perovskite light emitting material mixed in a perovskite ink formulation, wherein the perovskite light emitting material comprises perovskite precursor material.

In general, PeLED devices may be photoluminescent or electroluminescent. As used herein, the term "PeLED" refers exclusively to electroluminescent devices that comprise electroluminescent perovskite light emitting material. The term "PeLED" may be used to describe single emissive unit electroluminescent devices that comprise electroluminescent perovskite light emitting material. The term "PeLED" may also be used to describe one or more emissive units of stacked electroluminescent devices that comprise electroluminescent perovskite light emitting material. This nomenclature may differ slightly from that used by other sources.

As used herein, the term "quantum dot" includes quantum dot material, quantum rod material and other luminescent material, with the exception of "perovskite" material, which is defined separately herein. Quantum dots may generally be considered as semiconductor nanoparticles that exhibit properties that are intermediate between bulk semiconductors and discrete molecules. Quantum dots may comprise III-V semiconductor material, such as gallium nitride (GaN), gallium phosphide (GaP), gallium arsenide (GaAs), indium phosphide (InP) and indium arsenide (InAs), or II-VI semiconductor material, such as zinc oxide (ZnO), zinc sulfide (ZnS), cadmium sulfide (CdS), cadmium selenide (CdSe) and cadmium telluride (CdTe), or combinations thereof. In general, as a result of quantum confinement effects, optoelectronic properties of quantum dots may change as a function of size or shape of the quantum dot.

Several types of quantum dot may be stimulated to emit light in response to optical or electrical excitation. That is to say that quantum dot light emitting material may be photoluminescent or electroluminescent. As used herein, the term "quantum dot light emitting material" refers exclusively to electroluminescent quantum dot light emitting material that is emissive through electrical excitation. Wherever "quantum dot light emitting material" is referred to in the text, it should be understood that reference is being made to electroluminescent quantum dot light emitting material. This nomenclature may differ slightly from that used by other sources.

As used herein, the term "quantum dot" does not include "perovskite" material. Several types of perovskite material, such as perovskite nanocrystals, 2D perovskite materials and Quasi-2D perovskite materials, are semiconducting materials that exhibit properties intermediate between bulk semiconductors and discrete molecules, where in a similar manner to quantum dots, quantum confinement may affect optoelectronic properties. In particular, perovskite nanocrystals may have some structural similarity to quantum dots. However, as used herein, such materials are referred to as "perovskite" materials and not "quantum dot" materials. A first reason for this nomenclature is that perovskite materials and quantum dot materials, as defined herein, generally comprise different crystal structures. A second reason for this nomenclature is that perovskite materials and quantum dot materials, as defined herein, generally comprise different material types within their structures. A third reason for this nomenclature is that emission from perovskite material is generally independent of the structural size of the perovskite material, whereas emission from quantum dot material is generally dependent on the structural size (e.g. core and shell) of the quantum dot material. This nomenclature may differ slightly from that used by other sources.

In general, quantum dot light emitting materials comprise a core. Optionally, the core may be surrounded by one or more shells. Optionally, the core and one or more shells may be surrounded by a passivation structure. Optionally, the passivation structure may comprise ligands bonded to the one or more shells. The size of the of the core and shell(s) may influence the optoelectronic properties of quantum dot light emitting material. Generally, as the size of the core and shell(s) is reduced, quantum confinement effects become stronger, and electroluminescent emission may be stimulated at shorter wavelength. For display applications, the diameter of the core and shell(s) structure is typically in the range of 1-10 nm. Quantum dots that emit blue light are typically the smallest, with core-shell(s) diameter in the approximate range of 1-2.5 nm. Quantum dots that emit green light are typically slightly larger, with core-shell(s) diameter in the approximate range of 2.5-4 nm. Quantum dots that emit red light are typically larger, with core-shell(s) diameter in the approximate range of 5-7 nm. It should be understood that these ranges are provided by way of example and to aid understanding and are not intended to be limiting.

Examples of quantum dot light emitting materials include materials comprising a core of CdSe. CdSe has a bulk bandgap of 1.73 eV, corresponding to emission at 716 nm. However, the emission spectrum of CdSe may be adjusted across the visible spectrum by tailoring the size of the CdSe quantum dot. Quantum dot light emitting materials comprising a CdSe core may further comprise one or more shells, comprising CdS, ZnS or combinations thereof. Quantum dot light emitting materials comprising CdSe may further comprise a passivation structure, which may include ligands bonded to the shell(s). Quantum dot light emitting materials comprising CdSe/CdS or CdSe/ZnS core-shell structures may be tuned to emit red, green or blue light for application in displays and/or light panels.

Examples of quantum dot light emitting materials further include materials comprising a core of InP. InP has a bulk bandgap of 1.35 eV, corresponding to emission at 918 nm. However, the emission spectrum of InP may be adjusted across the visible spectrum by tailoring the size of the InP quantum dot. Quantum dot light emitting materials comprising an InP core may further comprise one or more shells of CdS, ZnS or combinations thereof. Quantum dot light emitting materials comprising InP may further comprise a passivation structure, which may include ligands bonded to the shell(s). Quantum dot light emitting materials comprising InP/CdS or InP/ZnS core-shell structures may be tuned to emit red, green or blue light for application in displays and/or light panels.

In general, QLED devices may be photoluminescent or electroluminescent. As used herein, the term "QLED" refers exclusively to electroluminescent devices that comprise electroluminescent quantum dot light emitting material. The term "QLED" may be used to describe single emissive unit electroluminescent devices that comprise electroluminescent quantum dot light emitting material. The term "QLED" may also be used to describe one or more emissive units of stacked electroluminescent devices that comprise electroluminescent quantum dot light emitting material. This nomenclature may differ slightly from that used by other sources.

As used herein, "top" means furthest away from the substrate, while "bottom" means closest to the substrate. Where a first layer is described as "disposed over" a second layer, the first layer is disposed further away from the substrate. There may be other layers between the first and second layer, unless it is specified that the first layer is "in contact with" the second layer.

As used herein, "solution processible" means capable of being dissolved, dispersed or transported in and/or deposited from a liquid medium, either in solution or suspension form.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) and electron affinities (EA) are measured as negative energies relative to a vacuum level, a higher HOMO energy level corresponds to an IP that is less negative. Similarly, a higher LUMO energy level corresponds to an EA that is less negative. On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. The definitions of HOMO and LUMO energy levels therefore follow a different convention than work functions.

SUMMARY

A perovskite ink is provided. In one embodiment, the perovskite ink comprises: a first polar solvent, wherein the first polar solvent has a boiling point 150° C. or more and a melting point of 30° C. or less; and a first perovskite light emitting material mixed in the first polar solvent, wherein the concentration of the first perovskite light emitting material in the perovskite ink is in the range of 0.01 wt. % to 10 wt. %. In one embodiment, the first polar solvent has a boiling point of 200° C. or more.

In one embodiment, the first polar solvent is an aprotic solvent. In one embodiment, the first perovskite light emitting material comprises a first set of light emitting perovskite nanocrystals, wherein the number of layers of each light emitting perovskite nanocrystal in the first set is in the range of 2-10. In one embodiment, the perovskite ink further comprises a second perovskite light emitting material, wherein the second perovskite light emitting material is different from the first perovskite light emitting material. In one embodiment, the second perovskite light emitting material comprises a second set of light emitting perovskite nanocrystals, wherein the number of layers of each light emitting perovskite nanocrystal in the second set is in the range of 2-10. In one embodiment, the perovskite ink further comprises a third perovskite light emitting material, wherein the third perovskite light emitting material is different from the first perovskite light emitting material and the second perovskite light emitting material. In one embodiment, the third perovskite light emitting material comprises a third set of light emitting perovskite nanocrystals, wherein the number of layers of each light emitting perovskite nanocrystal in the third set is in the range of 2-10. In one embodiment, the first perovskite light emitting material comprises perovskite precursor material.

In one embodiment, the perovskite ink further comprises a second solvent that is different from the first polar solvent. In one embodiment, the perovskite ink further comprises a third solvent that is different from the first polar solvent and the second solvent. In one embodiment, the perovskite ink further comprises a fourth solvent that is different from the first polar solvent, the second solvent and the third solvent. In one embodiment, the boiling point of the second solvent is 200° C. or higher. In one embodiment, the second solvent is a non-polar solvent. In one embodiment, the concentration of second solvent in the perovskite ink formulation is in the range of 0.01% wt. to 20% wt. In one embodiment, the perovskite ink further comprises at least one surfactant.

In one embodiment, the first polar solvent has a boiling point in the range of 150° C. to 300° C. In one embodiment, the first polar solvent has a boiling point in the range of 200° C. to 300° C. In one embodiment, the first polar solvent has a boiling point in the range of 225° C. to 300° C. In one embodiment, the first polar solvent has a boiling point in the range of 250° C. to 300° C.

In one embodiment, the first polar solvent has a vapour pressure of 5 mmHg or less. In one embodiment, the first polar solvent has a relative evaporation rate of 20 or less.

In one embodiment, the viscosity of the perovskite ink is in the range of 1 mPa·s to 10 mPa·s. In one embodiment, the surface tension of the perovskite ink is in the range of 15 dyne/cm to 55 dyne/cm. In one embodiment, the concentration of water in the perovskite ink is less than or equal to 0.5 wt. %. In one embodiment, the concentration of oxygen in the perovskite ink is less than or equal to 10 ppm.

In one embodiment, the first polar solvent is dimethylformamide (DMF), dimethylacetamide (DMAc) or dimethyl sulfoxide (DMSO). In one embodiment, the first polar solvent is cyclohexanone, cyclohexanol, 2-aminoethanol (MEA), benzonitrile or ethylene glycol (EG). In one embodiment, the first polar solvent is N-Methyl-2-Pyrrolidone (NMP), Gamma-Butyrolactone (GBL) or Gamma-Valerolactone (GVL). In one embodiment, the first polar solvent is formamide. In one embodiment, the first polar solvent is 1,3-Dimethyl-2-Imidazolidinone (DMI), Hexamethylphosphoramide (HMPA), Propylene Carbonate (PC) Ethylene Carbonate (EC) or N,N'-Dimethylpropyleneurea (DMPU). In one embodiment, the first polar solvent is dihydrolevoglucosenone (cyrene) or diethylene glycol (DG). In one embodiment, the first polar solvent is sulfolane. In one embodiment, the first polar solvent in glycerol.

A method of assembling a perovskite emissive layer in provided. In one embodiment, the method comprises the steps of: providing a substrate; providing a perovskite ink, wherein the perovskite ink comprises a first polar solvent having a boiling point of 150° C. or more and a melting point of 30° C. or less, and a first perovskite light emitting material mixed in the first polar solvent at a concentration in the range of 0.01 wt. % to 10 wt. %; and depositing the perovskite ink onto the substrate by the method of inkjet printing. In one embodiment, after the step of depositing the perovskite ink onto the substrate by the method of inkjet printing, the method further comprises the step of vacuum drying the perovskite ink to assemble a perovskite emissive layer. In one embodiment, after the step of vacuum drying the perovskite ink to assemble a perovskite emissive layer, the method further comprises the step of annealing the perovskite emissive layer.

A perovskite light emitting device is provided. In one embodiment, at least one perovskite emissive layer of the perovskite light emitting device is fabricated by a method comprising the steps of: providing a substrate; providing a perovskite ink, wherein the perovskite ink comprises a first polar solvent having a boiling point of 150° C. or more and a melting point of 30° C. or less, and a first perovskite light emitting material mixed in the first polar solvent at a concentration in the range of 0.01 wt. % to 10 wt. %; and depositing the perovskite ink onto the substrate by the method of inkjet printing.

A method of assembling a perovskite emissive layer is provided. In one embodiment, the method comprises the steps of: providing a substrate; providing a perovskite ink, wherein the perovskite ink comprises a first polar solvent having a boiling point of 200° C. or more and a melting point of 30° C. or less, and a first perovskite light emitting material mixed in the first polar solvent at a concentration in the range of 0.01 wt. % to 10 wt. %; and depositing the perovskite ink onto the substrate by the method of inkjet printing. In one embodiment, after the step of depositing the perovskite ink onto the substrate by the method of inkjet printing, the method further comprises the step of vacuum drying the perovskite ink to assemble a perovskite emissive layer. In one embodiment, after the step of vacuum drying the perovskite ink to assemble a perovskite emissive layer, the method further comprises the step of annealing the perovskite emissive layer.

A perovskite light emitting device is provided. In one embodiment, at least one perovskite emissive layer of the perovskite light emitting device is fabricated by a method comprising the steps of: providing a substrate; providing a perovskite ink, wherein the perovskite ink comprises a first polar solvent having a boiling point of 200° C. or more and a melting point of 30° C. or less, and a first perovskite light emitting material mixed in the first polar solvent at a concentration in the range of 0.01 wt. % to 10 wt. %; and depositing the perovskite ink onto the substrate by the method of inkjet printing.

DESCRIPTION OF THE DRAWINGS

The summary above, as well as the following detailed description of illustrative embodiments, is better understood when read in conjunction with the appended drawings. For the purpose of illustrating the present disclosure, exemplary constructions of the disclosure are shown in the drawings. However, the present disclosure is not limited to specific methods and instrumentalities disclosed herein. Moreover, those in the art will understand that the drawings are not to scale.

In the accompanying drawings, an underlined number is employed to represent an item over which the underlined number is positioned or an item to which the underlined number is adjacent. A non-underlined number relates to an item identified by a line linking the non-underlined number to the item. When a number is non-underlined and accompanied by an associated arrow, the non-underlined number is used to identify a general item at which the arrow is pointing. Embodiments of the present disclosure will now be described, by way of example only, with reference to the following.

DESCRIPTION OF EMBODIMENTS

General device architectures and operating principles for PeLEDs are substantially similar to those for OLEDs. Both of these light emitting devices comprises at least one emissive layer disposed between and electrically connected to an anode and a cathode. For a PeLED, the emissive layer comprises perovskite light emitting material, and is herein referred to as a perovskite emissive layer. For an OLED, the emissive layer comprises organic light emitting material, and is herein referred to as an organic emissive layer. For both of these light emitting devices, when a current is applied, the anode injects holes and the cathode injects electrons into the emissive layer(s). The injected holes and electrons each migrate towards the oppositely charged electrode. When an electron and a hole localize, an exciton, which is a localized electron-hole pair having an excited energy state, may be formed. Light is emitted if the exciton relaxes via a photo-emissive mechanism. Non-radiative mechanisms, such as thermal radiation and/or Auger recombination may also occur but are generally considered undesirable.

Figure 4:
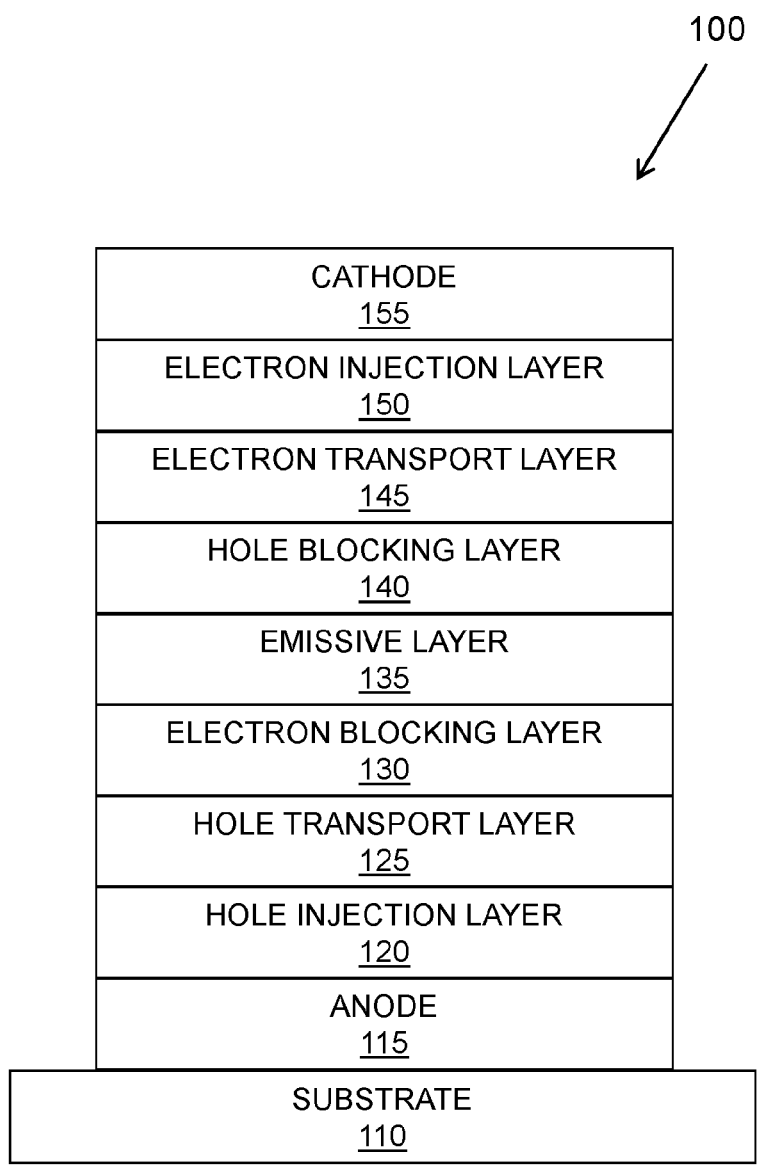
FIG. 4 depicts a perovskite light emitting device.

FIG. 4 shows a light emitting device 100 comprising a single emissive layer. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150 and a cathode 155. The emissive layer 135 may comprise perovskite light emitting material. Device 100 may be fabricated by depositing the layers described in order. As the device 100 has anode 115 disposed under cathode 155, device 100 may be referred to as a "standard" device architecture. If the device were orientated differently, with the cathode 155 disposed under the anode 115, then the device would instead be referred to as an "inverted device architecture.

Figure 5:
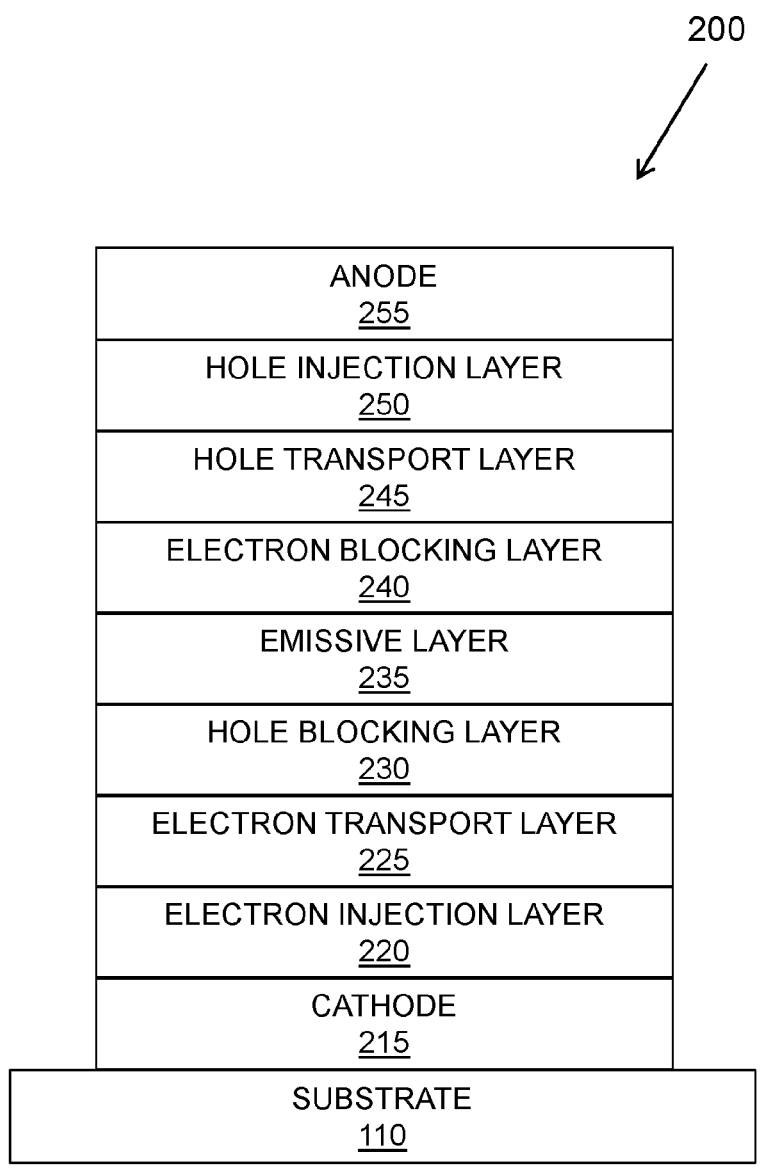
FIG. 5 depicts an inverted perovskite light emitting device.

FIG. 5 shows an inverted light emitting device 200 comprising a single emissive layer. Device 200 may include a substrate 110, a cathode 215, an electron injection layer 220, an electron transport layer 225, a hole blocking layer 230, an emissive layer 235, an electron blocking layer 240, a hole transport layer 245, a hole injection layer 250 and an anode 255. The emissive layer 235 may comprise perovskite light emitting material. Device 200 may be fabricated by depositing the layers described in order.

The simple layered structures illustrated in FIGS. 4 and 5 are provided by way of non-limiting examples, and it is understood that embodiments of the invention may be used in connection with a wide variety of other structures. The specific materials and structures described are exemplary in nature, and other materials and structures may be used. Functional PeLEDs may be achieved by combining the various layers described in different ways, or layers may be omitted entirely, based on factors such as performance, design and cost. Other layers, not specifically described, may also be included. Materials other than those specifically described may be used. Although many of the examples provided herein describe various layers as comprising a single material, it is understood that combinations of materials may be used. Also, the layers may have various sublayers. The names given to the various layers herein are not intended to be strictly limiting. For example, in a device, the hole transport layer may transport and inject holes into the emissive layer and may be described as a hole transport layer or a hole injection layer. For example, in a device, the hole blocking layer may block holes and transport electrons and may be described as a hole blocking layer or an electron transport layer.

FIG. 4 discloses a standard PeLED device architecture, while FIG. 5 discloses an inverted PeLED device architecture. The device architectures depicted in FIG. 4 and FIG. 5 each comprise at least one perovskite emissive layer. The perovskite emissive layer in such PeLED devices may be assembled by depositing a perovskite ink described herein.

PeLEDs are generally intended to emit light through at least one of the electrodes, and one or more transparent electrodes may be useful in such optoelectronic devices. For example, a transparent electrode material, such as indium tin oxide (ITO), may be used for the bottom electrode, while a transparent electrode material, such as a thin metallic layer of a blend of magnesium and silver (Mg:Ag), may be used for the top electrode. For a device intended to emit light only through the bottom electrode, the top electrode does not need to be transparent, and may be comprised of an opaque and/or reflective layer, such as a metal layer having a high reflectivity. Similarly, for a device intended only to emit light through the top electrode, the bottom electrode may be opaque and/or reflective, such as a metal layer having a high reflectivity. Where an electrode does not need to be transparent, using a thicker layer may provide better conductivity and may reduce voltage drop and/or Joule heating in the device, and using a reflective electrode may increase the amount of light emitted through the other electrode by reflecting light back towards the transparent electrode. A fully transparent device may also be fabricated, where both electrodes are transparent.

Devices fabricated in accordance with embodiments of the present invention may optionally comprise a substrate 110. The substrate 110 may comprise any suitable material that provides the desired structural and optical properties. The substrate 110 may be rigid or flexible. The substrate 110 may be flat or curved. The substrate 110 may be transparent, translucent or opaque. Preferred substrate materials are glass, plastic and metal foil. Other substrates, such as fabric and paper may be used. The material and thickness of the substrate 110 may be chosen to obtain desired structural and optical properties.

Devices fabricated in accordance with embodiments of the present invention may optionally comprise an anode 115. The anode 115 may comprise any suitable material or combination of materials known to the art, such that the anode 115 is capable of conducting holes and injecting them into the layers of the device. Preferred anode 115 materials include conductive metal oxides, such as indium tin oxide (ITO), indium zinc oxide (IZO) and aluminum zinc oxide (AlZnO), metals such as silver (Ag), aluminum (Al), aluminum-neodymium (Al:Nd), gold (Au) and alloys thereof, or a combination thereof. Other preferred anode 115 materials include graphene, carbon nanotubes, nanowires or nanoparticles, silver nanowires or nanoparticles, organic materials, such as poly(3,4ethylenedioxythiophene):polystyrene sulfonate (PEDOT:PSS) and derivatives thereof, or a combination thereof. Compound anodes comprising one or more anode materials in a single layer may be preferred for some devices. Multilayer anodes comprising one or more anode materials in one or more layers may be preferred for some devices. One example of a multilayer anode is ITO/Ag/ITO. In a standard device architecture for PeLEDs, the anode 115 may be sufficiently transparent to create a bottom-emitting device, where light is emitted through the substrate. One example of a transparent anode commonly used in a standard device architecture is a layer of ITO. Another example of a transparent anode commonly used in a standard device architecture is ITO/Ag/ITO, where the Ag thickness is less than approximately 25 nm. By including a layer of silver of thickness less than approximately 25 nm, the anode may be transparent as well as partially reflective. When such a transparent and partially reflective anode is used in combination with a reflective cathode, such as LiF/Al, this may have the advantage of creating a microcavity within the device. A microcavity may provide one or more of the following advantages: an increased total amount of light emitted from device, and therefore higher efficiency and brightness; an increased proportion of light emitted in the forward direction, and therefore increased apparent brightness at normal incidence; and spectral narrowing of the emission spectrum, resulting in light emission with increased colour saturation. The anode 115 may be opaque and/or reflective. In a standard device architecture for PeLEDs, a reflective anode 115 may be preferred for some top-emitting devices to increase the amount of light emitted from the top of the device. One example of a reflective anode commonly used in a standard device architecture is a multilayer anode of ITO/Ag/ITO, where the Ag thickness is greater than approximately 80 nm. When such a reflective anode is used in combination with a transparent and partially reflective cathode, such as Mg:Ag, this may have the advantage of creating a microcavity within the device. The material and thickness of the anode 115 may be chosen to obtain desired conductive and optical properties. Where the anode 115 is transparent, there may be a range of thicknesses for a particular material that is thick enough to provide the desired conductivity, yet thin enough to provide the desired degree of transparency. Other materials and structures may be used.

Devices fabricated in accordance with embodiments of the present invention may optionally comprise a hole transport layer 125. The hole transport layer 125 may include any material capable of transporting holes. The hole transport layer 125 may be deposited by a solution process or by a vacuum deposition process. The hole transport layer 125 may be doped or undoped. Doping may be used to enhance conductivity. The hole transport layer 125 may be cross-liked on not cross-linked. Cross-linking may be used to reduce the solubility of the hole transport layer 125 so that solution-processed layers may be deposited on top of the hole transport layer 125 without damaging the underlying hole transport layer 125.

Examples of undoped hole transport layers are N,N'-Di (1-naphthyl)-N,N'-diphenyl(1,1'-biphenyl)-4,4'-diamine (NPD), poly[(9,9-dioctylfluorenyl-2,7-diyl)-co-(4,4'-(N-(4sec-butylphenyl) diphenylamine (TFB), poly[N,N'-bis(4-butylphenyl)-N,N'-bis(phenyl)benzidine] (poly-TPD), poly (9-vinylcarbazole) (PVK), 4,4'-Bis(N-carbazolyl)-1,1'-biphenyl (CBP), Spiro-OMeTAD and molybdenum oxide ($MoO_3$). One example of a doped hole transport layer is 4,4',4"-Tris[phenyl(m-tolyl)amino]triphenylamine (m-MT-DATA) doped with $F_4$-TCNQ at a molar ratio of 50:1. One example of a solution-processed hole transport layer is PEDOT:PSS. One example of a cross-linked hole transport layer is 9,9-Bis[4-[(4-ethenylphenyl)methoxy]phenyl]-N2, N7-di-1-naphthalenyl-N2,N7-diphenyl-9H-Fluorene-2,7-diamine (VB-FNPD). Other hole transport layers and structures may be used. The preceding examples of hole transport materials are especially well-suited to application in PeLEDs.

Devices fabricated in accordance with embodiments of the present invention may optionally comprise one or more emissive layers 135. The emissive layer 135 may include any perovskite material capable of emitting light when a current is passed between anode 115 and cathode 155. The emissive layer 135 of a PeLED may comprise perovskite light emitting material.

Examples of perovskite light-emitting materials include 3D perovskite materials, such as methylammonium lead iodide ($CH_3NH_3PbI_3$), methylammonium lead bromide ($CH_3NH_3PbBr_3$), methylammonium lead chloride ($CH_3NH_3PbCl_3$), formamidinium lead iodide ($CH(NH_2)_2PbI_3$), formamidinium lead bromide ($CH(NH_2)_2PbBr_3$), formamidinium lead chloride ($CH(NH_2)_2PbCl_3$), caesium lead iodide ($CsPbI_3$), caesium lead bromide ($CsPbBr_3$) and caesium lead chloride ($CsPbCl_3$). Examples of perovskite light-emitting materials further include 3D perovskite materials with mixed halides, such as $CH_3NH_3PbI_{3-x}Cl_x$, $CH_3NH_3PbI_{3-x}Br_x$, $CH_3NH_3PbCl_{3-x}Br_x$, $CH(NH_2)_2PbI_{3-x}Br_x$, $CH(NH_2)_2PbI_{3-x}Cl_x$, $CH(NH_2)_2PbCl_{3-x}Br_x$, $CsPbI_{3-x}Cl_x$, $CsPbI_{3-x}Br_x$ and $CsPbCl_{3-x}Br_x$, where x is in the range of 0-3. Examples of perovskite light-emitting materials further include 2D perovskite materials such as $(C_{10}H_2CH_2NH_3)_2PbI_4$, $(C_{10}H_2CH_2NH_3)_2PbBr_4$, $(C_{10}H_2CH_2NH_3)_2PbCl_4$, $(C_6H_5C_2H_4NH_3)_2PbI_4$, $(C_6H_5C_2H_4NH_3)_2PbBr_4$ and $(C_6H_5C_2H_4NH_3)_2PbCl_4$, 2D perovskite materials with mixed halides, such as $(C_{10}H_2CH_2NH_3)_2PbI_{4-x}Cl_x$, $(C_{10}H_2CH_2NH_3)_2PbI_{4-x}Br_x$, $(C_{10}H_2CH_2NH_3)_2PbCl_{4-x}Br_x$, $(C_6H_5C_2H_4NH_3)_2PbI_{4-x}Cl_x$, $(C_6H_5C_2H_4NH_3)_2PbI_{4-x}Br_x$ and $(C_6H_5C_2H_4NH_3)_2PbCl_{4-x}Br_x$, where x is in the range of 0-4. Examples of perovskite light-emitting materials further include Quasi-2D perovskite materials, such as $(C_6H_5C_2H_4NH_3)_2(CH(NH_2)_2PbBr_3)_{n-1}PbI_4$, $(C_6H_5C_2H_4NH_3)_2(CH(NH_2)_2PbBr_3)_{n-1}PbBr_4$, $(C_6H_5C_2H_4NH_3)_2(CH(NH_2)_2PbBr_3)_{n-1}PbCl_4$, $(C_{10}H_2CH_2NH_3)_2(CH_3NH_3PbI_2Br)_{n-1}PbI_4$, $(C_{10}H_2CH_2NH_3)_2(CH_3NH_3PbI_2Br)_{n-1}PbBr_4$ and $(C_{10}H_2CH_2NH_3)_2(CH_3NH_3PbI_2Br)_{n-1}PbCl_4$, where n is the number of layers, and, optionally, n may be in the range of about 2-10. Examples of perovskite light-emitting materials further include Quasi-2D perovskite materials with mixed halides, such as $(C_6H_5C_2H_4NH_3)_2(CH(NH_2)_2PbBr_3)_{n-1}PbI_{4-x}Cl_x$, $(C_6H_5C_2H_4NH_3)_2(CH(NH_2)_2PbBr_3)_{n-1}PbI_{4-x}Br_x$, $(C_6H_5C_2H_4NH_3)_2(CH(NH_2)_2PbBr_3)_{n-1}PbCl_{4-x}Br_x$, $(C_{10}H_7CH_2NH_3)_2(CH_3NH_3PbI_2BO_{n-1}PbI_{4-x}Cl_x$, $(C_{10}H_7CH_2NH_3)_2(CH_3NH_3PbI_2Br)_{n-1}PbI_{4-x}Br_x$ and $(C_{10}H_2CH_2NH_3)_2(CH_3NH_3PbI_2Br)_{n-1}PbCl_{4-x}Br_x$, where n is the number of layers, and, optionally, n may be in the range of about 2-10, and x is in the range of 0-4. Examples of perovskite light-emitting materials further include any of the aforementioned examples, where the divalent metal cation lead ($Pb^+$) may be replaced with tin ($Sn^+$), copper ($Cu^+$) or europium ($Eu^+$). Examples of perovskite light-emitting materials further include perovskite light-emitting nanocrystals with structures that closely resemble Quasi-2D perovskite materials.

Perovskite light emitting material may comprise organic metal halide perovskite material, such as methylammonium lead iodide ($CH_3NH_3PbI_3$), methylammonium lead bromide ($CH_3NH_3PbBr_3$) or methylammonium lead chloride ($CH_3NH_3PbCl_3$), where the materials comprises an organic cation. Perovskite light emitting material may comprise inorganic metal halide perovskite material, such as caesium lead iodide ($CsPbI_3$), caesium lead bromide ($CsPbBr_3$) or caesium lead chloride ($CsPbCl_3$), where the material comprises an inorganic cation. Furthermore, perovskite light emitting material may comprise perovskite light emitting material where there is a combination of organic and inorganic cations. The choice of an organic or inorganic cation may be determined by several factors, including desired emission colour, efficiency of electroluminescence, stability of electroluminescence and ease of processing. Inorganic metal halide perovskite material may be particularly well-suited to perovskite light-emitting materials with a nanocrystal structure, such as those depicted in FIG. 3, wherein an inorganic cation may enable a compact and stable perovskite light-emitting nanocrystal structure.

Perovskite light emitting material may be included in the emissive layer 135 in a number of ways. For example, the emissive layer may comprise 2D perovskite light-emitting material, Quasi-2D perovskite light-emitting material or 3D perovskite light-emitting material, or a combination thereof. Optionally, the emissive layer 135 may comprise an ensemble of Quasi-2D perovskite light emitting materials, where the Quasi-2D perovskite light emitting materials in the ensemble may comprise a different number of layers. An ensemble of Quasi-2D perovskite light emitting materials may be preferred because there may be energy transfer from Quasi-2D perovskite light emitting materials with a smaller number of layers and a larger energy band gap to Quasi-2D perovskite light emitting materials with a larger number of layers and a lower energy band gap. This energy funnel may efficiently confine excitons in a PeLED device and may improve device performance.

Optionally, the emissive layer 135 of a PeLED may be assembled from perovskite precursor material. Examples of perovskite precursor materials include: $CH_3NH_3I$ and $PbI_2$ which may assemble $CH_3NH_3PbI_3$; $CH_3NH_3Br$ and $PbBr_2$ which may assemble $CH_3NH_3PbBr_3$; $CH_3NH_3Cl$ and $PbCl_2$ which may assemble $CH_3NH_3PbCl_3$; $CH(NH_2)_2I$ and $PbI_2$ which may assemble $CH(NH_2)_2PbI_3$; $CH(NH_2)_2Br$ and $PbBr_2$ which may assemble $CH(NH_2)_2PbBr_3$; $CH(NH_2)_2Cl$ and $PbCl_2$ which may assemble $CH(NH_2)_2PbCl_3$; $CsI$ and $PbI_2$ which may assemble $CsPbI_3$; $CsBr$ and $PbBr_2$ which may assemble $CsPbBr_3$; and $CsCl$ and $PbCl_2$ which may assemble $CsPbCl_3$. Optionally, the aforementioned perovskite precursor materials may assemble perovskite materials with mixed halides, including: $CH_3NH_3PbI_{3-x}Cl_x$; $CH_3NH_3PbI_{3-x}Br_x$; $CH_3NH_3PbCl_{3-x}Br_x$; $CH(NH_2)_2PbI_{3-x}Br_x$; $CH(NH_2)_2PbI_{3-x}Cl_x$; $CH(NH_2)_2PbCl_{3-x}Br_x$; $CsPbI_{3-x}Cl_x$; $CsPbI_{3-x}Br_x$ and $CsPbCl_{3-x}Br_x$, where x is in the range of 0-3.

Examples of perovskite precursor materials further include: $C_{10}H_2CH_2NH_3I$ and $PbI_2$ which may assemble $(C_{10}H_2CH_2NH_3)_2PbI_4$; $C_{10}H_2CH_2NH_3Br$ and $PbBr_2$ which may assemble $(C_{10}H_2CH_2NH_3)_2PbBr_4$; $C_{10}H_2CH_2NH_3Cl$ and $PbCl_2$ which may assemble $(C_{10}H_2CH_2NH_3)_2PbCl_4$; $C_6H_5C_2H_4NH_3I$ and $PbI_2$ which may assemble $(C_6H_5C_2H_4NH_3)_2PbI_4$; $C_6H_5C_2H_4NH_3Br$ and $PbBr_2$ which may assemble $(C_6H_5C_2H_4NH_3)_2PbBr_4$; $C_6H_5C_2H_4NH_3Cl$ and $PbCl_2$ which may assemble $(C_6H_5C_2H_4NH_3)_2PbCl_4$. Optionally, the aforementioned perovskite precursor materials may assemble perovskite materials with mixed halides, including: $(C_{10}H_2CH_2NH_3)_2PbI_{4-x}Cl_x$, $(C_{10}H_2CH_2NH_3)_2PbI_{4-x}Br_x$, $(C_{10}H_2CH_2NH_3)_2PbCl_{4-x}Br_x$, $(C_6H_5C_2H_4NH_3)_2PbI_{4-x}Cl_x$, $(C_6H_5C_2H_4NH_3)_2PbI_{4-x}Br_x$ and $(C_6H_5C_2H_4NH_3)_2PbCl_{4-x}Br_x$, where x is in the range of 0-4.

Examples of perovskite precursor materials further include: $C_6H_5C_2H_4NH_3Br$, $CH(NH_2)_2Br$ and $PbI_2$ which may assemble $(C_6H_5C_2H_4NH_3)_2(CH(NH_2)_2PbBr_3)_{n-1}PbI_4$; $C_6H_5C_2H_4NH_3Br$, $CH(NH_2)_2Br$ and $PbBr_2$ which may assemble $(C_6H_5C_2H_4NH_3)_2(CH(NH_2)_2PbBr_3)_{n-1}PbBr_4$; $C_6H_5C_2H_4NH_3Br$, $CH(NH_2)_2Br$ and $PbCl_2$ which may assemble $(C_6H_5C_2H_4NH_3)_2(CH(NH_2)_2PbBr_3)_{n-1}PbCl_4$; $C_{10}H_2CH_2NH_3I$, $CH_3NH_3Br$ and $PbI_2$ which may assemble $(C_{10}H_2CH_2NH_3)_2(CH_3NH_3PbI_2Br)_{n-1}PbI_4$; $C_{10}H_2CH_2NH_3I$, $CH_3NH_3Br$ and $PbBr_2$ which may assemble $(C_{10}H_2CH_2NH_3)_2(CH_3NH_3PbI_2Br)_{n-1}PbBr_4$; and $C_{10}H_2CH_2NH_3I$, $CH_3NH_3Br$ and $PbCl_2$ which may assemble $(C_{10}H_2CH_2NH_3)_2(CH_3NH_3PbI_2Br)_{n-1}PbCl_4$, where n is the number of layers, and, optionally, n may be in the range of about 2-10. Optionally, the aforementioned perovskite precursor materials may assemble Quasi-2D perovskite materials with mixed halides, including: $(C_6H_5C_2H_4NH_3)_2(CH(NH_2)_2PbBr_3)_{n-1}PbI_{4-x}Cl_x$; $(C_6H_5C_2H_4NH_3)_2(CH(NH_2)_2PbBr_3)_{n-1}PbI_{4-x}Br_x$; $(C_6H_5C_2H_4NH_3)_2(CH(NH_2)_2PbBr_3)_{n-1}PbCl_{4-x}Br_x$; $(C_{10}H_2CH_2NH_3)_2(CH_3NH_3PbI_2Br)_{n-1}PbI_{4-x}Cl_x$; $(C_{10}H_2CH_2NH_3)_2(CH_3NH_3PbI_2Br)_{n-1}PbI_{4-x}Br_x$; and $(C_{10}H_2CH_2NH_3)_2(CH_3NH_3PbI_2Br)_{n-1}PbCl_{4-x}Br_x$, where n is the number of layers, and, optionally, n may be in the range of about 2-10, and x is in the range of 0-4.

Examples of perovskite precursor materials further include any of the aforementioned examples, where the divalent metal cation lead ($Pb^+$) may be replaced with tin ($Sn^+$), copper ($Cu^+$) or europium ($Eu^+$).

Optionally, the emissive layer 135 of a PeLED may be assembled from nanocrystals of perovskite material. Optionally, the emissive layer 135 may comprise perovskite light emitting nanocrystals. Perovskite light emitting nanocrystals may be preferred because nanocrystal boundaries may be used to confine excitons in a PeLED device, and surface cations may be used to passivate the nanocrystal boundaries. This exciton confinement and surface passivation may improve device performance. Other emissive layer materials and structures may be used.

Devices fabricated in accordance with embodiments of the present invention may optionally comprise an electron transport layer 145. The electron transport layer 145 may include any material capable of transporting electrons. The electron transport layer 145 may be deposited by a solution process or by a vacuum deposition process. The electron transport layer 145 may be doped or undoped. Doping may be used to enhance conductivity.

Examples of undoped electron transport layers are tris(8-hydroxyquinolinato)aluminum ($Alq_3$), 2,2',2"-(1,3,5-Benzinetriyl)-tris(1-phenyl-1-H-benzimidazole) (TPBi), 2,9-Dimethyl-4,7-diphenyl-1,10-phenanthroline (BCP), zinc oxide (ZnO) and titanium dioxide ($TiO_3$). One example of a doped electron transport layer is 4,7-diphenyl-1,10-phenanthroline (BPhen) doped with lithium (Li) at a molar ratio of 1:1. One example of a solution-processed electron transport layer is [6,6]-Phenyl C61 butyric acid methyl ester (PCBM). Other electron transport layers and structures may be used. The preceding examples of electron transport materials are especially well-suited to application in PeLEDs.

Devices fabricated in accordance with embodiments of the present invention may optionally comprise a cathode 155. The cathode 155 may comprise any suitable material or combination of materials known to the art, such that the cathode 155 is capable of conducting electronics and injecting them into the layers of the device.

Preferred cathode 155 materials include metal oxides, such as indium tin oxide (ITO), indium zinc oxide (IZO) and fluorine tin oxide (FTO), metals, such as calcium (Ca), barium (Ba), magnesium (Mg) and ytterbium (Yb) or a combination thereof. Other preferred cathode 155 materials include metals such as silver (Ag), aluminum (Al), aluminum-neodymium (Al:Nd), gold (Au) and alloys thereof, or a combination thereof. Compound cathodes comprising one or more cathode materials in a single layer may be preferred from some devices. One example of a compound cathode is Mg:Ag. Multilayer cathodes comprising one or more cathode materials in one or more layers may be preferred for some devices. One example of a multilayer cathode is Ba/Al. In a standard device architecture for PeLEDs, the cathode 155 may be sufficiently transparent to create a top-emitting device, where light is emitted from the top of the device. One example of a transparent cathode commonly used in a standard device architecture is a compound layer of Mg:Ag. By using a compound of Mg:Ag, the cathode may be transparent as well as partially reflective. When such a transparent and partially reflective cathode is used in combination with a reflective anode, such as ITO/Ag/ITO, where the Ag thickness is greater than approximately 80 nm, this may have the advantage of creating a microcavity within the device. The cathode 155 may be opaque and/or reflective. In a standard device architecture for PeLEDs, a reflective cathode 155 may be preferred for some bottom-emitting devices to increase the amount of light emitted through the substrate from the bottom of the device. One example of a reflective cathode commonly used in a standard device architecture is a multilayer cathode of LiF/Al. When such a reflective cathode is used in combination with a transparent and partially reflective anode, such as ITO/Ag/ITO, where the Ag thickness is less than approximately 25 nm, this may have the advantage of creating a microcavity within the device.

The material and thickness of the cathode 155 may be chosen to obtain desired conductive and optical properties. Where the cathode 155 is transparent, there may be a range of thicknesses for a particular material that is thick enough to provide the desired conductivity, yet thin enough to provide the desired degree of transparency. Other materials and structures may be used.

Devices fabricated in accordance with embodiments of the present invention may optionally comprise one or more blocking layers. Blocking layers may be used to reduce the number of charge carriers (electrons or holes) and/or excitons exiting the emissive layer. An electron blocking layer 130 may be disposed between the emissive layer 135 and the hole transport layer 125 to block electrons from leaving the emissive layer 135 in the direction of the hole transport layer 125. Similarly, a hole blocking layer 140 may be disposed between the emissive layer 135 and the electron transport layer 145 to block holes from leaving the emissive layer 135 in the direction of the electron transport layer 145. Blocking layers may also be used to block excitons from diffusing from the emissive layer. As used herein, and as would be understood by one skilled in the art, the term "blocking layer" means that the layer provides a barrier that significantly inhibits transport of charge carriers and/or excitons, without suggesting that the layer completely blocks the charge carriers and/or excitons. The presence of such a blocking layer in a device may result in substantially higher efficiencies as compared to a similar device lacking a blocking layer. A blocking layer may also be used to confine emission to a desired region of a device.

Devices fabricated in accordance with embodiments of the present invention may optionally comprise one or more injection layers. Generally, injection layers are comprised of one or more materials that may improve the injection of charge carriers from one layer, such as an electrode, into an adjacent layer. Injection layers may also perform a charge transport function.

In device 100, the hole injection layer 120 may be any layer that improves the injection of holes from the anode 115 into the hole transport layer 125. Examples of materials that may be used as a hole injection layer are Copper(II)phthalocyanine (CuPc) and 1,4,5,8,9,11-Hexaazatriphenylene-hexacarbonitrile (HATCN), which may be vapor deposited, and polymers, such as PEDOT:PSS, which may be deposited from solution. Another example of a material that may be used as a hole injection layer is molybdenum oxide ($MoO_3$). The preceding examples of hole injection materials are especially well-suited to application in PeLEDs.

A hole injection layer (HIL) 120 may comprise a charge carrying component having HOMO energy level that favourably matches, as defined by their herein-described relative IP energies, with the adjacent anode layer on one side of the HIL, and the hole transporting layer on the opposite side of the HIL. The "charge carrying component" is the material responsible for the HOMO energy level that actually transports the holes. This material may be the base material of the HIL, or it may be a dopant. Using a doped HIL allows the dopant to be selected for its electrical properties, and the host to be selected for morphological properties, such as ease of deposition, wetting, flexibility, toughness, and others. Preferred properties of the HIL material are such that holes can be efficiently injected from the anode into the HIL material. The charge carrying component of the HIL 120 preferably has an IP not more than about 0.5 eV greater than the IP of the anode material. Similar conditions apply to any layer into which holes are being injected. HIL materials are further distinguished from conventional hole transporting materials that are typically used in the hole transporting layer of a PeLED in that such HIL materials may have a hole conductivity that is substantially less than the hole conductivity of conventional hole transporting materials.

In device 100, the electron injection layer 150 may be any layer that improves the injection of electrons from the cathode 155 into the electron transport layer 145. Examples of materials that may be used as an electron injection layer are inorganic salts, such as lithium fluoride (LiF), sodium fluoride (NaF), barium fluoride (BaF), caesium fluoride (CsF), and caesium carbonate ($CsCO_3$). Other examples of materials that may be used as an electron injection layer are metal oxides, such as zinc oxide (ZnO) and titanium oxide ($TiO_2$), and metals, such as calcium (Ca), barium (Ba), magnesium (Mg) and ytterbium (Yb). Other materials or combinations of materials may be used for injection layers. Depending on the configuration of a particular device, injection layers may be disposed at locations different than those shown in device 100. The preceding examples of electron injection materials are all especially well-suited to application in PeLEDs.

Unless otherwise specified, any one of the layers of the various embodiments may be deposited by any suitable method. Methods include vapor deposition processes, such as vacuum thermal evaporation, sputtering, electron beam physical vapour deposition, organic vapor phase deposition and organic vapour jet printing. Other suitable methods include solution-based processes, including spincoating and inkjet printing.

Devices fabricated in accordance with embodiments of the invention may be incorporated into a wide range of consumer products. Optionally, devices may be used in displays for televisions, computer monitors, tablets, laptop computers, smart phones, cell phones, digital cameras, video recorders, smartwatches, fitness trackers, personal digital assistants, vehicle displays and other electronic devices. Optionally, devices may be used for micro-displays or heads-up displays. Optionally, devices may be used in light panels for interior or exterior illumination and/or signalling, in smart packaging or in billboards.

Optionally, various control mechanisms may be used to control light emitting devices fabricated in accordance with the present invention, including passive matrix and active matrix address schemes.

The materials and structures described herein may have applications in devices other than light emitting devices. For example, other optoelectronic devices such as solar cells, photodetectors, transistors or lasers may employ the materials and structures.

Layers, materials, regions, units and devices may be described herein in reference to the colour of light they emit. As used herein, a "red" layer, material, region, unit or device, refers to one that emits light that has an emission spectrum with a peak wavelength in the range of about 580-780 nm; a "green" layer, material, region, unit or device, refers to one that emits light that has an emission spectrum with a peak wavelength in the range of about 500-580 nm; a "blue" layer, material, region, unit or device, refers to one that emits light that has an emission spectrum with a peak wavelength in the range of about 380-500 nm. Preferred ranges include a peak wavelength in the range of about 600-640 nm for red, about 510-550 nm for green, and about 440-465 nm for blue. As used herein, a "yellow" emissive layer, material, region unit or device refers to one that emits light with a substantial proportion of both red and green light in the emissive spectrum. As used herein, a "cyan" emissive layer, material, region unit or device refers to one that emits light with a substantial proportion of both green and blue light in the emissive spectrum. As used herein, a "magenta" emissive layer, material, region unit or device refers to one that emits light with a substantial proportion of both red and blue light in the emissive spectrum.

Display technology is rapidly evolving, with recent innovations enabling thinner and lighter displays with higher resolution, improved frame rate and enhanced contrast ratio. However, one area where significant improvement is still required is colour gamut. Digital displays are currently incapable of producing many of the colours the average person experiences in day-to-day life. To unify and guide the industry towards improved colour gamut, two industry standards have been defined, DCI-P3 and Rec. 2020, with DCI-P3 often seen as a stepping stone towards Rec. 2020.

DCI-P3 was defined by the Digital Cinema Initiatives (DCI) organization and published by the Society of Motion Picture and Television Engineers (SMPTE). Rec. 2020 (more formally known as ITU-R Recommendation BT. 2020) was developed by the International Telecommunication Union to set targets, including improved colour gamut, for various aspects of ultra-high-definition televisions.

Figure 6:
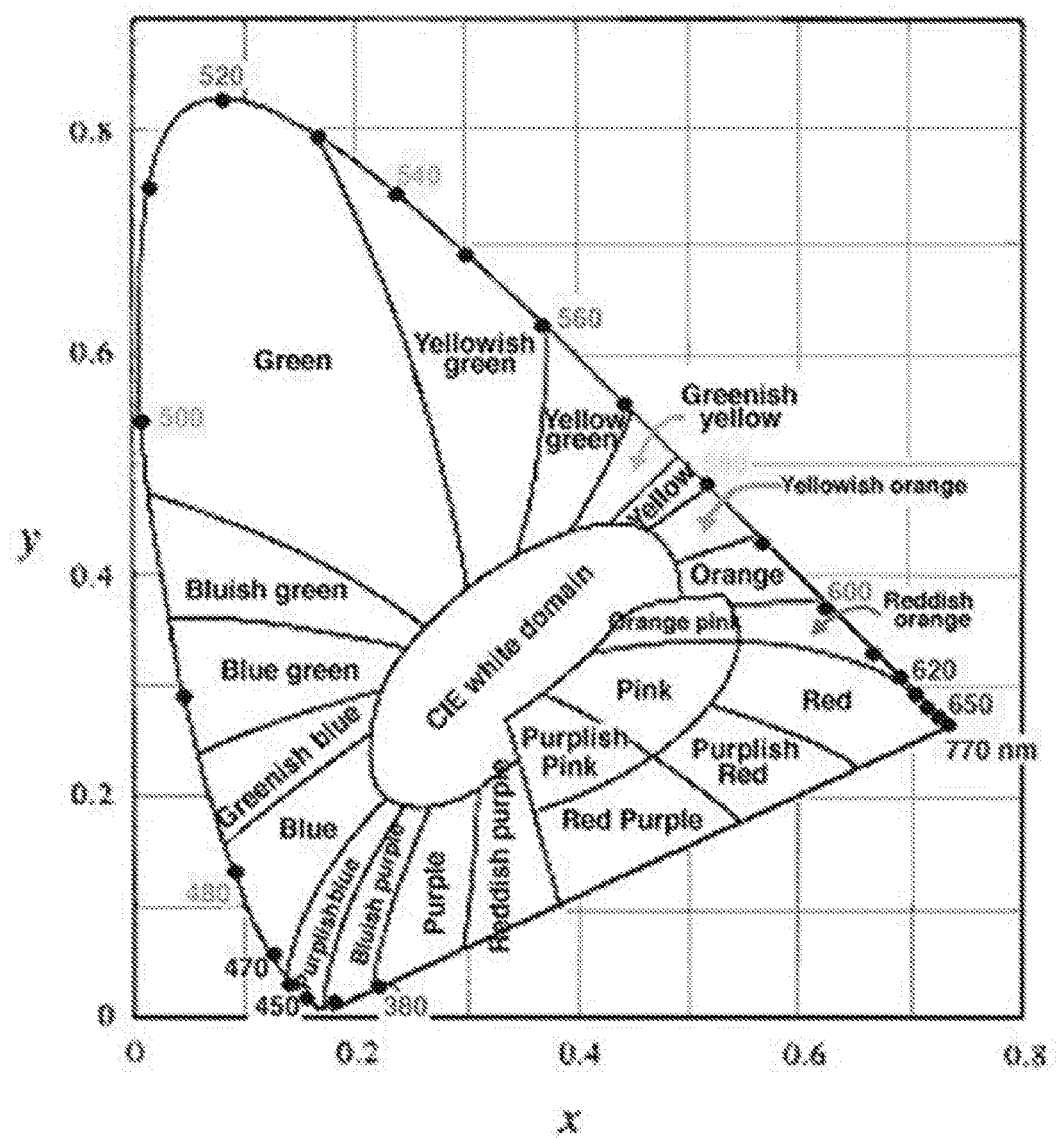
FIG. 6 depicts a rendition of the CIE 1931 (x, y) colour space chromaticity diagram.
Figure 7:
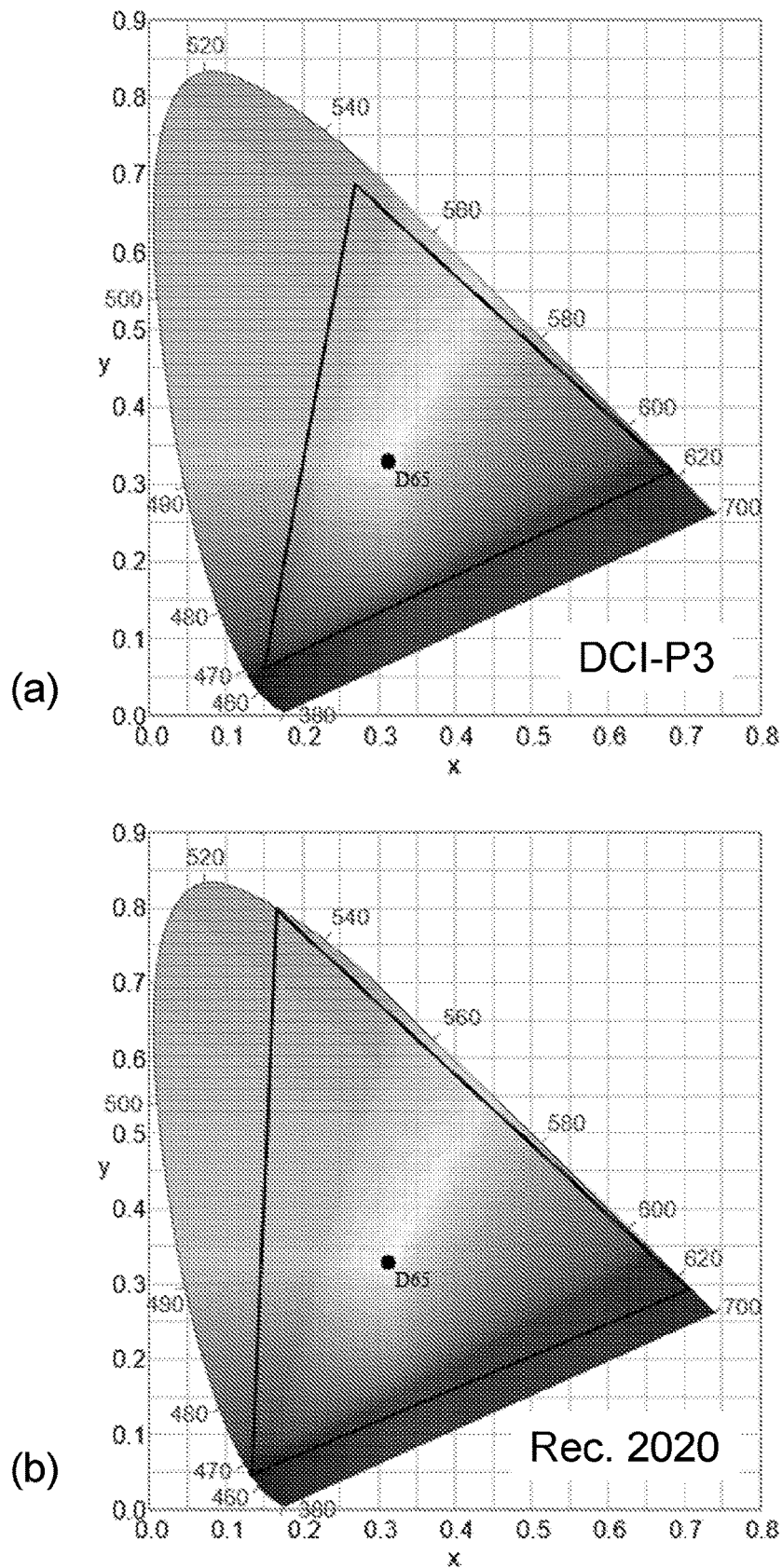
FIG. 7 depicts a rendition of the CIE 1931 (x, y) colour space chromaticity diagram that also shows colour gamut for (a) DCI-P3 and (b) Rec. 2020 colour spaces

The CIE 1931 (x, y) chromaticity diagram was created by the Commission Internationale de l'Eclairage (CIE) in 1931 to define all colour sensations that an average person can experience. Mathematical relationships describe the location of each colour within the chromaticity diagram. The CIE 1931 (x, y) chromaticity diagram may be used to quantify the colour gamut of displays. The white point (D65) is at the centre, while colours become increasingly saturated (deeper) towards the extremities of the diagram. FIG. 6 shows the CIE 1931 (x, y) chromaticity diagram with labels added to different locations on the diagram to enable a general understanding of distribution of colour within the colour space. FIG. 7 shows (a) DCI-P3 and (b) Rec. 2020 colour spaces superimposed on the CIE 1931 (x, y) chromaticity diagram. The tips of the triangles are primary colours for DCI-P3 and Rec. 2020, respectively, while colours enclosed within the triangles are all the colours that can be reproduced by combining these primary colours. For a display to meet DCI-P3 colour gamut specifications, the red, green and blue sub-pixels of the display must emit light at least as deep in colour as the DCI-P3 primary colours. For a display to meet Rec. 2020 colour gamut specifications, the red, green and blue sub-pixels of the display must emit light at least as deep in colour as the Rec. 2020 primary colours. Primary colours for Rec. 2020 are significantly deeper than for DCI-P3, and therefore achievement of the Rec. 2020 standard for colour gamut is seen as a greater technical challenge than achieving the DCI-P3 standard.

Commercial OLED displays can successfully render the DCI-P3 colour gamut. For example, smartphones with OLED displays such as the iPhone X (Apple), Galaxy S10 (Samsung) and OnePlus & (OnePlus) can all render the DCI-P3 gamut. Commercial liquid crystal displays (LCDs) can also successfully render the DCI-P3 colour gamut. For example, LCDs in the Surface Studio (Microsoft), Mac Book Pro and iMac Pro (both Apple) can all render the DCI-P3 gamut. However, until now, no display has been demonstrated that can render the Rec. 2020 colour gamut.

Here we disclose novel perovskite ink formulations comprising perovskite light emitting material. We further disclose methods of assembling perovskite emissive layers using the disclosed perovskite ink formulations, as well as devices comprising perovskite emissive layers assembled using the disclosed methods and ink formulations. In various embodiments, a perovskite light emitting device fabricated by the disclosed method may render a primary colour of the DCI-P3 colour gamut. In various embodiments, the perovskite light emitting device fabricated by the disclosed method may render a primary colour of the Rec. 2020 colour gamut.

TABLE 1

CIE 1931 (x, y) colour coordinates for exemplary single emissive layer R&D PeLED and Commercial OLED devices. Also included are colour coordinates for DCI-P3 and Rec. 2020 colour gamut standards.

|  | Red | | Green | | Blue | |
| --- | --- | --- | --- | --- | --- | --- |
|  | CIE x | CIE y | CIE x | CIE y | CIE x | CIE y |
| DCI-P3 | 0.680 | 0.320 | 0.265 | 0.690 | 0.150 | 0.060 |
| Rec. 2020 | 0.708 | 0.292 | 0.170 | 0.797 | 0.131 | 0.046 |
| Commercial OLED | 0.680 | 0.320 | 0.265 | 0.690 | 0.150 | 0.060 |
| R&D PeLED | 0.720 | 0.280 | 0.100 | 0.810 | 0.166 | 0.079 |

Figure 8:
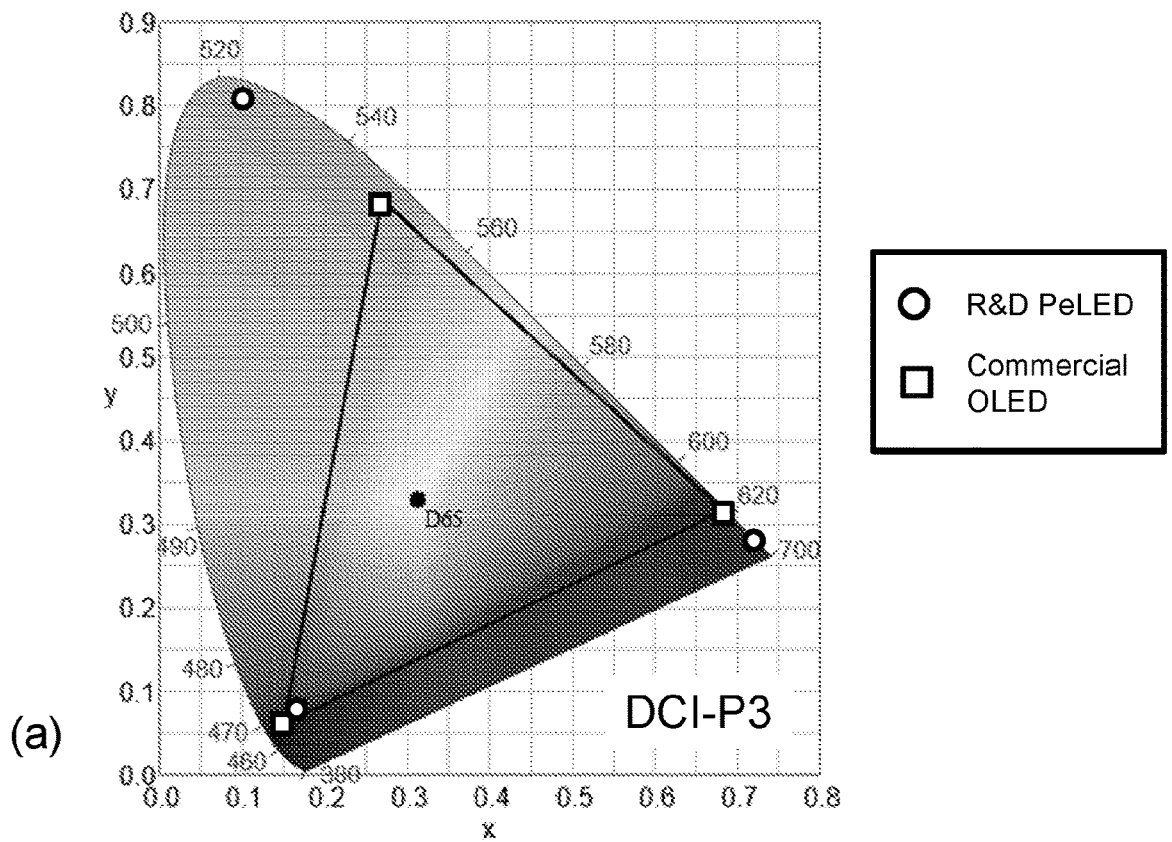
FIG. 8 depicts a rendition of the CIE 1931 (x, y) colour space chromaticity diagram that also shows colour gamut for (a) DCI-P3 and (b) Rec. 2020 colour spaces with colour coordinates for exemplary red, green and blue PeLED and OLED devices
Figure 8:
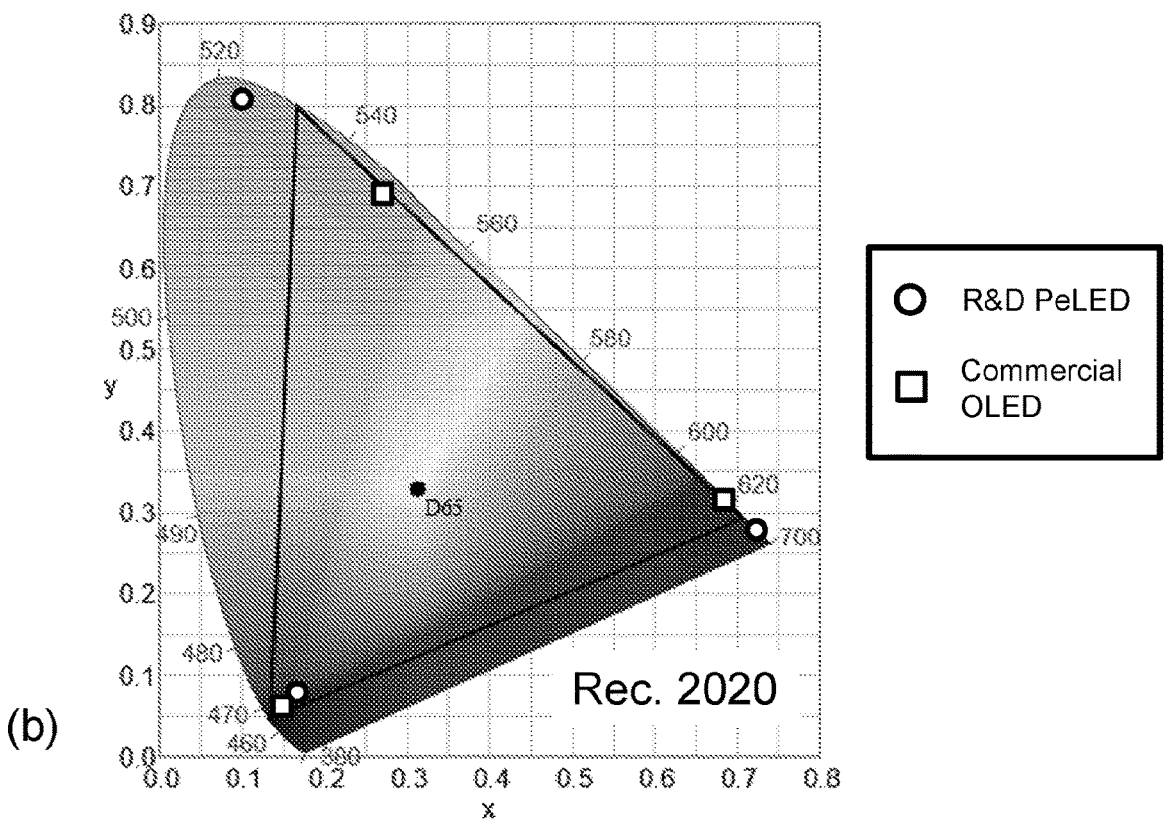

One or more advantages of perovskite light emitting devices may be demonstrated using the data shown in Table 1 and FIG. 8. Table 1 shows CIE 1931 (x, y) colour coordinates for single emissive layer red, green and blue R&D PeLED and Commercial OLED devices. Also included in Table 1 are CIE 1931 (x, y) colour coordinates for DCI-P3 and Rec. 2020 colour gamut standards. Generally, for red light, a higher CIE x value corresponds to deeper emission colour, for green light, a higher CIE y value corresponds to deeper emission colour, and for blue light, a lower CIE y value corresponds to deeper emission colour. This can be understood with reference FIG. 8, which includes markers for the red, green and blue R&D PeLED (circles) and Commercial OLED (squares) device data in Table 1, as well as markers for the primary colours of the DCI-P3 colour gamut in FIG. 8a and for the Rec. 2020 colour gamut in FIG. 8b.

Figure 9:
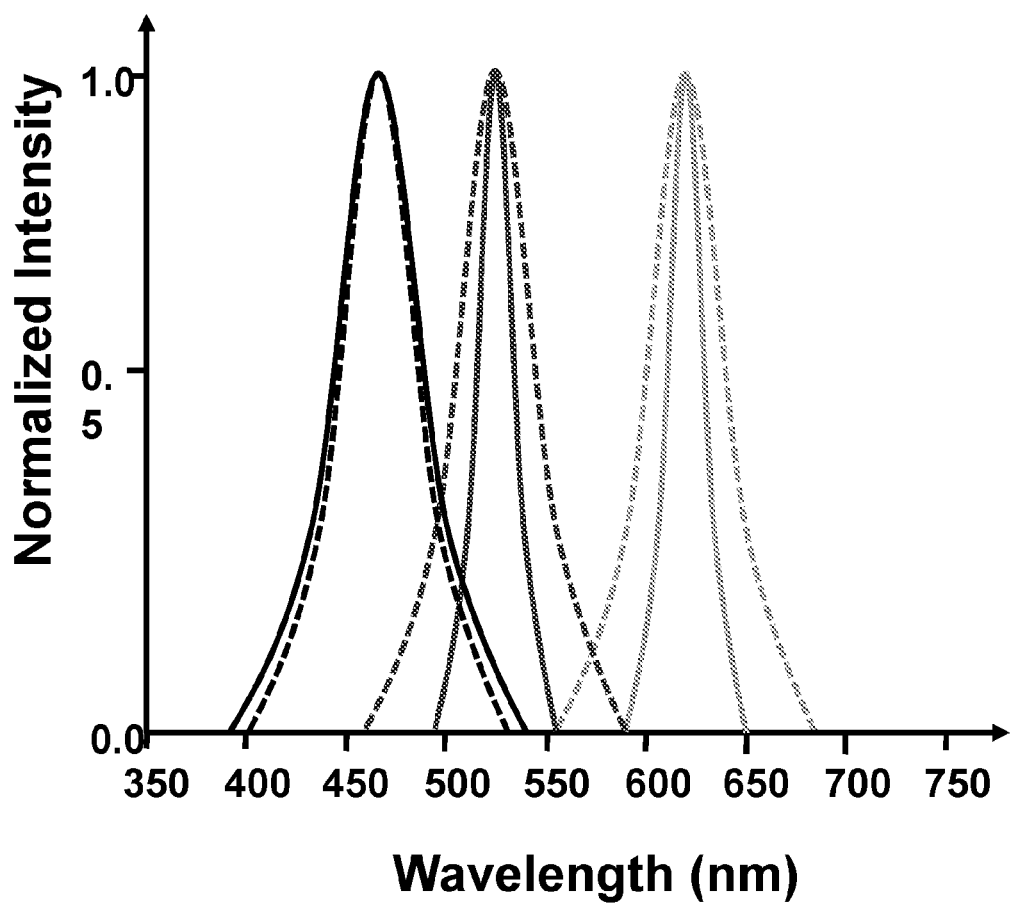
FIG. 9 depicts exemplary electroluminescence emission spectra for red, green and blue PeLED and OLED devices.

FIG. 9 depicts exemplary electroluminescence emission spectra for single emissive layer red, green and blue R&D PeLEDs and Commercial OLEDs. The red, green and blue spectra depicted using dashed lines correspond to spectra for Commercial OLED devices, such as those in the Apple iPhone X, which may be used to render the DCI-P3 colour gamut. The red, green and blue spectra depicted using solid lines correspond to spectra for R&D PeLED devices. The electroluminescence spectra for red, green and blue R&D PeLED devices depicted using solid lines in FIG. 9 demonstrate that red and green R&D PeLED devices may render deeper red and green colours than Commercial OLED devices, but that further development is needed for blue R&D PeLED devices to render deeper blue colours than Commercial OLED devices.

The CIE 1931 (x, y) colour coordinate data reported for single emissive layer red, green and blue R&D PeLED and Commercial OLED devices in Table 1 are exemplary. Commercial OLED data are taken from the Apple iPhone X, which fully supports the DCI-P3 colour gamut. This data set is available from Raymond Soneira at DisplayMate Technologies Corporation (Soneira et al.). Data for R&D PeLED devices are taken from a selection of peer-reviewed scientific journals: Red R&D PeLED data are taken from Wang et al. Green R&D PeLED data are taken from Hirose et al. Blue R&D PeLED data are taken from Kumar et al. Data from these sources are used by way of example, and should be considered non-limiting. Data from other peer-reviewed scientific journals, simulated data and/or experimental data collected from laboratory devices may also be used to demonstrate the aforementioned advantages of perovskite light emitting devices.

As can be seen from Table 1 and FIG. 8a, existing organic light emitting materials and devices can already be used to demonstrate a commercial display that can render the DCI-P3 colour gamut, as is exemplified by the Apple iPhone X. However, as can be seen from FIG. 8b, existing organic light emitting materials and devices alone cannot be used to demonstrate a display that can render the Rec. 2020 colour gamut. Table 1 and FIG. 8b show that one path to demonstrating a display that can render the Rec. 2020 colour gamut is to include one or more perovskite emissive layers in one or more perovskite light emitting devices in one or more sub-pixels of a display.

Optionally, by including one or more perovskite emissive layers in a perovskite light emitting device, the device may emit red light with CIE 1931 (x, y)=(0.720, 0.280), which as can be seen from FIG. 8b, is more saturated than the red primary color for the Rec. 2020 standard, which has CIE 1931 (x, y)=(0.708, 0.292).

Optionally, by including one or more perovskite emissive layers in a perovskite light emitting device, the device may emit green light with CIE 1931 (x, y)=(0.100, 0.810), which as can be seen from FIG. 8b, is more saturated than the green primary colour for the Rec. 2020 standard, which has CIE 1931 (x, y)=(0.170, 0.797).

As described herein, the colour saturation of blue light emission from exemplary perovskite emissive layers may be slightly less than that required to render the blue primary colour of the Rec. 2020 standard. For example, as shown in Table 1, a perovskite light emitting device comprising a perovskite emissive layer may emit blue light with CIE 1931

(x, y)=(0.166, 0.079), which as can be seen from FIG. 8*b*, is less saturated than the blue primary color for the Rec. 2020 standard, which has CIE 1931 (x, y)=(0.131, 0.046). However, under some circumstances, including a perovskite light emitting device comprising a perovskite emissive layer that emits blue light may provide the device with one or more advantages, such as improved efficiency, higher brightness, improved operational lifetime, lower voltage and/or reduced cost, and may therefore be preferred.

The foregoing description demonstrates the potential for perovskite light emitting materials and devices to enhance the performance of displays. However, until now, perovskite light emitting devices such as those in Adjokatse et al., Hirose et al., Kumar et al. and Wang et al. have been assembled using solution-process laboratory techniques, such as spin-coating, which are not compatible with manufacturing processes for displays.

Here we disclose perovskite ink formulations comprising perovskite light emitting material that are suitable for assembling perovskite emissive layers using commercial manufacturing methods. In particular, we disclose perovskite ink formulations comprising perovskite light emitting material that are suitable for assembling perovskite emissive layers using the method of inkjet printing. We further disclose PeLED device architectures that comprise perovskite emissive layers assembled using the disclosed methods and ink formulations.

In one embodiment, the perovskite ink comprises a first polar solvent, wherein the first polar solvent has a boiling point of 150° C. or more and a melting point of 30° C. or less, and a first perovskite light emitting material mixed in the first polar solvent, wherein the concentration of the first perovskite light emitting material in the perovskite ink is in the range of 0.01 wt. % to 10 wt. %. In one embodiment, the perovskite ink comprises a first polar solvent, wherein the first polar solvent has a boiling point of 200° C. or more. One example of a polar solvent with a boiling point of 150° C. or more and a melting point of 30° C. or less is Gamma-Valerolactone (GVL), which has a boiling point of 202° C. and a melting point of −31° C. GVL is also an example of a polar solvent with a boiling point of 200° C. or more.

As used herein, a solvent is defined as a liquid that dissolves a solute, resulting in a solution. Solvents can generally be classified into two categories: polar solvents and non-polar solvents. Polar solvents have large dipole moments and typically contain bonds between atoms with very different electronegativities, such as oxygen and hydrogen. As used herein, a polar solvent is defined as a solvent having a dielectric constant of greater than or equal to 15, when measured at 20° C. Non-polar solvents have small dipole moments and typically contain bolds between atoms with similar electronegativities, such as oxygen and carbon. As used herein, a non-polar solvent is defined as a solvent having a dielectric constant of less than 15, when measured at 20° C. Polar solvents are preferred for the first solvent because perovskite light emitting materials may be more soluble in polar solvents than in non-polar solvents.

As used herein, the boiling point of a solvent is defined as the temperature at which the vapour pressure of the solvent equals the pressure of the atmosphere surrounding the solvent, and the solvent changes into a vapour. All values quoted herein for boiling point assume measurement at a pressure of 1 atmosphere. Table 2 and Table 4 list boiling points for exemplary polar solvents.

In one embodiment, the perovskite ink may comprise a first perovskite light emitting material mixed in the first polar solvent at a concentration by weight in the range of 0.01 wt. % to 10 wt. %. In one embodiment, the perovskite ink may comprise a first perovskite light emitting material mixed in the first polar solvent at a concentration by weight of in the range of 0.1 wt. % to 5 wt. %.

Such ranges of concentration by weight of perovskite light emitting material in the perovskite ink may enable the thicknesses of the perovskite emissive layer 135 to be controlled and optimized. In one embodiment, by increasing the concentration by weight of the perovskite light emitting material, the thickness of the perovskite emissive layer 135 may be increased. In one embodiment, the thickness of the perovskite emissive layer 135 may be in the range of 15 nm to 150 nm. Such a thickness range may maximize the proportion of recombination of electrons and holes within the perovskite emissive layer 135, thereby maximizing the efficiency of light emission from the perovskite emissive layer 135.

In one embodiment, the first perovskite light emitting material comprises an organic metal halide perovskite light emitting material. Methylammonium lead iodide ($CH_3NH_3PbI_3$), methylammonium lead bromide ($CH_3NH_3PbBr_3$) and methylammonium lead chloride ($CH_3NH_3PbCl_3$) are all non-limiting examples of organic metal halide perovskite light emitting material. In one embodiment, the first perovskite light emitting material comprises an inorganic metal halide perovskite light emitting material. Caesium lead iodide ($CsPbI_3$), caesium lead bromide ($CsPbBr_3$) and caesium lead chloride ($CsPbCl_3$) are all non-limiting examples of inorganic metal halide perovskite light emitting material.

The choice of an organic or inorganic cation may be determined by several factors, including desired emission colour, efficiency of electroluminescence, stability of electroluminescence and ease of processing. Inorganic metal halide perovskite material may be particularly well-suited to nanocrystals of perovskite light emitting materials, such as those depicted in FIG. 3, wherein an inorganic cation may enable a compact and stable perovskite light emitting nanocrystal structure. In one embodiment, the first perovskite light emitting material comprises a first set of light emitting perovskite nanocrystals, wherein the number of layers of each light emitting perovskite nanocrystal in the first set is in the range of 2-10.

Figure 1:
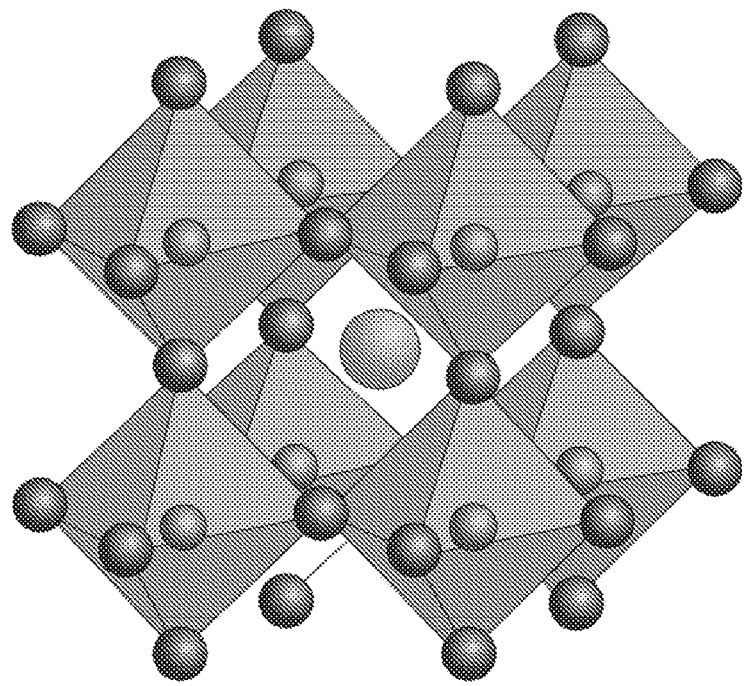
FIG. 1 depicts 3D perovskite light emitting material with structure $ABX_3$.
Figure 1:
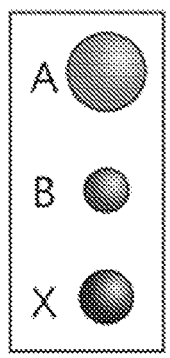
Figure 2:
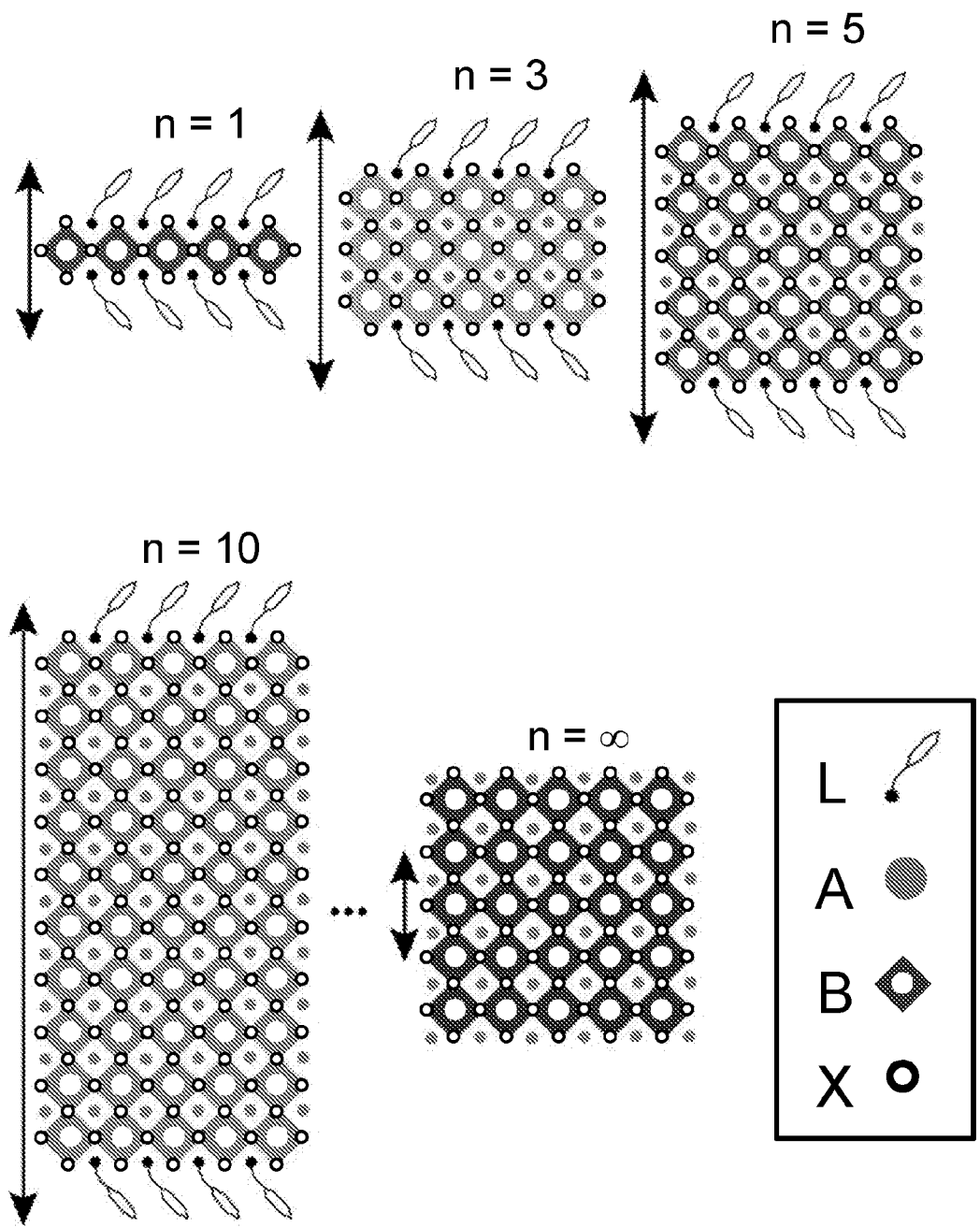
FIG. 2 depicts layered perovskite light emitting material with structure $L_2(ABX_3)_{n-1}BX_4$, where n=1, 3, 5, 10 and ∞.
Figure 3:
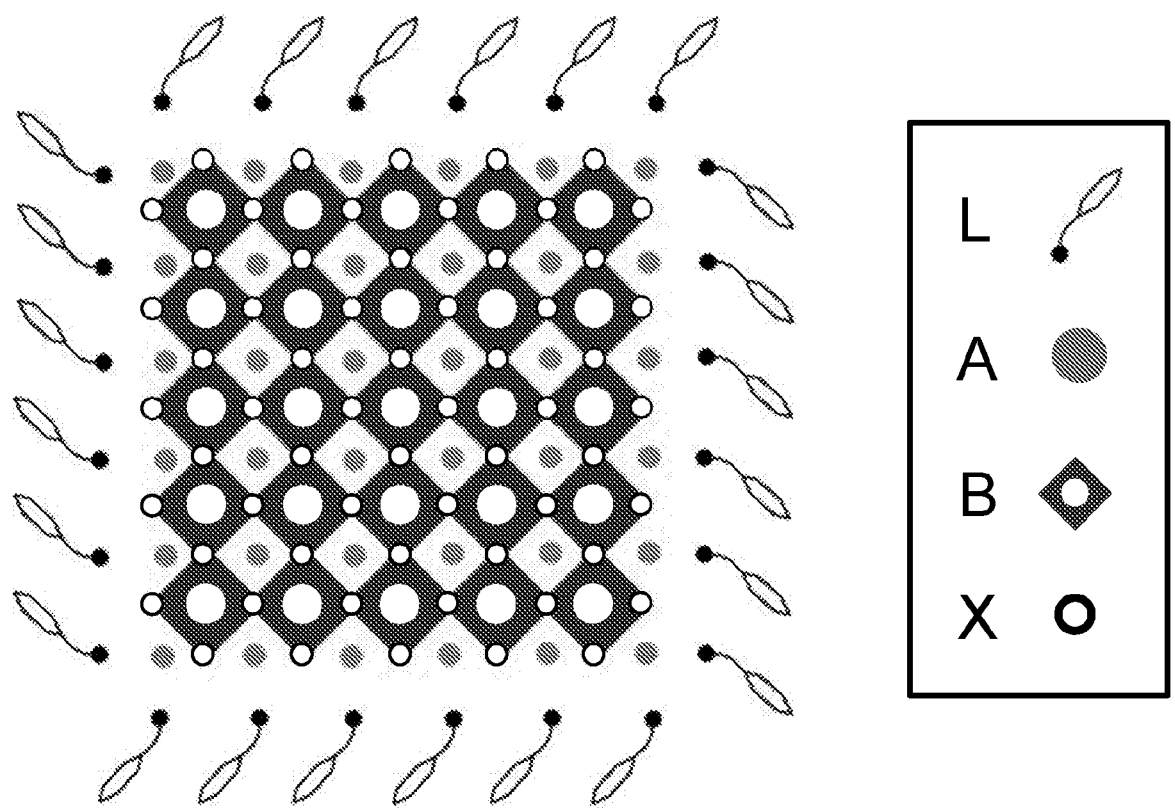
FIG. 3 depicts an example of a nanocrystal of perovskite material with a layered structure that resembles $L_2(ABX_3)_{n-1}BX_4$, where n=5.

An example of a perovskite light emitting nanocrystal having a layered structure that resembles $L_2(ABX_3)_{n-1}BX_4$, where n=5, is depicted in FIG. 3. Perovskite light emitting nanocrystals may comprise a core of perovskite material, such as depicted in FIG. 3. Optionally, perovskite light emitting nanocrystals may further comprise one or more shells surrounding the core. Such one or more shells may serve to passivate the perovskite light emitting nanocrystals, enhancing optoelectronic performance. Optionally, the core and one or more shells may be surrounded by ligands bonded to the core or one or more shells, such as depicted in FIG. 3. Such ligands may serve to passivate and solubilize the perovskite light emitting nanocrystals. Such ligands may further serve to transport electronic charge more efficiently or with improved charge balance. Such perovskite light emitting nanocrystals may be preferred because such a core/shell/ligand structure may promote improved optoelectronic performance from a PeLED device comprising a perovskite emissive layer assembled from a perovskite ink comprising such perovskite light emitting nanocrystals.

In one embodiment, the first perovskite light emitting material comprises perovskite precursor material. Examples of perovskite precursor materials are $CH_3NH_3I$ and $PbI_2$ which may assemble an electroluminescent perovskite emissive layer comprising perovskite material $CH_3NH_3PbI_3$, and $CH(NH_2)_2Br$ and $PbBr_2$ which may assemble an electroluminescent perovskite emissive layer comprising perovskite material $CH(NH_2)_2PbBr_3$. Such perovskite precursor materials may be preferred because they may participate in a chemical reaction to assemble perovskite emissive layers comprising 2D perovskite material, Quasi-2D perovskite material or 3D perovskite material, or a combination thereof. In particular, such perovskite precursor materials may participate in a chemical reaction to assemble Quasi-2D perovskite material comprising an ensemble of perovskite materials having different numbers of layers, wherein there may be energy transfer from Quasi-2D perovskite materials with a smaller number of layers and a larger energy band gap to Quasi-2D perovskite light emitting materials with a larger number of layers and a lower energy band gap. This energy funnel may efficiently confine excitons in the perovskite emissive layer of a PeLED device and may improve device performance.

In one embodiment, the perovskite ink comprises at first polar solvent having a boiling point in the range of 150° C. to 300° C., and a first perovskite light emitting material mixed in the first polar solvent. One example of a polar solvent with a boiling point in the range of 150° C. to 300° C. is dimethylacetamide (DMAc), which has a boiling point of 165° C. In one embodiment, the perovskite ink comprises a first polar solvent having a boiling point in the range of 200° C. to 300° C., and a first perovskite light emitting material mixed in the first polar solvent. One example of a polar solvent with a boiling point in the range of 200° C. to 300° C. is N-Methyl-2-Pyrrolidone (NMP), which has a boiling point of 202° C. In one embodiment, the perovskite ink comprises a first polar solvent having a boiling point in the range of 225° C. to 300° C., and a first perovskite light emitting material mixed in the first polar solvent. One example of a polar solvent with a boiling point in the range of 225° C. to 300° C. is N, N'-Dimethylpropyleneurea (DMPU), which has a boiling point of 247° C. In one embodiment, the perovskite ink comprises a first polar solvent having a boiling point in the range of 250° C. to 300° C., and a first perovskite light emitting material mixed in the first polar solvent. One example of a polar solvent with a boiling point in the range of 250° C. to 300° C. is sulfolane, which has a boiling point of 285° C.

A polar solvent with a boiling point of 150° C. or more is preferred. The evaporation rate from a perovskite ink comprising such a polar solvent is expected to be lower than for a perovskite ink comprising a polar solvent with a boiling point of less than 150° C. A perovskite ink comprising such a polar solvent with a boiling point of 150° C. or more may maintain a stable concentration by weight of perovskite light emitting material for a longer period of time than a perovskite ink comprising a polar solvent with a boiling point of less than 150° C. Such a perovskite ink may be processed to assemble a perovskite emissive layer 135 more reproducibly with a wider process window using industrial manufacturing methods such as inkjet printing.

A polar solvent with a boiling point of 200° C. or more is more preferred. The evaporation rate from a perovskite ink comprising such a polar solvent is expected to be lower than for a perovskite ink comprising a polar solvent with a boiling point of more than 150° C. but less than 200° C. A perovskite ink comprising such a polar solvent with a boiling point of 200° C. or more may maintain a stable concentration by weight of perovskite light emitting material for a longer period of time than a perovskite ink comprising a polar solvent with a boiling point of more than 150° C. but less than 200° C. Such a perovskite ink may be processed to assemble a perovskite emissive layer 135 more reproducibly with a wider process window using industrial manufacturing methods such as inkjet printing.

A polar solvent with a boiling point of 300° C. or less is preferred. The evaporation rate from a perovskite ink comprising such a polar solvent is expected to be higher than for a perovskite ink comprising a polar solvent with a boiling point of more than 300° C. A perovskite ink comprising such a polar solvent with a boiling point of 300° C. or less may by vacuum dried to assemble a perovskite emissive layer 135 more rapidly than a perovskite ink comprising a polar solvent with a boiling point of more than 300° C. This is compatible with industrial manufacturing methods where low takt time and high throughput are required. Furthermore, the evaporation rate of residual polar solvent from a perovskite emissive layer 135 assembled from a perovskite ink comprising such a polar solvent with a boiling point of 300° C. or less is expected to be higher than for a perovskite emissive layer 135 assembled from a perovskite ink comprising a polar solvent with a boiling point of more than 300° C. The removal of residual polar solvent by annealing from such a perovskite emissive layer 135 is therefore expected to be more rapid. This is compatible with industrial manufacturing methods where low takt time and high throughput are required.

Preferably, the perovskite ink comprises a first polar solvent having a boiling point in the range of 150° C. to 300° C. More preferably, the perovskite ink comprises a first polar solvent having a boiling point in the range of 200° C. to 300° C. Even more preferably, the perovskite ink comprises a first polar solvent having a boiling point in the range of 225° C. to 300° C. Most preferably, the perovskite ink comprises a first polar solvent having a boiling point in the range of 250° C. to 300° C. Such perovskite inks are especially well suited to assembling perovskite emissive layers 135 using industrial manufacturing methods such as inkjet printing and vacuum drying. This is because a balance is achieved, wherein the boiling point of the first polar solvent is high enough to ensure stability of the perovskite ink during inkjet printing and low enough to maintain low takt time and high throughput during vacuum drying and annealing.

In one embodiment, the perovskite ink comprises a first polar solvent having a melting point of 30° C. or less and a first perovskite light emitting material mixed in the first polar solvent. One example of a polar solvent with a melting point of 30° C. or less is sulfolane with a melting point of 28° C.

As used herein, the melting point of a solvent is defined as the temperature at which the solid and liquid phase of the solvent exist in equilibrium. It is the temperature at which the solvent changes state from solid to liquid. All values quoted herein for melting point assume measurement at a pressure of 1 atmosphere. Table 2 and Table 4 list melting points for exemplary polar solvents.

In one embodiment, the perovskite ink comprises a first polar solvent having a melting point of 20° C. or less and a first perovskite light emitting material mixed in the first polar solvent. One example of a polar solvent with a melting point of 20° C. or less is DMSO with a melting point of 19° C. In one embodiment, the perovskite ink comprises a first polar solvent having a melting point of 0° C. or less and a first perovskite light emitting material mixed in the first polar solvent. One example of a polar solvent with a melting point of 0° C. or less is DMPU with a melting point of −20° C.

Preferably, the perovskite ink comprises a first polar solvent having a melting point of 30° C. or less. Such a perovskite ink can be processed without substantial heating. This reduces complexity and extends the manufacturing process window. For example, such a perovskite ink may be processed using inkjet printing manufacturing techniques. More preferably, the perovskite ink comprises a first polar solvent having a melting point of 20° C. or less. Such a perovskite ink may be processed at room temperature. Even more preferably, the perovskite ink comprises a first polar solvent having a melting point of 0° C. or less. Such a perovskite ink may be processed at room temperature with an extended process window.

In one embodiment, the perovskite ink comprises a first polar solvent, wherein the first polar solvent is an aprotic solvent. As used herein, an aprotic solvent is defined as a solvent without Oxygen-Hydrogen (O-H) or Nitrogen-Hydrogen (N—H) bonds. An aprotic solvent cannot donate Hydrogen. Dimethyl sulfoxide (DMSO) and Dimethylformamide (DMF) are examples of polar aprotic solvents. Polar aprotic solvents are preferred because perovskite light emitting materials may be more soluble in polar aprotic solvents than in polar protic solvents. For example, Byeong Jo Kim et al. demonstrated that $Pb^{2+}$ cations in a perovskite layer readily bond with the partially negative oxygen atoms in aprotic solvents. This bonding enables dissociation of the $PbI_6$ octahedral frame that forms the skeleton of the organic-inorganic perovskite material, thereby resulting in high solubility of the perovskite material in polar aprotic solvents.

In one embodiment, the perovskite ink comprises a first polar solvent, wherein the first polar solvent has a vapour pressure of 5 mmHg or less. One example of a polar solvent with a vapour pressure of 5 mmHg or less is dimethylformamide (DMF), which has a vapour pressure of 2.7 mmHg at 20° C.

As used herein, vapour pressure is defined as the pressure exerted by a vapor in thermodynamic equilibrium with its condensed phases at a given temperature in a closed system. The vapor pressure of a solvent is an indication of evaporation rate from the solvent. It relates to the tendency of particles to escape from the solvent. Solvents with higher vapour pressure are considered more volatile. Vapour pressure increases non-linearly with temperature. All values quoted herein for vapour pressure assume measurement in millimetres of mercury (mmHg) at a temperature of 20° C.

In one embodiment, the perovskite ink comprises a first polar solvent, wherein the first polar solvent has a vapour pressure of 0.5 mmHg or less. One example of a polar solvent with a vapour pressure of 0.5 mmHg or less is dimethyl sulfoxide (DMSO), which has a vapour pressure of 0.42 mmHg at 20° C. In one embodiment, the perovskite ink comprises a first polar solvent, wherein the first polar solvent has a vapour pressure of 0.05 mmHg or less. One example of a polar solvent with a vapour pressure of 0.05 mmHg or less is sulfolane which has a vapour pressure of 0.01 mmHg at 20° C. In one embodiment, the perovskite ink comprises a first polar solvent, wherein the first polar solvent has a vapour pressure of 0.005 mm Hg or less.

A first polar solvent with a vapour pressure of 0.5 mmHg or less is preferred. The evaporation rate from a perovskite ink comprising such a first polar solvent is expected to be lower than for a perovskite ink comprising a first polar solvent with a vapour pressure or more than 0.5 mmHg. A perovskite ink comprising such a first polar solvent with a vapour pressure of 0.5 mmHg or less may maintain a stable concentration by weight of perovskite light emitting material for a longer period of time than a perovskite ink comprising a first polar solvent with a vapour pressure of more than 0.5 mmHg. Such a perovskite ink may be processed to assemble a perovskite emissive layer 135 more reproducibly with a wider process window using industrial manufacturing methods such as inkjet printing.

A first polar solvent with a vapour pressure of 0.05 mmHg or less is more preferred. The evaporation rate from a perovskite ink comprising such a first polar solvent is expected to be lower than for a perovskite ink comprising a first polar solvent with a vapour pressure of more than 0.05 mmHg. A perovskite ink comprising such a first polar solvent with a vapour pressure of 0.05 mmHg or less may maintain a stable concentration by weight of perovskite light emitting material for a longer period of time than a perovskite ink comprising a first polar solvent with a vapour pressure of more than 0.05 mmHg. Such a perovskite ink may be processed to assemble a perovskite emissive layer 135 more reproducibly with a wider process window using industrial manufacturing methods such as inkjet printing. A first polar solvent with a vapour pressure of 0.005 mmHg or less is even more preferred.

In one embodiment, the first polar solvent has a relative evaporation rate (RER) of 20 or less. One example of a polar solvent with an RER of 20 or less is N-Methyl-2-Pyrrolidone (NMP), which has an RER of 4.

As used herein, the RER of a solvent is defined as the rate at which the solvent will evaporate relative to the rate at which a known reference will evaporate. All values quoted herein for RER assume a reference evaporation rate of 100 for butyl acetate.

In one embodiment, the first polar solvent has an RER of 2 or less. One example of a polar solvent with an RER of 2 or less is Propylene Carbonate (PC), which has an RER of 0.5. In one embodiment, the first polar solvent has a relative evaporation rate of 0.2 or less.

A first polar solvent with an RER of 20 or less is preferred. The evaporation rate from a perovskite ink comprising such a first polar solvent is expected to be lower than for a perovskite ink comprising a first polar solvent with an RER of more than 20. A perovskite ink comprising such a first polar solvent with an RER of 20 or less may maintain a stable concentration by weight of perovskite light emitting material for a longer period of time than a perovskite ink comprising a first polar solvent with an RER of more than 20. Such a perovskite ink may be processed to assemble a perovskite emissive layer 135 more reproducibly with a wider process window using industrial manufacturing methods such as inkjet printing.

A first polar solvent with an RER of 2 or less is more preferred. The evaporation rate from a perovskite ink comprising such a first polar solvent is expected to be lower than for a perovskite ink comprising a first polar solvent with an RER of more than 2. A perovskite ink comprising such a first polar solvent with an RER of 2 or less may maintain a stable concentration by weight of perovskite light emitting material for a longer period of time than a perovskite ink comprising a first polar solvent with an RER of more than 2. Such a perovskite ink may be processed to assemble a perovskite emissive layer 135 more reproducibly with a wider process window using industrial manufacturing methods such as inkjet printing. A first polar solvent with an RER of 0.2 or less is even more preferred.

In one embodiment, the perovskite ink has a viscosity in the range of 1 mPa·s to 10 mPa·s. As used herein, the viscosity of a perovskite ink is defined as the resistance of the perovskite ink to deformation at a given rate. It corresponds to the resistance of the perovskite ink to flow and to the informal concept of thickness, wherein a perovskite ink with higher viscosity can informally be considered to be thicker and with lower tendency to flow. All values quoted herein for viscosity assume measurement at 25° C. with 500 $s^{-1}$ shear rate using a rotational rheometer with parallel plate geometry, such as the ARES-G2 rotational rheometer from TA Instruments.

In one embodiment, the perovskite ink has a viscosity in the range of 2 mPa·s to 8 mPa·s. In one embodiment, the perovskite ink has a viscosity in the range of 3 mPa·s to 7 mPa·s.

Preferably, the perovskite ink has a viscosity in the range of 1 mPa·s to 10 mPa·s. A perovskite ink with such a range of viscosity may be compatible with industrial manufacturing methods such as inkjet printing. A perovskite ink with such a range of viscosity may be jetted from one or more industrial print heads to form ink droplets that may be deposited onto a substrate. For example, such a perovskite ink may be compatible with an industrial print head such as the Samba G3L printhead by Fujifilm Dimatix. More preferably, the perovskite ink has a viscosity in the range of 2 mPa·s to 8 mPa·s. Even more preferably, the perovskite ink has a viscosity in the range of 3 mPa·s to 7 mPa·s, which is the recommended viscosity range for the Samba G3L printhead by Fujifilm Dimatix.

The viscosity of the perovskite ink may be controlled by tuning the weight concentration of perovskite light emitting material in the perovskite ink. For example, a perovskite ink with higher weight concentration of perovskite light emitting material may be of higher viscosity than a perovskite ink with lower weight concentration. Viscosity can also be controlled by the choice of the first polar solvent. For example, a perovskite ink comprising a first polar solvent with lower viscosity may be of lower viscosity than a perovskite ink comprising a first polar solvent with higher viscosity. Table 3 and Table 5 list viscosities for exemplary polar solvents. Note that viscosity data are not provided for polar solvents with melting point greater than 25° C.

In one embodiment, the perovskite ink has a surface tension in the range of 15 dyne/cm to 55 dyne/cm. As used herein, the surface tension of a perovskite ink can be understood as the tension of the surface film of the perovskite ink caused by attraction of particles in the surface layer to the bulk of the perovskite ink. Surface tension acts to minimize the surface area of the perovskite ink. The surface tension of a perovskite ink may also be referred to as the surface energy of a perovskite ink, which is defined as the energy required to increase the surface area of the perovskite ink by unit value. Surface tension is closely related to wetting, wherein a perovskite ink with lower surface tension is expected to have a higher tendency to wet surfaces than a perovskite ink with higher surface energy. All values quoted herein for surface tension assume measurement at 20° C. using the pendant drop method with a contact angle goniometer, such as the FTA1000 from First Ten Angstrom.

In one embodiment, the perovskite ink has a surface tension in the range of 25 dyne/cm to 45 dyne/cm.

Preferably, the perovskite ink has a surface tension in the range of 15 dyne/cm to 55 dyne/cm. A perovskite ink with such a range of surface tension may be compatible with industrial manufacturing methods such as inkjet printing. A perovskite ink with such a range of surface tension may be jetted from one or more industrial print heads to form ink droplets that may be deposited onto a substrate. This may be achieved without the perovskite ink spreading away from the nozzles and wetting the print head, which would lead to defects in manufacturing and loss of yield. For example, a perovskite ink with a surface tension of less than 15 dyne/cm would be more likely to spread away from the nozzles and wet the print head than a perovskite ink with a surface tension of 15 dyne/cm or more. Furthermore, upon deposition onto a surface, such a perovskite ink with a surface tension in the range of 15 dyne/cm to 55 dyne/cm is expected to wet a substrate uniformly over a desired target area such as a patterned pixel or sub-pixel of an electronic display. This may be achieved without any pinholes or dewetting from the edges of the pixel or sub-pixel that would lead to defects in manufacturing and loss of yield. For example, a perovskite ink with a surface tension of more than 55 dyne/cm would be more likely to dewet from the edge of a patterned pixel or sub-pixel than a perovskite ink with a surface tension of 55 dyne/cm or less.

More preferably, the perovskite ink has a surface tension in the range of 25 dyne/cm to 45 dyne/cm. This would allow greater control of the manufacturing process window.

The surface tension of the perovskite ink may be controlled by the choice of the first polar solvent. For example, a perovskite ink comprising a first polar solvent with lower surface tension may be of lower surface tension than a perovskite ink comprising a first polar solvent with higher surface tension. The surface tension of the perovskite ink may be reduced by the addition of a surfactant to the perovskite ink. Table 3 and Table 5 list surface tensions for exemplary polar solvents. Note that surface tension data are not provided for first polar solvents with melting point greater than 20° C.

In one embodiment, the concentration of water in the perovskite ink is less than or equal to 0.5 wt. %. In one embodiment, the concentration of water in the perovskite ink is less than or equal to 0.05 wt. %. In one embodiment, the concentration of water in the perovskite ink is less than or equal to 0.005 wt. %. Such low concentrations of water are desirable because it is expected that presence of water in a perovskite ink comprising perovskite light emitting material may promote chemical or physical reactions that may lead to degradation of the perovskite light emitting material in the perovskite ink. Furthermore, the presence of residual water in a perovskite emissive layer assembled from such a perovskite ink, for example by industrial methods such as inkjet printing followed by vacuum drying and annealing, may also promote chemical or physical reactions that may lead to degradation of the perovskite light emitting material in the perovskite emissive layer. This degradation may in turn lead to a loss of optoelectronic performance in a PeLED device comprising a perovskite emissive layer assembled from such a perovskite ink.

Preferably, the concentration of water in the perovskite ink is less than or equal to 0.5 wt. %. More preferably, the concentration of water in the perovskite ink is less than or equal to 0.05 wt. %. Even more preferably, the concentration of water in the perovskite ink is less than or equal to 0.005 wt. %. Such concentrations of water may be achieved by using highly purified first polar solvents in the perovskite ink. For example, one exemplary first polar solvent is dimethyl sulfoxide (DMSO), which may be purchased from Sigma Aldrich with a water concentration of <0.005 wt. % quoted for the anhydrous grade.

In one embodiment, the concentration of oxygen in the perovskite ink is less than or equal to 10 parts per million (ppm). In one embodiment, the concentration of oxygen in the perovskite ink is less than or equal to 1 ppm. In one embodiment, the concentration of oxygen in the perovskite ink is less than or equal to 0.1 ppm. Such low concentrations of oxygen are desirable because it is expected that presence of oxygen in a perovskite ink comprising perovskite light emitting material may promote chemical or physical reactions that may lead to degradation of the perovskite light emitting material in the perovskite ink. This degradation may in turn lead to a loss of optoelectronic performance in a PeLED device comprising a perovskite emissive layer assembled from such a perovskite ink. Furthermore, the concentration of oxygen is expected to be correlated to the concentration of gas in the perovskite ink. It is preferred that there is a low concentration of gas in the perovskite ink. This is because a higher concentration of gas increases the likelihood of bubbles forming during processing of the perovskite ink by industrial methods such as inkjet printing. Such bubbles would be expected to lead to print defects, which may in turn lead to a loss of optoelectronic performance in a PeLED device comprising a perovskite emissive layer assembled from such a perovskite ink.

material. Preferably, both exemplary degassing steps are performed. Exemplary degassing techniques include ultrasonic treatment of the polar solvent or perovskite ink, flow of inert gas such as argon or nitrogen through the polar solvent or perovskite ink or freeze-pump-thaw treatment of the polar solvent or perovskite ink.

In one embodiment, the perovskite ink comprises a first polar solvent, wherein the first polar solvent may be aqueous or organic. Examples of organic polar solvents include carbonate compounds, ester compounds, ether compounds, heterocyclic compounds, nitrile compounds, and aprotic polar compounds. Examples of carbonate compounds include dimethyl carbonate, diethyl carbonate, methyl ethyl carbonate, ethylene carbonate (EC) and propylene carbonate (PC). Examples of ester compounds include methyl acetate, methyl propionate and gamma-butyrolactone (GBL). Examples of ether compounds include diethyl ether, 1,2-

TABLE 2

Figure 14:
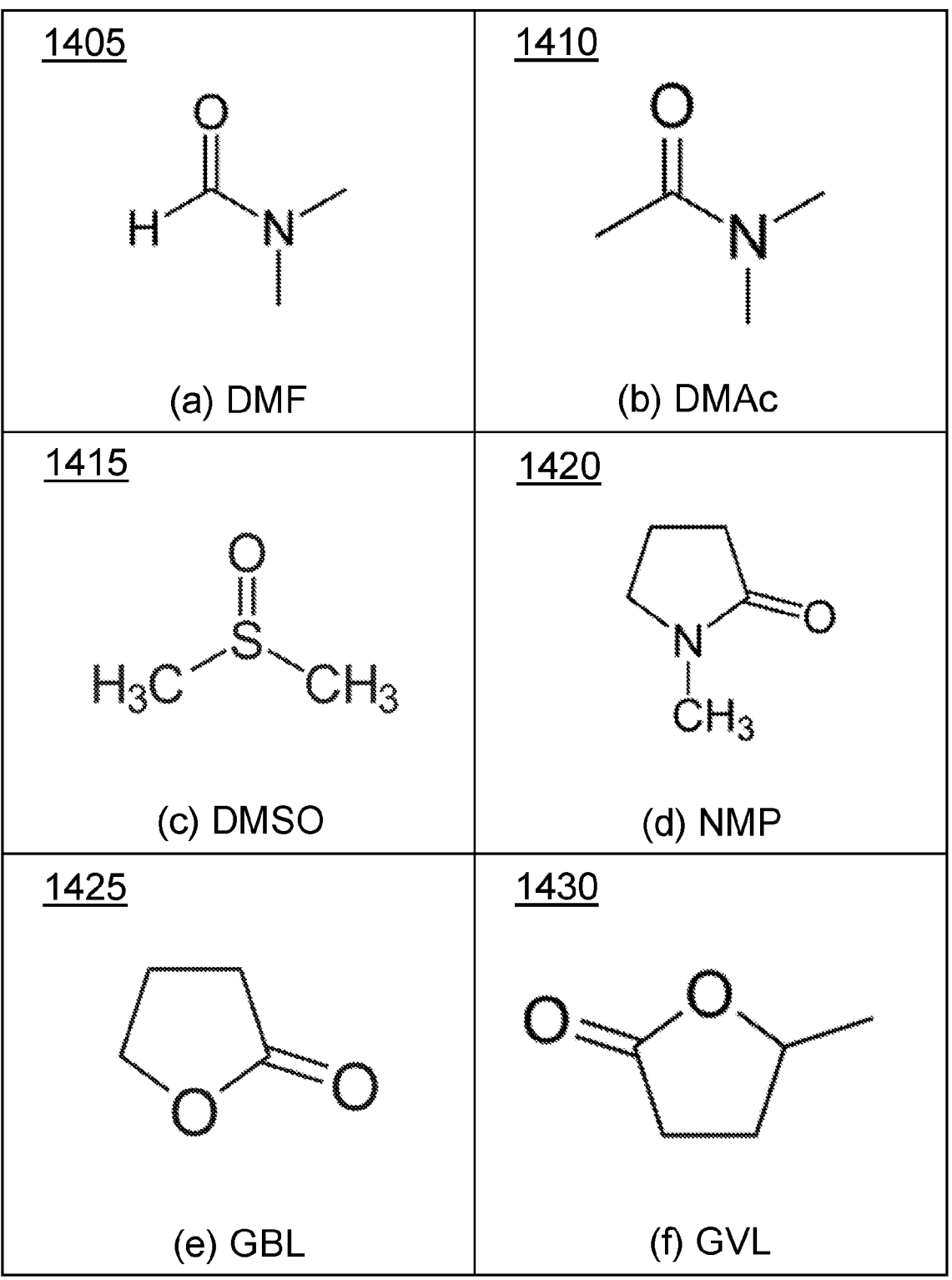
FIG. 14 depicts the chemical structures of exemplary polar solvents.
Figure 14:
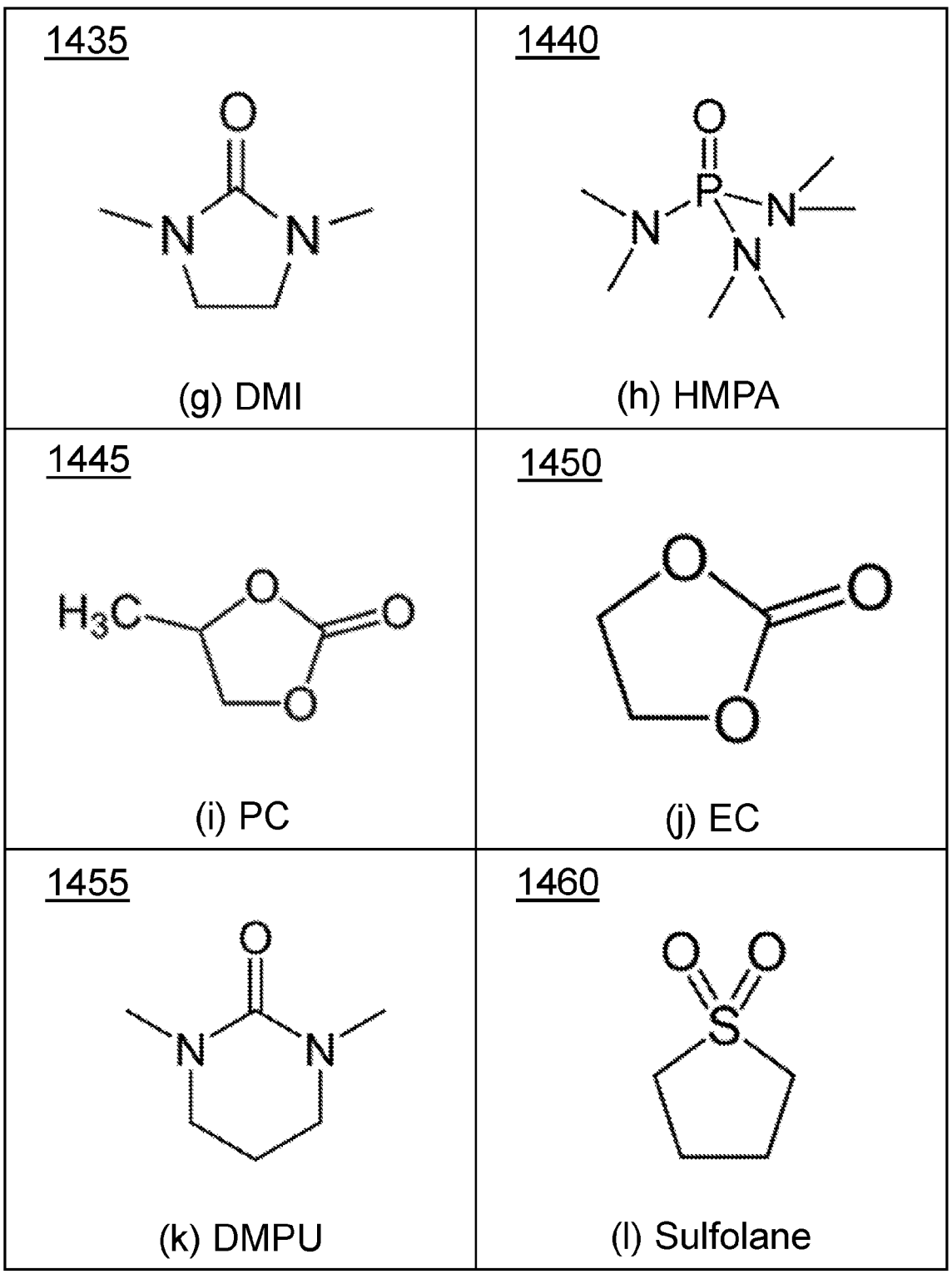

Properties of preferred first polar solvents according to embodiments of the present disclosure. Chemical structures for these polar solvents are shown in FIG. 14 where they are labelled by the corresponding letter shown in Table 2.

| Polar Solvent Name | Abbreviation | Boiling Point (° C. at 1 atm) | Melting Point (° C. at 1 atm) |
|---|---|---|---|
| (a) Dimethylformamide | (DMF) | 153 | −61 |
| (b) Dimethylacetamide | (DMAc) | 165 | −20 |
| (c) Dimethyl Sulfoxide | (DMSO) | 189 | 19 |
| (d) N-Methyl-2-Pyrrolidone | (NMP) | 202 | −24 |
| (e) Gamma-Butyrolactone | (GBL) | 202 | −44 |
| (f) Gamma-Valerolactone | (GVL) | 208 | −31 |
| (g) 1,3-Dimethyl-2-Imidazolidinone | (DMI) | 225 | 8 |
| (h) Hexamethylphosphoramide | (HMPA) | 233 | 7 |
| (i) Propylene Carbonate | (PC) | 240 | −49 |
| (j) Ethylene Carbonate | (EC) | 243 | 34 |
| (k) N, N'-Dimethylpropyleneurea | (DMPU) | 247 | −20 |
| (l) Sulfolane | — | 285 | 28 |

Preferably, the concentration of oxygen in the perovskite ink is less than or equal to 10 ppm. More preferably, the concentration of oxygen in the perovskite ink is less than or equal to 1 ppm. Even more preferably, the concentration of water in the perovskite ink is less than or equal to 0.1 ppm. Such low concentrations of oxygen may be achieved by degassing the first polar solvent prior to mixing it with the first perovskite light emitting material to form the perovskite ink. Such low concentrations of oxygen may also be achieved by degassing the perovskite ink after mixing the first polar solvent with the first perovskite light emitting dimethoxyethane, 1,3-dioxolane, tetrahydrofuran, and 2-methyltetrahydrofuran. Examples of heterocyclic compounds include 3-methyl-2-oxazolidinone and N-Methyl-2-Pyrrolidone (NMP). Examples of nitrile compounds include acetonitrile, methoxyacetonitrile, and propiononitrile. Examples of aprotic polar compounds include sulfolane, dimethyl sulfoxide (DMSO) and dimethylformamide (DMF). These solvents may be used alone or in combinations comprising multiple solvents. Preferred first polar solvents are polar solvents having a boiling point of 150° C. or more and a melting point of 30° C. or less.

TABLE 3

Properties of preferred first polar solvents according to embodiments of the present disclosure. Chemical structures for these polar solvents are shown in FIG. 14 where they are labelled by the corresponding letter shown in Table 3.

| Polar Solvent Name | Abbreviation | Viscosity (mPa · s at 25° C.) | Surface Tension (dyne/cm at 20° C.) |
|---|---|---|---|
| (a) Dimethylformamide | (DMF) | 0.79 | 37 |
| (b) Dimethylacetamide | (DMAc) | 0.95 | 37 |
| (c) Dimethyl Sulfoxide | (DMSO) | 1.99 | 44 |
| (d) N-Methyl-2-Pyrrolidone | (NMP) | 1.67 | 40 |
| (e) Gamma-Butyrolactone | (GBL) | 1.70 | 39 |
| (f) Gamma-Valerolactone | (GVL) | 2.18 | 29 |
| (g) 1,3-Dimethyl-2-Imidazolidinone | (DMI) | 1.94 | 34 |
| (h) Hexamethylphosphoramide | (HMPA) | 3.25 | 34 |
| (i) Propylene Carbonate | (PC) | 2.50 | 41 |

TABLE 3-continued

Properties of preferred first polar solvents according to embodiments of the present disclosure. Chemical structures for these polar solvents are shown in FIG. 14 where they are labelled by the corresponding letter shown in Table 3.

| Polar Solvent Name | Abbreviation | Viscosity (mPa · s at 25° C.) | Surface Tension (dyne/cm at 20° C.) |
|---|---|---|---|
| (j) Ethylene Carbonate | (EC) | — | — |
| (k) N,N'-Dimethylpropyleneurea | (DMPU) | 1.96 | 33 |
| (l) Sulfolane | — | — | — |

In one embodiment, the perovskite ink comprises a first polar solvent, wherein the first polar solvent is one of dimethylformamide (DMF), dimethylacetamide (DMAc) and dimethyl sulfoxide (DMSO). Chemical structures for DMF 1405, DMAc 1410 and DMSO 1415 are depicted in FIG. 14. Such first polar solvents are preferred because they all have boiling points of at least 150° C. Tables 2 and 3 summarize some of the properties of these solvents.

Figure 15:
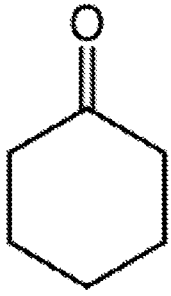
FIG. 15 depicts the chemical structures of further exemplary polar solvents.
Figure 15:
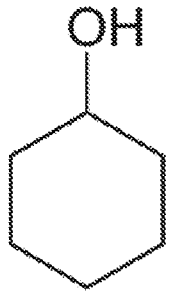
Figure 15:
Figure 15:
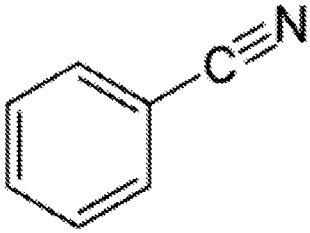
Figure 15:
Figure 15:
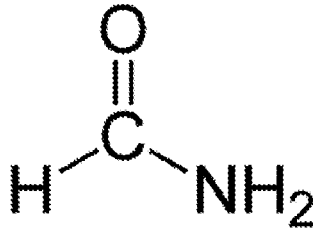
Figure 15:
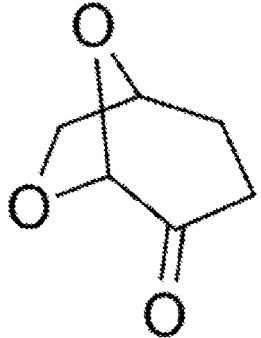
Figure 15:
Figure 15:
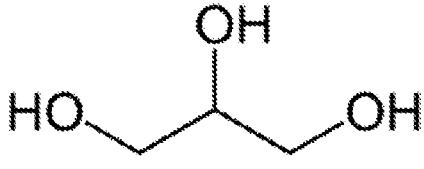

In one embodiment, the perovskite ink comprises a first polar solvent, wherein the first polar solvent is one of cyclohexanone, cyclohexanol, 2-aminoethanol (MEA), benzonitrile or ethylene glycol (EG). Chemical structures for cyclohexanone 1505, cyclohexanol 1510, MEA 1515, benzonitrile 1520 and EG 1525 are depicted in FIG. 15. Such first polar solvents are preferred because they all have boiling points of at least 150° C. Tables 4 and 5 summarize some of the properties of these solvents.

In one embodiment, the perovskite ink comprises a first polar solvent, wherein the first polar solvent is one of N-Methyl-2-Pyrrolidone (NMP), Gamma-Butyrolactone (GBL) and Gamma-Valerolactone (GVL). Chemical structures for NMP 1420, GBL 1425 and GVL 1430 are shown in FIG. 14. Such first polar solvents are preferred because they all have boiling points of at least 200° C. Tables 2 and 3 summarize some of the properties of these solvents.

In one embodiment, the perovskite ink comprises a first polar solvent, wherein the first polar solvent is formamide. The chemical structure for formamide 1530 is depicted in FIG. 15. Such a first polar solvent is preferred because it has a boiling point of at least 200° C. Tables 4 and 5 summarize some of the properties of this solvent.

In one embodiment, the perovskite ink comprises a first polar solvent, wherein the first polar solvent is one of 1,3-Dimethyl-2-Imidazolidinone (DMI), Hexamethylphosphoramide (HMPA), Propylene Carbonate (PC), Ethylene Carbonate (EC) and N,N'-Dimethylpropyleneurea (DMPU). Chemical structures for DMI 1435, HMPA 1440, PC 1445, EC 1450 and DMPU 1455 are shown in FIG. 14. Such first polar solvents are preferred because they all have boiling points of at least 225° C. Tables 2 and 3 summarize some of the properties of these solvents.

In one embodiment, the perovskite ink comprises a first polar solvent, wherein the first polar solvent is one of dihydrolevoglucosenone (cyrene) or diethylene glycol (DG). Chemical structures for cyrene 1535 and DG 1540 are shown in FIG. 15. Such first polar solvents are preferred because they all have boiling points of at least 225° C. Tables 4 and 5 summarize some of the properties of these solvents.

In one embodiment, the perovskite ink comprises a first polar solvent, wherein the first polar solvent is sulfolane. The chemical structure for sulfolane 1460 is shown in FIG. 14. Such a first polar solvent is preferred because it has a boiling point of at least 250° C. Tables 2 and 3 summarize some of the properties of this solvent.

In one embodiment, the perovskite ink comprises a first polar solvent, wherein the first polar solvent is glycerol. The chemical structure for glycerol 1545 is shown in FIG. 15. Such a first polar solvent is preferred because it has a boiling point of at least 250° C. Tables 4 and 5 summarize some of the properties of this solvent.

TABLE 4

Properties of preferred first polar solvents according to embodiments of the present disclosure. Chemical structures for these polar solvents are shown in FIG. 15 where they are labelled by the corresponding letter shown in Table 4.

| Polar Solvent Name | Abbreviation | Boiling Point (° C. at 1 atm) | Melting Point (° C. at 1 atm) |
|---|---|---|---|
| (a) Cyclohexanone | — | 156 | −47 |
| (b) Cyclohexanol | — | 162 | 26 |
| (c) 2-aminoethanol | (MEA) | 170 | 10 |
| (d) Benzonitrile | — | 191 | −13 |
| (e) Ethylene Glycol | (EG) | 197 | −13 |
| (f) Formamide | — | 210 | 3 |
| (g) Dihydrolevoglucosenone | (Cyrene) | 226 | <−20 |
| (h) Diethylene Glycol | (DG) | 245 | −10 |
| (i) Glycerol | — | 290 | 18 |

In one embodiment, the perovskite ink comprises a first polar solvent, wherein the first polar solvent has a boiling point of 150° C. to 300° C. and a melting point of 30° C. or less, and a first perovskite light emitting material mixed in the first polar solvent. In one embodiment, the perovskite ink comprises a first polar solvent, wherein the first polar solvent has a boiling point of 150° C. to 300° C. and a melting point of 20° C. or less, and a first perovskite light emitting material mixed in the first polar solvent. In one embodiment, the perovskite ink comprises a first polar solvent, wherein the first polar solvent has a boiling point of 150° C. to 300° C. and a melting point of 0° C. or less, and a first perovskite light emitting material mixed in the first polar solvent.

TABLE 5

Properties of preferred first polar solvents according to embodiments of the present disclosure. Chemical structures for these polar solvents are shown in FIG. 15 where they are labelled by the corresponding letter shown in Table 5.

| Polar Solvent Name | Abbreviation | Viscosity (mPa · s at 25° C.) | Surface Tension (dyne/cm at 20° C.) |
|---|---|---|---|
| (a) Cyclohexanone | — | 2.0 | 35 |
| (b) Cyclohexanol | — | 41.1 | 34 |
| (c) 2-aminoethanol | (MEA) | 19.4 | 49 |
| (d) Benzonitrile | — | 1.2 | 40 |
| (e) Ethylene Glycol | (EG) | 16.1 | 47 |
| (f) Formamide | — | 3.2 | 58 |
| (g) Dihydrolevoglucosenone | (Cyrene) | 14.5 | 73 |
| (h) Diethylene Glycol | (DG) | 35.7 | 45 |
| (i) Glycerol | — | 1412 | 64 |

In one embodiment, the perovskite ink comprises a first polar solvent, wherein the first polar solvent has a boiling point of 200° C. to 300° C. and a melting point of 30° C. or less, and a first perovskite light emitting material mixed in the first polar solvent. In one embodiment, the perovskite ink comprises a first polar solvent, wherein the first solvent has a boiling point of 200° C. to 300° C. and a melting point of 20° C. or less, and a first perovskite light emitting material mixed in the first polar solvent. In one embodiment, the perovskite ink comprises a first polar solvent, wherein the first polar solvent has a boiling point of 200° C. to 300° C. and a melting point of 0° C. or less, and a first perovskite light emitting material mixed in the first polar solvent.

In one embodiment, the perovskite ink comprises a first polar solvent, wherein the first polar solvent has a boiling point of 225° C. to 300° C. and a melting point of 30° C. or less, and a first perovskite light emitting material mixed in the first polar solvent. In one embodiment, the perovskite ink comprises a first polar solvent, wherein the first polar solvent has a boiling point of 225° C. to 300° C. and a melting point of 20° C. or less, and a first perovskite light emitting material mixed in the first polar solvent. In one embodiment, the perovskite ink comprises a first polar solvent, wherein the first polar solvent has a boiling point of 225° C. to 300° C. and a melting point of 0° C. or less, and a first perovskite light emitting material mixed in the first polar solvent.

In one embodiment, the perovskite ink comprises a first polar solvent, wherein the at first polar solvent has a boiling point of 250° C. to 300° C. and a melting point of 30° C. or less, and a first perovskite light emitting material mixed in the first polar solvent. In one embodiment, the perovskite ink comprises a first polar solvent, wherein the first polar solvent has a boiling point of 250° C. to 300° C. and a melting point of 20° C. or less, and a first perovskite light emitting material mixed in the first polar solvent. In one embodiment, the perovskite ink comprises a first polar solvent, wherein the first polar solvent has a boiling point of 250° C. to 300° C. and a melting point of 0° C. or less, and a first perovskite light emitting material mixed in the first polar solvent.

Perovskite inks comprising first polar solvents with such exemplary boiling points and melting points may be desirable because they may be processed using industrial methods such as inkjet printing followed by vacuum drying and annealing with the widest process window and highest yield.

Preferably, the perovskite ink comprises a first polar solvent with a boiling point of 200° C. to 300° C. and a melting point of 20° C. or less. More preferably, the perovskite ink comprises a first polar solvent with a boiling point of 200° C. to 300° C. and a melting point of 0° C. or less. Even more preferably, the perovskite ink comprises a first polar solvent with a boiling point of 225° C. to 300° C. and a melting point of 20° C. or less. Most preferably, the perovskite ink comprises a first polar solvent with a boiling point of 225° C. to 300° C. and a melting point of 0° C. or less.

In one embodiment, the perovskite ink comprises a first polar solvent, wherein the first polar solvent may be characterized by Hansen Solubility Parameters: $\delta_d$ in the range of 16 MPa$^{0.5}$ to 20 MPa$^{0.5}$, $\delta_p$ in the range of 4 MPa$^{0.5}$ to 27 MPa$^{0.5}$ and $\delta_h$ in the range of 3 MPa$^{0.5}$ to 30 MPa$_{0.5}$. Some examples of Hansen Solubility Parameters for first solvents disclosed herein are listed in Table 6. Hansen Solubility Parameters as used herein are determined according to the Hansen Solubility Parameters in Practice (HSPiP) program (2nd edition) as supplied by Hanson and Abbot et al. Such Hansen Solubility Parameters may be preferred because perovskite light emitting material may have high solubility in solvents with such Hansen Solubility Parameters.

As used herein, Hansen Solubility Parameters comprise three parameters: $\delta_d$ that is the energy from dispersion forces between molecules; $\delta_p$ that is the energy from dipolar intermolecular forces between molecules; and $\delta_h$ that is the energy from hydrogen bonds between molecules. These three parameters define coordinates for points in 3D Hansen Space. The nearer two molecules such as a first solvent and a donor material or an acceptor material are in this 3D Hansen Space, the more likely they are to dissolve into each other. To determine if the parameters of two molecules are within range, a value called the Interaction Radius $R_0$ is assigned to the molecule that is being dissolved. This value determines the radius of the sphere in 3D Hansen Space and its center is the three Hansen Solubility Parameters. To calculate the distance $R_a$ between Hansen Solubility Parameters in 3D Hansen Space the following formula is used: $(R_a)^2 = 4(\delta_{d1} - \delta_{d2})^2 + (\delta_{p1} - \delta_{p2})^2 + (\delta_{h1} - \delta_{h2})^2$. Combining this with the Interaction Radius $R_0$ gives the Relative Energy Difference (RED) of the system, wherein RED=$R_a/R_0$. For systems with RED<1, the molecules are alike and will dissolve. For systems with RED=1, the system will partially dissolve. For RED>1 the system will not dissolve.

TABLE 6

Hansen Solubility parameters for exemplary first polar solvents according to embodiments of the present disclosure. All values are expressed in units of $MPa^{0.5}$. Chemical structures are shown in FIG. 14 and FIG. 15 where they are labelled by the corresponding number shown in Table 6.

| Solvent Name | $\delta_d$ | $\delta_p$ | $\delta_h$ |
| --- | --- | --- | --- |
| (14a) Dimethylformamide | 17.4 | 13.7 | 11.3 |
| (14b) Dimethylacetamide | 16.8 | 11.5 | 10.2 |
| (14c) Dimethyl Sulfoxide | 18.4 | 16.4 | 10.2 |
| (14d) N-Methyl-2-Pyrrolidone | 18.0 | 12.3 | 7.2 |
| (14e) Gamma-Butyrolactone | 19.0 | 16.5 | 7.3 |
| (14f) Gamma-Valerolactone | 16.9 | 11.5 | 6.3 |
| (14g) 1,3-Dimethyl-2-Imidazolidinone | 17.6 | 7.1 | 7.5 |
| (14h) Hexamethylphosphoramide | 18.5 | 8.6 | 11.3 |
| (14i) Propylene Carbonate | 20.0 | 18.0 | 4.1 |
| (14j) Ethylene Carbonate | 19.4 | 21.7 | 5.1 |
| (14k) N,N'-Dimethylpropyleneurea | 17.9 | 8.4 | 7.5 |
| (14l) Sulfolane | 18.0 | 18.0 | 9.9 |
| (15a) Cyclohexanone | 17.8 | 6.2 | 5.1 |
| (15b) Cyclohexanol | 17.4 | 4.1 | 13.5 |
| (15c) 2-aminoethanol | 17.0 | 15.5 | 21.3 |
| (15d) Benzonitrile | 17.4 | 9.0 | 3.3 |
| (15e) Ethylene Glycol | 17.0 | 11.0 | 26.0 |
| (15f) Formamide | 17.2 | 26.2 | 19.0 |
| (15g) Dihydrolevoglucosenone | 18.9 | 10.6 | 6.5 |
| (15h) Diethylene Glycol | 16.6 | 12.0 | 20.7 |
| (15i) Glycerol | 17.4 | 12.1 | 29.3 |

In one embodiment, the perovskite ink further comprises at least one surfactant. As used herein, a surfactant is defined as a substance that lowers the surface tension of a perovskite ink. By reducing surface tension, a surfactant increases the tendency of a perovskite ink to wet surfaces. This may be advantageous in that it may enable the perovskite ink to more uniformly wet surfaces onto which it is deposited, minimizing dewetting effects and pinholes. More uniform perovskite emissive layers may therefore be assembled from a perovskite ink comprising at least one surfactant, enabling improved optoelectronic performance from PeLEDs that comprise perovskite emissive layers assembled from such perovskite ink formulations.

Optionally, the surfactant may comprise at least one hydrocarbon chain connected to a head group. Optionally, the at least one hydrocarbon chain may be branched, linear or aromatic. Optionally, the surfactant may comprise at least two hydrocarbon chains connected to a head group. Optionally, the surfactant may be a fluorosurfactant comprising a fluorocarbon chain. Optionally, the surfactant may be a siloxane surfactant comprising a siloxane chain.

Optionally the surfactant may be a non-ionic surfactant, comprising a non-ionic head group. Optionally, the non-ionic surfactant may comprise one or more covalently bonded oxygen-containing hydrophilic groups bonded to one or more hydrophobic parent structures. Examples of non-ionic surfactants include: ethoxylates, such as fatty alcohol ethoxylates, alkylphenol ethoxylates, fatty acid ethoxylates, ethoxylated amines, fatty acid amides, terminally blocked ethoxylates, fatty acid esters of polyhydroxyl compounds, such as fatty acid esters of glycerol, fatty acid esters of sorbitol, fatty acid esters of sucrose, alkyl polyglucosides, amine oxides, sulfoxides and phosphine oxides. Polyethylene glycol sorbitan monostearate (Tween 60) is one example of a non-ionic surfactant.

Optionally, the surfactant may be an anionic surfactant, comprising an anionic head group. Optionally, the anionic surfactant may comprise a sulfate, sulfonate, phosphate or carboxylate head group. Sodium dodecyl sulfate (SDS) is one example of an anionic surfactant. Optionally, the surfactant may be a cationic surfactant, comprising a cationic head group. Didodecyldimethylammonium bromide (DDAB) is one example of a cationic surfactant. Optionally, the surfactant may be an amphoteric head group, comprising an amphoteric head group. L-α-phosphatidylcholine (LP) is one example of an amphoteric surfactant.

In one embodiment, the perovskite ink comprises a second perovskite light emitting material, wherein the second perovskite light emitting material is different from the first perovskite light emitting material. In one embodiment, the second perovskite light emitting material comprises a second set of light emitting perovskite nanocrystals, wherein the number of layers of each light emitting perovskite nanocrystal in the second set is in the range of 2-10.

Such a perovskite ink comprising a first perovskite light emitting material and at least a second perovskite light emitting material that is different from the first perovskite light emitting material may be advantageous. For example, a PeLED device comprising a perovskite emissive layer assembled from such a perovskite ink may provide improved optoelectronic performance. For example, balance of electronic charge may be improved, transfer of charge or excitons to or from the perovskite light emitting materials may be improved and optimization of emission colour for the desired application may be achieved in such a perovskite emissive layer. In particular, both the first and the second perovskite light emitting materials may emit light, and the ratio of light emission may be controlled to achieve the desired emission colour.

In one embodiment, the perovskite ink may comprise a red perovskite light emitting material and a green perovskite light emitting material. Such a perovskite ink may assemble a perovskite emissive layer that may emit yellow light. In one embodiment, the perovskite ink may comprise a red perovskite light emitting material and a blue perovskite light emitting material. Such a perovskite ink may assemble a perovskite emissive layer that may emit magenta light. In one embodiment, the perovskite ink may comprise a green perovskite light emitting material and a blue perovskite light emitting material. Such a perovskite ink may assemble a perovskite emissive layer that may emit cyan light.

In one embodiment, the perovskite ink comprises a second perovskite light emitting material and a third perovskite light emitting material, wherein the second perovskite light emitting material is different from the first perovskite light emitting material, and the third perovskite light emitting material is different from the first perovskite light emitting material and the second perovskite light emitting material. In one embodiment, the third perovskite light emitting material comprises a third set of light emitting perovskite nanocrystals, wherein the number of layers of each light emitting perovskite nanocrystal in the third set is in the range of 2-10.

In one embodiment, the perovskite ink may comprise a red perovskite light emitting material, a green perovskite light emitting material and a blue perovskite light emitting material. Such a perovskite ink may assemble a perovskite emissive layer that may emit white light.

In one embodiment, the perovskite ink further comprises a second solvent, wherein the second solvent is different from the first polar solvent. In one embodiment, the second solvent is a polar solvent. In one embodiment, the second solvent is a non-polar solvent. In one embodiment, the perovskite ink further comprises a third solvent, wherein the third solvent is different from the first polar solvent and the second solvent. In one embodiment, the third solvent is a polar solvent. In one embodiment, the third solvent is a non-polar solvent. In one embodiment, the perovskite ink further comprises a fourth solvent, wherein the fourth solvent is different from the first polar solvent, the second solvent and the third solvent. In one embodiment, the fourth solvent is a polar solvent. In one embodiment, the fourth solvent is a non-polar solvent. Preferably, the optional second, third and fourth solvents are miscible with the first polar solvent.

Optionally, any of the second, third or fourth solvents may be any one of the polar solvents listed in Tables 2, 3, 4, 5 and 6 and depicted in FIGS. 14 and 15.

Optionally, any of the second, third or fourth solvents may be a non-polar solvent. Preferably, where the second, third or fourth solvent is a non-polar solvent, the non-polar solvent has a boiling point of 150° C. or more. More preferably, where the second, third or fourth solvent is a non-polar solvent, the non-polar solvent has a boiling point of 200° C. or more. Even more preferably, where the second, third or fourth solvent is a non-polar solvent, the nonpolar solvent has a boiling point of 225° C. or more. Most preferably, where the second, third or fourth solvent is a non-polar solvent, the non-polar solvent has a boiling point of 250° C. or more.

Figure 16:
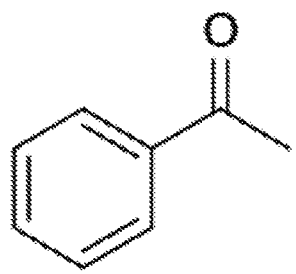
FIG. 16 depicts the chemical structures of exemplary non-polar solvents.
Figure 16:
Figure 16:
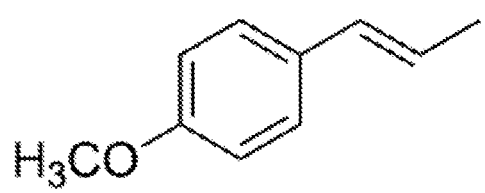
Figure 16:
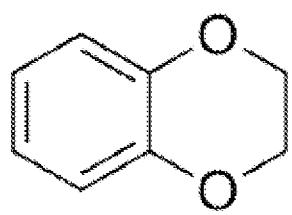
Figure 16:
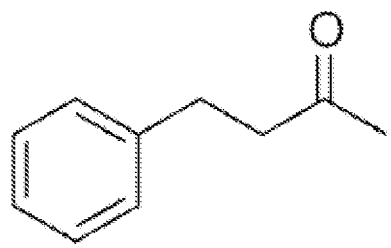
Figure 16:
Figure 16:
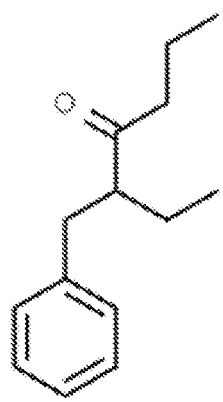
Figure 16:
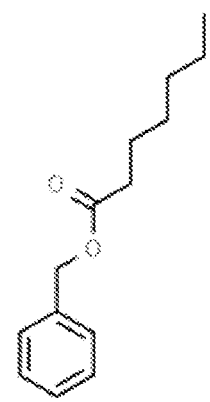
Figure 16:
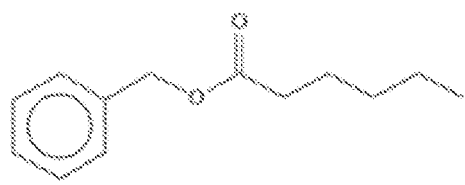
Figure 16:
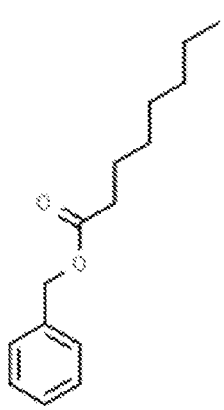
Figure 16:
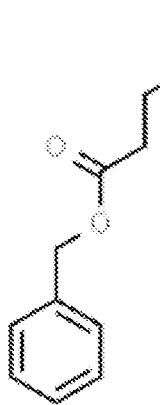
Figure 16:
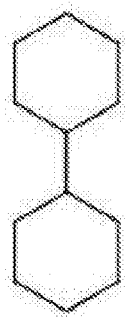
Figure 16:
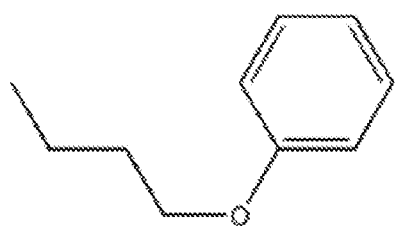
Figure 16:
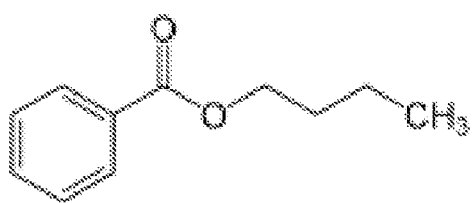
Figure 16:
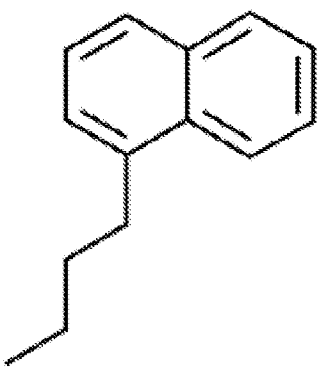
Figure 16:
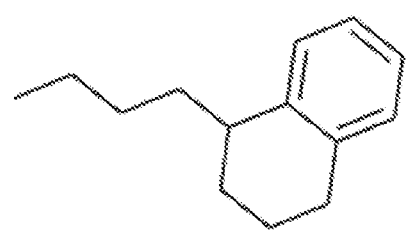
Figure 16:
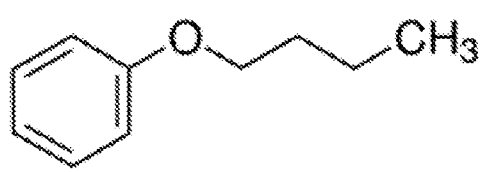
Figure 16:
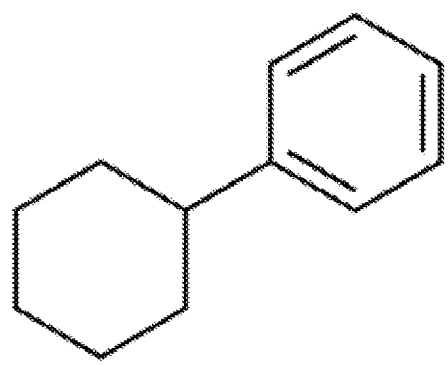
Figure 16:
Figure 16:
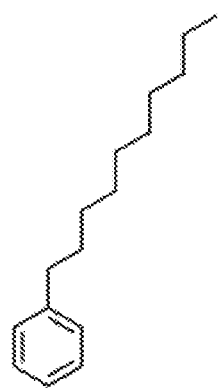
Figure 16:
Figure 16:
Figure 16:
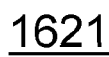
Figure 16:
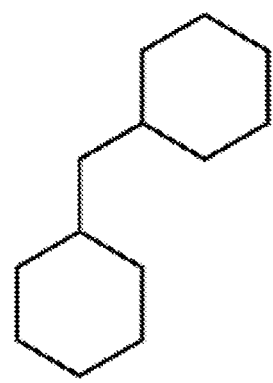
Figure 16:
Figure 16:
Figure 16:
Figure 16:
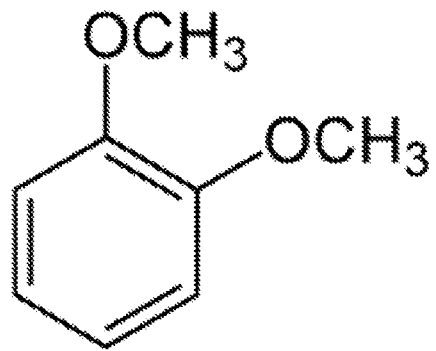
Figure 16:
Figure 16:
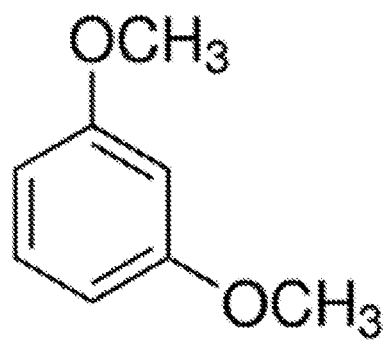
Figure 16:
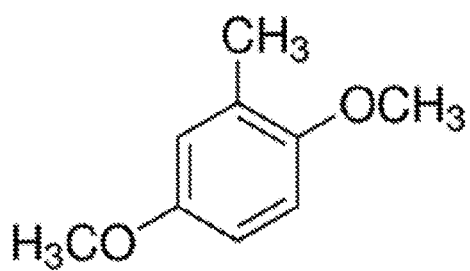
Figure 16:
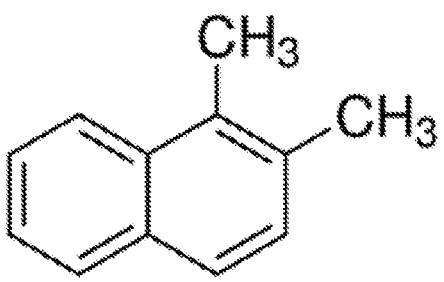
Figure 16:
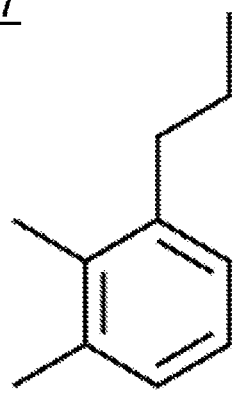
Figure 16:
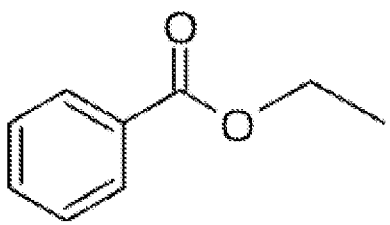
Figure 16:
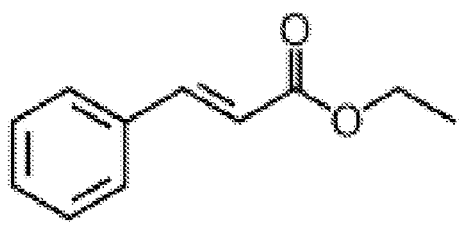
Figure 16:
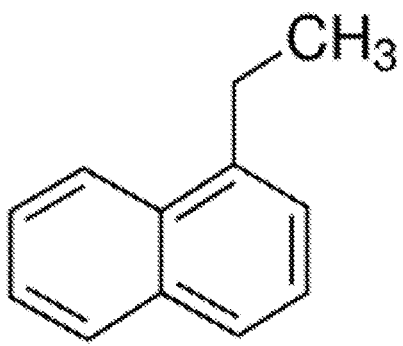
Figure 16:
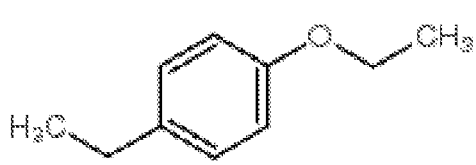
Figure 16:
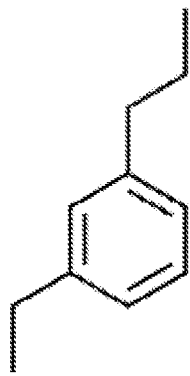
Figure 16:
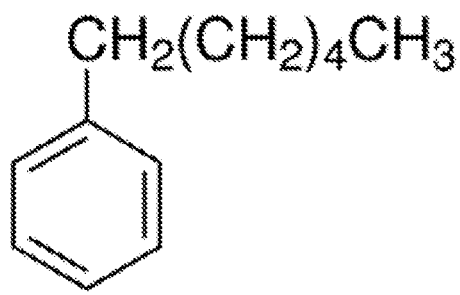
Figure 16:
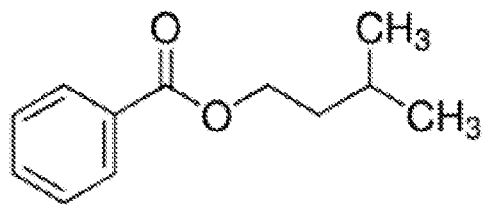
Figure 16:
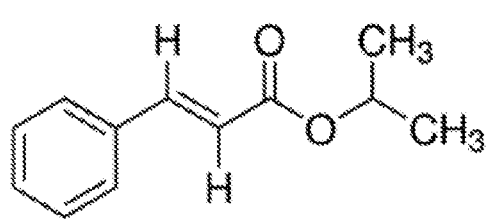
Figure 16:
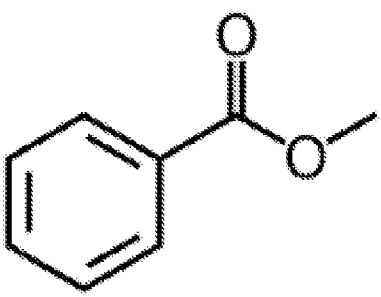
Figure 16:
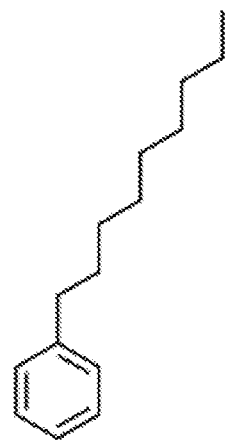
Figure 16:
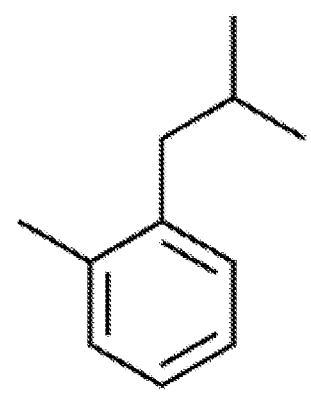
Figure 16:
Figure 16:
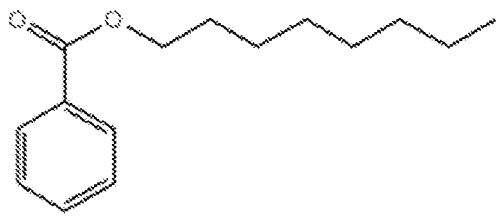
Figure 16:
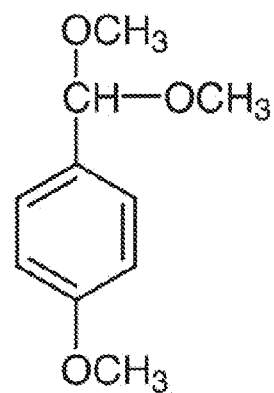
Figure 16:
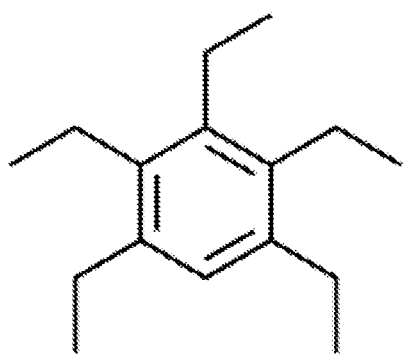
Figure 16:
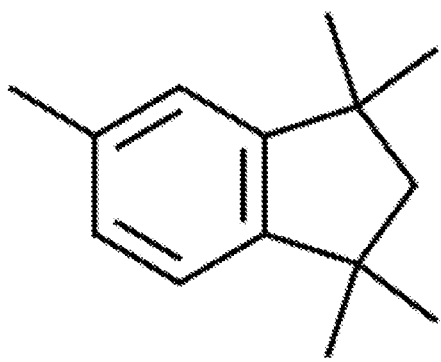
Figure 16:
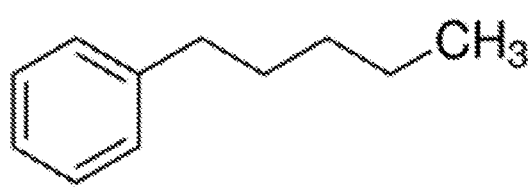
Figure 16:
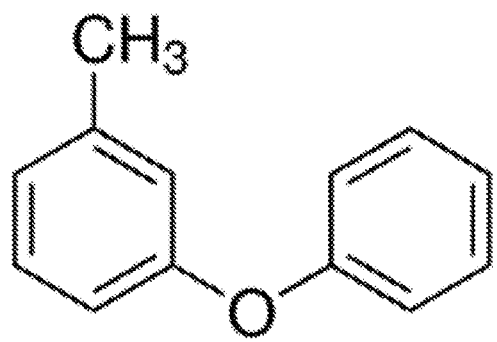
Figure 16:
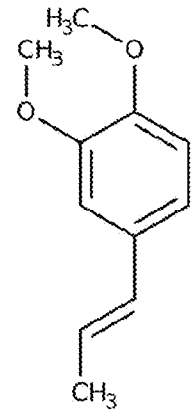
Figure 16:
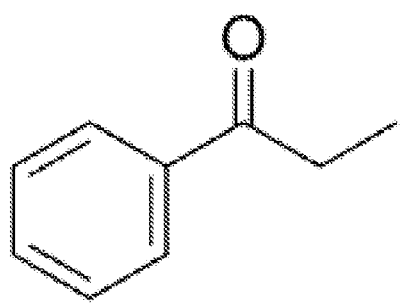
Figure 16:
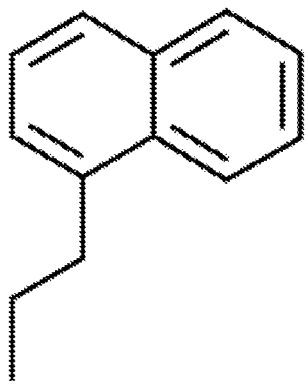
Figure 16:
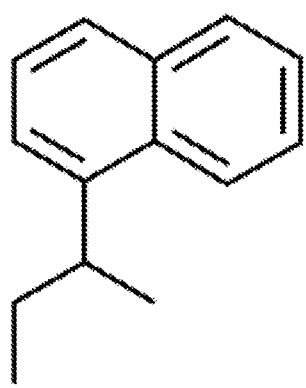
Figure 16:
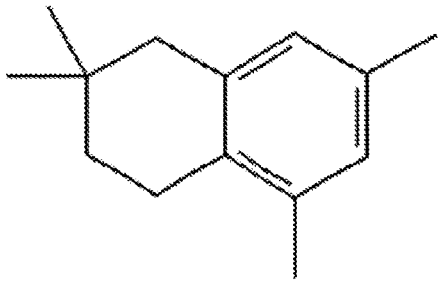
Figure 16:
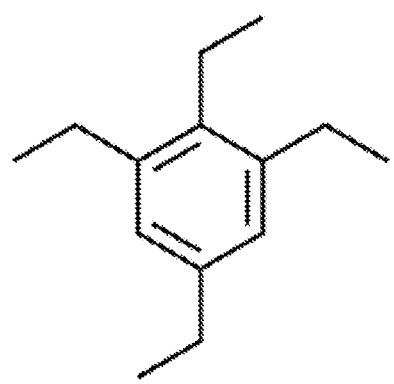

Exemplary non-polar solvents include: acetophenone (1601), amyl benzoate (1602), anethole (1603), 1,4-bezodioxane (1604), benzyl acetone (1605), benzyl butyl ether (1606), 3-benzyl-4-heptanone (1607), benzyl heptanoate (1608), benzyl hexanoate (1609), benzyl octanoate (1610), benzyl valerate (1611), bicyclohexyl (1612), butoxy benzene (1613), butyl benzoate (1614), 1-butylnaphthalene (1615), 1-butyl-[1,2,3,4-tetrahydro-naphthalene] (1616), butyl phenyl ether (1617), cyclohexyl benzene (1618), decylbenzene (1619), dibenzyl ether (1620), dicyclohexylmethane (1621), 2,6-diethylnapthalene (1622), 1,2-dimethoxybenzene (1623), 1,3-dimethoxybenzene (1624), 2,5-dimethoxytoluene (1625), 1,2-dimethylnaphthalene (1626), 1,2-dimethyl-3-propylbenzene (1627), ethyl benzoate (1628), ethyl cinnamate (1629), 1-ethylnaphthalene (1630), 4-ethylphenetole (1631), 1-ethyl-3-propylbenzene (1632), hexyl benzene (1633), isopentyl benzoate (1634), isopropyl cinnamate (1635), methyl benzoate (1636), nonylbenzene (1637), o-isobutyl toluene (1638), octylbenzene (1639), octylbenzoate (1640), p-anisaldehyde dimethyl acetal (1641), pentaethylbenzene (1642), 1,1,3,3,5-pentamethylindane (1643), pentyl benzene (1644), 3-phenoxytoluene (1645), 4-(1-propenyl)-1,2-dimethoxybenzene (1646), propiophenone (1647), 1-propylnaphthalene (1648), 1-sec-butylnaphthalene (1649), 2,2,5,7-tetraethyltetraline (1650) and 1,2,3,5-tetraethylbenzene (1651). Chemical structures for these exemplary non-polar solvents are depicted in FIG. 16. Boiling points and melting points for these solvents are listed in Table 7.

The solubility of perovskite light emitting material may be lower in non-polar solvents than in polar solvents. For this reason non-polar solvents may be referred to as anti-solvents.

By optionally including second, third or fourth solvents in the perovskite ink, the properties of the perovskite ink may be optimized for a specific application. For example, for application in a PeLED device, the properties of the perovskite ink may be optimized both for deposition onto a substrate by the method of inkjet printing and for subsequent assembly of a perovskite emissive layer from the perovskite ink by the method of vacuum drying and annealing. Each of the optional second, third or fourth solvents may be selected for their desirable properties. For example, each of the optional second, third or fourth solvents may be selected for desirable boiling point, melting point, vapour pressure, RER, viscosity, surface tension or solubility of perovskite light emitting material in the solvent. By using optional second, third or fourth solvents in combination with a first polar solvent, an optimized perovskite ink may be engineered.

TABLE 7

Properties of exemplary non-polar solvents according to embodiments of the present disclosure. Chemical structures are shown in FIG. 16 where they are labelled by the corresponding number shown in Table 7.

| Solvent Name | Boiling Point (° C. at 1 atm) | Melting Point (° C. at 1 atm) |
| --- | --- | --- |
| (1601) acetophenone | 202 | 20 |
| (1602) amyl benzoate | 269 | Liquid at 30° C. |
| (1603) anethole | 235 | 20 |
| (1604) 1,4-benzodioxane | 216 | Liquid at 30° C. |
| (1605) benzyl acetone | 234 | −13 |
| (1606) benzyl butyl ether | 209 | −19 |
| (1607) 3-benzyl-4-heptanone | 159 | Liquid at 30° C. |
| (1608) benzyl heptanoate | 257 | Liquid at 30° C. |
| (1609) benzyl hexanoate | 269 | Liquid at 30° C. |
| (1610) benzyl octanoate | 299 | Liquid at 30° C. |
| (1611) benzyl valerate | 236 | Liquid at 30° C. |
| (1612) bicyclohexyl | 239 | 4 |
| (1613) butoxy benzene | 210 | −19 |
| (1614) butyl benzoate | 250 | −22 |
| (1615) 1-butylnaphthalene | 289 | −20 |
| (1616) 1-butyl-[1,2,3,4-tetrahydro-naphthalene] | — | — |
| (1617) butyl phenyl ether | 209 | −19 |
| (1618) cyclohexyl benzene | 240 | 7 |
| (1619) decylbenzene | 294 | −14 |
| (1620) dibenzyl ether | 298 | 4 |
| (1621) dicyclohexylmethane | 264 | Liquid at 30° C. |
| (1622) 2,6-diethylnaphthalene | 288 | Liquid at 30° C. |
| (1623) 1,2-dimethoxybenzene | 207 | 23 |
| (1624) 1,3-dimethoxybenzene | 217 | −52 |
| (1625) 2,5-dimethoxytoluene | 218 | 20 |

TABLE 7-continued

Properties of exemplary non-polar solvents
according to embodiments of the present disclosure.
Chemical structures are shown in FIG. 16 where they
are labelled by the corresponding number shown in Table 7.

| Solvent Name | Boiling Point (° C. at 1 atm) | Melting Point (° C. at 1 atm) |
| --- | --- | --- |
| (1626) 1,2-dimethylnaphthalene | 262 | −2 |
| (1627) 1,2-dimethyl-3-propylbenzene | 204 | −45 |
| (1628) ethyl benzoate | 213 | −34 |
| (1629) ethyl cinnamate | 271 | 7 |
| (1630) 1-ethylnaphthalene | 253 | −15 |
| (1631) 4-ethylphenetole | 205 | Liquid at 30° C. |
| (1632) 1-ethyl-3-propylbenzene | 204 | −45 |
| (1633) hexyl benzene | 224 | −61 |
| (1634) isopentyl benzoate | 260 | Liquid at 30° C. |
| (1635) isopropyl cinnamate | 265 | Liquid at 30° C. |
| (1636) methyl benzoate | 200 | −12 |
| (1637) nonylbenzene | 280 | −24 |
| (1638) o-isobutyl toluene | 201 | −73 |
| (1639) octylbenzene | 265 | −36 |
| (1640) octylbenzoate | 305 | Liquid at 30° C. |
| (1641) p-anisaldehyde dimethyl acetal | 253 | −15 |
| (1642) pentaethylbenzene | 293 | Liquid at 30° C. |
| (1643) 1,1,3,3,5-pentamethylindane | — | — |
| (1644) pentyl benzene | 204 | −75 |
| (1645) 3-phenoxytoluene | 273 | Liquid at 30° C. |
| (1646) 4-(1-propenyl)-1,2-dimethoxybenzene | 264 | Liquid at 30° C. |
| (1647) propiophenone | 218 | 19 |
| (1648) 1-propylnaphthalene | 273 | −9 |
| (1649) 1-sec-butylnaphthalene | 274 | Liquid at 30° C. |
| (1650) 2,2,5,7-tetraethyltetraline | 274 | Liquid at 30° C. |
| (1651) 1,2,3,5-tetraethylbenzene | 256 | Liquid at 30° C. |

Optionally, a first polar solvent in the perovskite ink may be chosen because the first perovskite light emitting material has high solubility in this first polar solvent, which may provide the perovskite ink with a long shelf life. Optionally, a second solvent in the perovskite ink may be chosen because it has a preferred viscosity that enables the perovskite ink to form droplets during inkjet printing. Optionally, a third solvent in the perovskite ink may be chosen because it has a high boiling point, low vapour pressure or low RER, which provides the perovskite ink with stability against drying prematurely and non-uniformly. Optionally, a fourth solvent in the perovskite ink may be chosen because it has a preferred surface tension that enables the perovskite ink to spread uniformly across a substrate and assemble uniform perovskite emissive layers during inkjet printing and vacuum drying.

Optionally, the perovskite ink may comprise perovskite light emitting material mixed in a first polar solvent and a second solvent, wherein the second solvent is a non-polar solvent, and wherein the perovskite light emitting material is less soluble in the non-polar second solvent than in the first polar solvent. Such as combination of a first polar solvent with a non-polar second solvent may be preferred because during assembly of a perovskite emissive layer from the perovskite ink, the morphology of the perovskite emissive layer may be controlled for optimized optoelectronic performance. In particular, the size of crystals in the perovskite emissive layer may be optimized by controlling the relative rates at which the first polar solvent and non-polar second solvent evaporate from the perovskite ink during assembly of a perovskite emissive layer. This may be determined by the boiling points, vapour pressures and relative evaporation rates of the first polar solvent and non-polar second solvent.

In one embodiment, the boiling point of the first polar solvent may be lower than the boiling point of the non-polar second solvent. Such a perovskite ink formulation may be preferred because during assembly of a perovskite emissive layer from a perovskite ink, the first polar solvent may evaporate from the perovskite ink at a faster rate than the non-polar second solvent. During assembly of the perovskite emissive layer, the relative proportion of the non-polar second solvent in the perovskite ink therefore increases. The perovskite emissive light emitting material may be less soluble in the non-polar second solvent than in the first polar solvent so heterogeneous nucleation may be accelerated which may result in assembly of a perovskite emissive layer with an optimized crystal structure and morphology. In one embodiment, the boiling point of the first polar solvent may be at least 20° C. lower than the boiling point of the non-polar second solvent. Preferably, the boiling points of the first polar solvent and the non-polar second solvent may both be 200° C. or more.

In one embodiment, the boiling point of the first polar solvent may be higher than the boiling point of the non-polar second solvent. Such a perovskite ink formulation may be preferred because during assembly of a perovskite emissive layer from a perovskite ink, the first polar solvent may evaporate from the perovskite ink at a slower rate than the non-polar second solvent. During assembly of the perovskite emissive layer, the relative proportion of the non-polar second solvent in the perovskite ink therefore decreases. The perovskite emissive light emitting material may be less soluble in the non-polar second solvent than in the first polar solvent so heterogeneous nucleation may be decelerated which may result in assembly of a perovskite emissive layer with an optimized crystal structure and morphology. In one embodiment, the boiling point of the first polar solvent may be at least 20° C. higher than the boiling point of the non-polar second solvent. Preferably, the boiling points of the first polar solvent and the non-polar second solvent may both be 200° C. or more.

In one embodiment, the concentration of the non-polar second solvent in the ink formulation is in the range of 0.01 wt. % to 20 wt. %. In one embodiment, the concentration of the non-polar second solvent in the ink formulation is in the range of 0.1 wt. % to 10 wt. %. In one embodiment, the concentration of the non-polar second solvent in the ink formulation is in the range of 1 wt. % to 2 wt. %.

The disclosed perovskite inks may be used to prepare perovskite emissive layers according to methods disclosed herein. An example of an industrial manufacturing method 1000 for assembling a perovskite emissive layer from a perovskite ink is depicted in FIG. 10 and in FIG. 11.

Figure 10:
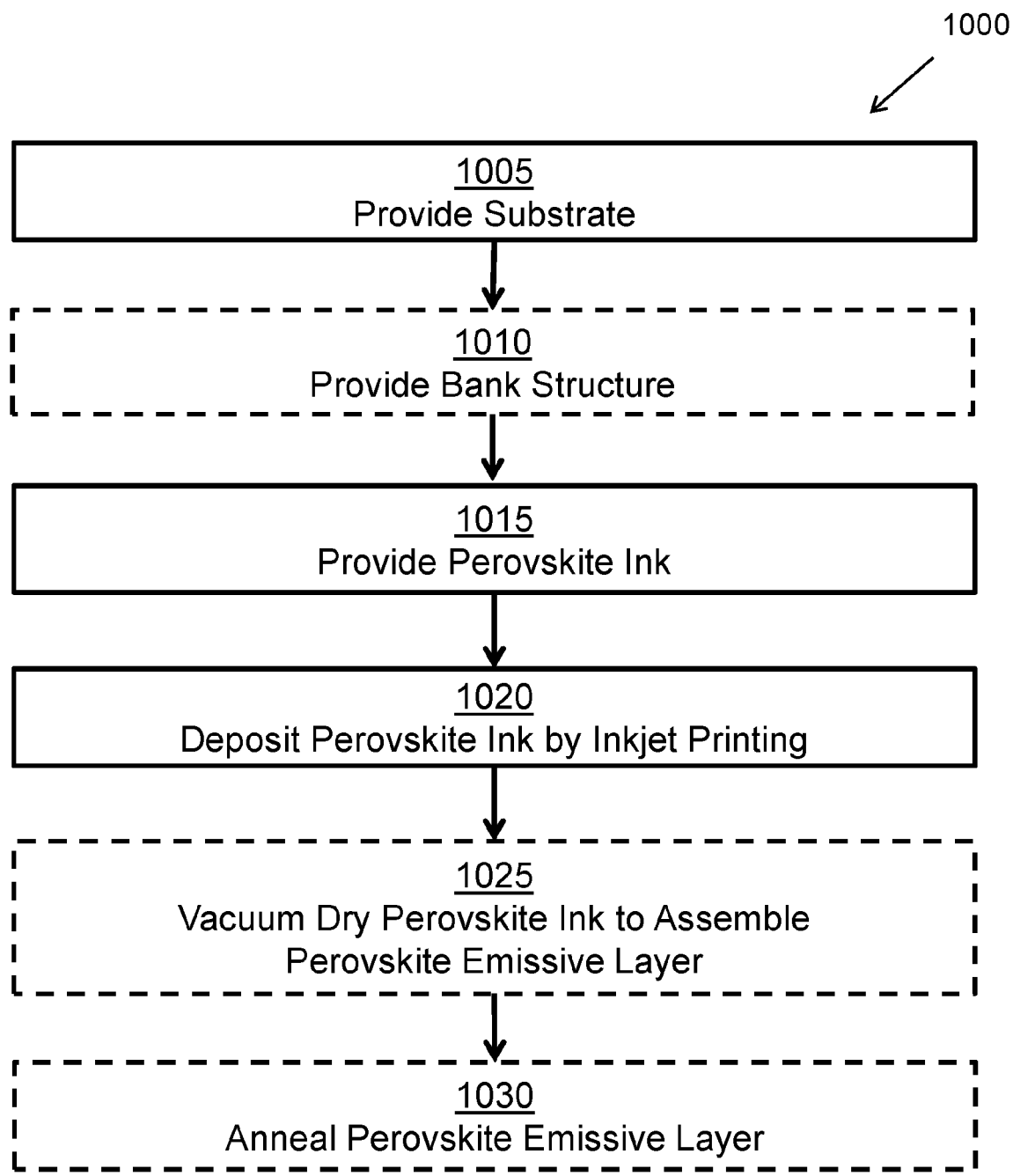
FIG. 10 depicts a method for assembling a perovskite emissive layer from a perovskite ink.

As depicted in FIG. 10, the method 1000 comprises: step 1005 of providing a substrate, which is labelled "Provide Substrate"; an optional step 1010 of providing a bank structure disposed over the substrate, wherein the bank structure is patterned so as to define at least one sub-pixel on the substrate, which is labelled "Provide Bank Structure"; step 1015 of providing a perovskite ink, wherein the perovskite ink comprises a first polar solvent having a boiling point of 150° C. or more, optionally 200° C. or more, and a melting point of 30° C. or less and a first perovskite light emitting material mixed in the first polar solvent at a concentration in the range of 0.01 wt. % to 10 wt. %, which is labelled "Provide Perovskite ink"; step 1020 of depositing the perovskite ink over the substrate using a method of inkjet printing, which is labelled "Deposit Perovskite ink by Inkjet Printing"; an optional step 1025 of vacuum drying the perovskite ink inside a vacuum drying chamber to assemble a perovskite emissive layer over the substrate, which is labelled "Vacuum Dry Perovskite ink to Assemble Perovskite Emissive Layer"; and an optional step 1030 at the end of the process flow of annealing the perovskite emissive layer, which is labelled as "Anneal Perovskite Emissive Layer". Method 1000 may be understood with reference to FIG. 11, which depicts the assembly of a perovskite emissive layer from a perovskite ink.

Figure 11:
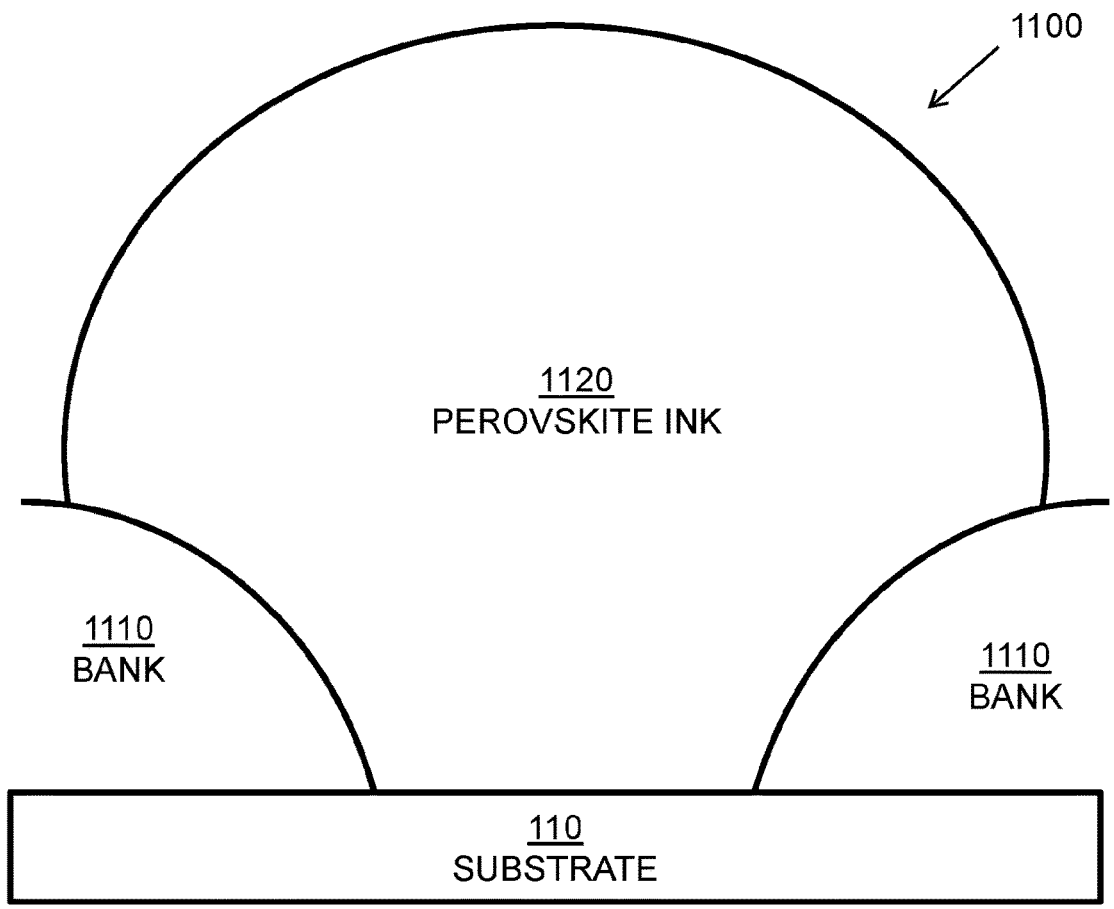
FIG. 11 depicts the assembly of a perovskite emissive layer from a perovskite ink.
Figure 11:
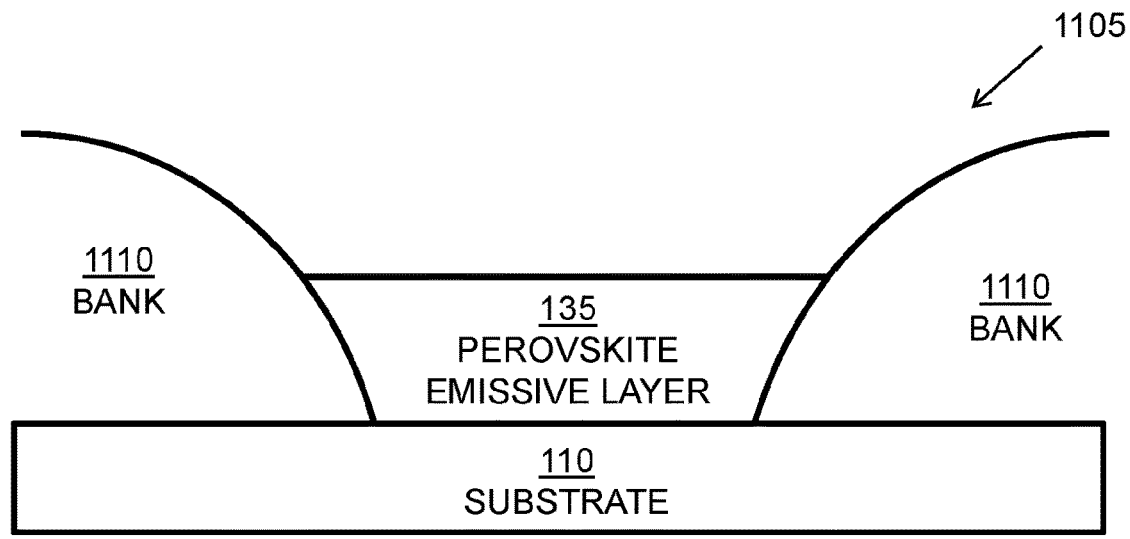

Method 1000 comprises a step 1005 of providing a substrate 110. FIG. 11 depicts a substrate 110. The substrate 110 may be rigid or flexible. The substrate 110 may be flat or curved. The substrate 110 may be transparent, translucent or opaque. Preferred substrate 110 materials are glass, plastic and metal foil.

In one embodiment, method 1000 further comprises an optional step 1010 of providing a bank structure 1110 disposed over the substrate 110, wherein the bank structure is patterned so as to define at least one sub-pixel on the substrate. FIG. 11 depicts a bank structure 1110. The bank structure 1110 may be patterned so as to define at least one sub-pixel on the substrate 110. As depicted in FIG. 11, the bank structure 1110 may define an area into which a perovskite ink may be inkjet printed and contained. For a display, the defined area may correspond to a sub-pixel of the display. Step 1010 is optional. This optional step is depicted by a box with a dashed line in FIG. 10. In some embodiments, a bank structure 1110 may not be needed define an area into which a perovskite ink may be inkjet printed and contained. For example, the perovskite ink may be flood printed over a large substrate area without containment by a bank structure 1110.

Method 1000 further comprises a step 1015 of providing a perovskite ink 1120, wherein the perovskite ink 1120 comprises a first polar solvent having a boiling point of 150° C. or more, optionally 200° C. or more, and a melting point of 30° C. or less and a first perovskite light emitting material mixed in the first polar solvent at a concentration in the range of 0.01 wt. % to 10 wt. %. FIG. 11 depicts a perovskite ink 1120. The first polar solvent is needed to solubilize the first perovskite light emitting material to form a perovskite ink 1120 that can be inkjet printed.

Method 1000 further comprises a step 1020 of depositing the perovskite ink 1120 over the substrate 110 using a method of inkjet printing. Inkjet printing has several advantages over other deposition techniques. Inkjet printing is readily compatible with manufacturing processes for displays. Ink droplets may be printed uniformly with high accuracy and at high speed across large area substrates. Ink droplets may be printed on demand with no more than the necessary ink volume for each layer deposited into each sub-pixel, resulting in substantially higher material utilization than for vacuum deposition processes. Inkjet printing allows for inks for red, green and blue emissive layers to be deposited within different sub-pixels of a display, without the need for expensive fine metal masks that would be required for patterning red, green and blue emissive layers within different sub-pixels of a display using vapour deposition processes. The inkjet printing process may be performed in an atmosphere of air or nitrogen, avoiding the need for expensive vacuum chambers, as required to deposit layers using vacuum deposition processes.

Arrangement 1100 in FIG. 11a depicts a perovskite ink 1120 that has been deposited into a sub-pixel over a substrate 110 using a method of inkjet printing. The sub-pixel is defined by the bank structure 1110.

In one embodiment, method 1000 further comprises an optional step 1025 of vacuum drying the perovskite ink inside a vacuum drying chamber to assemble a perovskite emissive layer 135 over the substrate 110. Optionally, the perovskite emissive layer 135 may be assembled in at least one sub-pixel. The process of vacuum drying can be understood with reference to FIG. 11. Arrangement 1100 in FIG. 11a depicts the status of method 1000 after step 1020, but before optional step 1025. That is to say, arrangement 1100 depicts the status before the optional step 1025 of vacuum drying the perovskite ink 1120. During optional step 1025, the arrangement 1100 is transferred to a vacuum drying chamber. Within the vacuum drying chamber, ambient pressure may be reduced to extract one or more solvents from the perovskite ink 1120. This may cause the perovskite ink 1120 to contract and solidify to assemble a perovskite emissive layer 135. Arrangement 1105 in FIG. 11b depicts the status of method 1000 after optional step 1025. That is to say, arrangement 1105 depicts the status after the optional step 1025 of vacuum drying the perovskite ink 1120. After vacuum drying, one or more solvents have been extracted from perovskite ink 1120, and a perovskite emissive layer 135 may have been assembled. Step 1025 is optional. This optional step is depicted by a box with a dashed line in FIG. 10. In some embodiments, an optional vacuum drying step 1025 may not be needed to assemble an emissive layer 135. For example, a perovskite emissive layer 135 may instead be assembled by allowing the perovskite ink 1120 to dry in ambient conditions or by annealing the perovskite ink 1120.

However, vacuum drying has several advantages over other layer assembly techniques and is preferred. For example, the rate at which one or more solvents are extracted from the perovskite ink 1120 may be controlled by varying the rate at which pressure is reduced in a vacuum drying chamber. This enables both the profile and morphology of the assembled perovskite emissive layer 135 to be controlled by varying the rate of vacuum drying of the perovskite ink 1120. Using an external factor, such as ambient pressure, to control the morphology and profile of the perovskite emissive layer 135 is advantageous compared to self-assembly techniques, such as those disclosed in Wang et al. because the perovskite emissive layer 135 properties may be controlled more precisely and with greater reproducibility. Preferably the optional step 1025 of vacuum drying is performed at a temperature of 30° C. or less. This allows the substrate 110 to be transferred into the vacuum drying chamber without uneven heating of the substrate 110 during the transfer process, which would lead to non-uniform drying of perovskite ink 1120 and a non-uniform perovskite emissive layer 135.

In one embodiment, method 1000 further comprises an optional step 1030 of annealing the perovskite emissive layer 135. Step 1030 is optional. This optional step is depicted by a box with a dashed line in FIG. 10. In some embodiments, an optional annealing step 1030 may not be needed. However, annealing has several advantages and is preferred. By annealing the perovskite emissive layer 135, any residual solvent may be removed from the perovskite emissive layer 135. Furthermore, by annealing the perovskite emissive layer 135, the thickness, morphology or profile of the perovskite emissive layer 135 may be defined by any movement of the perovskite emissive layer 135 during extraction of any residual solvent during the annealing process.

In one embodiment, during the optional step 1030 of annealing the perovskite emissive layer 135, the annealing temperature may be in the range of 80° C. to 200° C. In one embodiment, during the optional step 1030 of annealing the perovskite emissive layer 135, the annealing temperature may be in the range of 80° C. to 160° C. Such a range of annealing temperatures may effectively enable any residual solvent to be removed from the perovskite emissive layer 135.

Preferably, the optional step 1030 of annealing the perovskite emissive layer 135 is performed after the optional step 1025 of vacuum drying. Preferably, the optional step 1030 of annealing the perovskite emissive layer 135 is performed in a different chamber to the optional step 1025 of vacuum drying. Separation of the optional step 1025 of vacuum drying and the optional step 1030 of annealing allows for vacuum drying to be performed at a temperature of 30° C. or less, which as mentioned in the foregoing prevents non-uniform drying during transfer of the substrate 110 into the vacuum drying chamber. Furthermore, separate chambers may be used for the optional step 1025 of vacuum drying and the optional step 1030 of annealing. This allows for the design of manufacturing equipment where the vacuum drying chamber may be designed to process one substrate at a time, and where the annealing chamber may be designed to process multiple substrates simultaneously. This may be advantageous because the optimized time for the optional annealing step 1030 may be substantially longer than the optimized time for the optional vacuum drying step 1025.

In one embodiment of step 1015 of method 1000, the first polar solvent has a boiling point in the range of 150° C. to 300° C. In one embodiment of step 1015 of method 1000, the first polar solvent has a boiling point in the range of 200° C. to 300° C. In one embodiment of step 1015 of method 1000, the first polar solvent has a boiling point in the range of 225° C. to 300° C. In one embodiment of step 1015 of method 1000, the first polar solvent has a boiling point in the range of 250° C. to 300° C.

Preferably, the first polar solvent has a boiling point of at least 150° C. For industrial manufacturing with takt times of up to a few minutes, substantially no solvent evaporation is expected from a perovskite ink 1120 comprising a solvent with a boiling point of at least 150° C. during the step 1020 of inkjet printing. Without any substantial premature drying, the perovskite ink 1120 is therefore expected to be vacuum dried reproducibly in the controlled environment of the vacuum drying chamber during optional step 1025 to produce uniform perovskite emissive layers 135 with optimized optoelectronic performance.

If the first polar solvent had a boiling point of less than 150° C., a manufacturing process with lower yield would be expected. The manufacturing process window would be expected to become narrower as the boiling point of the first polar solvent is reduced. The step 1020 of inkjet printing would then need to be performed faster to prevent substantial solvent evaporation from the perovskite ink 1120 before the optional step 1025 of vacuum drying. Such solvent evaporation would lead to uncontrolled and non-uniform drying of the perovskite ink 1200 across the substrate 110 prior to the optional step 1025 of vacuum drying, which would result in non-uniform perovskite emissive layers 135 after the optional step 1025 of vacuum drying with reduced optoelectronic performance.

More preferably, the perovskite ink 1120 comprises a first polar solvent having a boiling point in the range of 200° C. to 300° C. Even more preferably, the perovskite ink 1120 comprises a first polar solvent having a boiling point in the range of 225° C. to 300° C. Most preferably, the perovskite ink 1120 comprises a first polar solvent having a boiling point in the range of 250° C. to 300° C. A higher boiling point is preferred because this increases the process window during the step 1020 of inkjet printing, which increases manufacturing yield and reduces costs.

A first polar solvent with a boiling point of 300° C. or less is preferred. The evaporation rate from a perovskite ink 1120 comprising such a first polar solvent is expected to be higher than for a perovskite ink 1120 comprising a first polar solvent with a boiling point of more than 300° C. A perovskite ink 1120 comprising such a first polar solvent with a boiling point of 300° C. or less may by vacuum dried during optional step 1025 to assemble a perovskite emissive layer 135 more rapidly than a perovskite ink comprising a first polar solvent with a boiling point of more than 300° C. This is compatible with industrial manufacturing methods where low takt time and high throughput are required. Furthermore, the evaporation rate of residual polar solvent from a perovskite emissive layer 135 assembled from a perovskite ink 1120 comprising such a first polar solvent with a boiling point of 300° C. or less is expected to be higher than for a perovskite emissive layer 135 assembled from a perovskite ink 1120 comprising a first polar solvent with a boiling point of more than 300° C. The removal of residual polar solvent by annealing from such a perovskite emissive layer 135 during optional step 1030 is therefore expected to be more rapid. This is compatible with industrial manufacturing methods where low takt time and high throughput are required.

Figure 12:
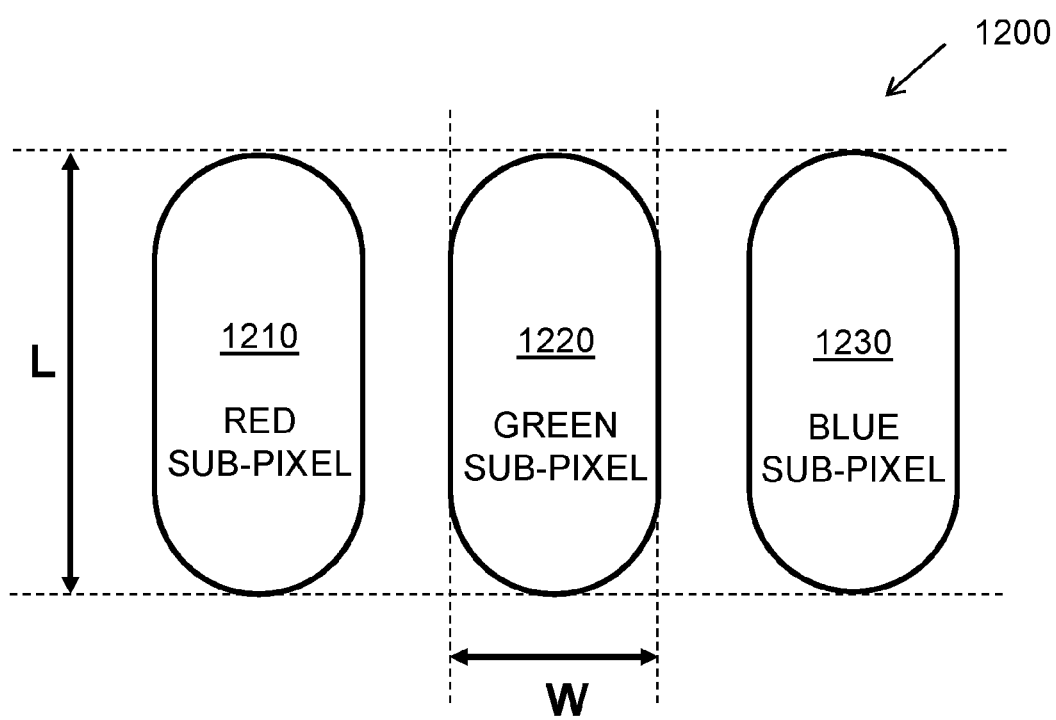
FIG. 12 depicts exemplary designs of sub-pixels.

In one embodiment, the disclosed method 1000 may be applied to assemble perovskite emissive layers 135 in sub-pixels of a display using the disclosed perovskite ink formulations 1120. FIG. 12 depicts exemplary designs of sub-pixels. Included in FIG. 12 is an arrangement 1200 of three adjacent sub-pixels, each of length L and width W.

The first sub-pixel 1210 may comprise a red sub-pixel, wherein such a red sub-pixel may comprise a red perovskite light emitting device comprising a red perovskite emissive layer 135. The second sub-pixel 1220 may comprise a green sub-pixel, wherein such a green sub-pixel may comprise a green perovskite light emitting device comprising a green perovskite emissive layer 135. The third sub-pixel 1230 may comprise a blue sub-pixel, wherein such a blue sub-pixel may comprise a blue perovskite light emitting device comprising a blue perovskite emissive layer 135. A typical pixel arrangement of a commercial display may comprise a sub-pixel arrangement such as 1200.

Figure 13:
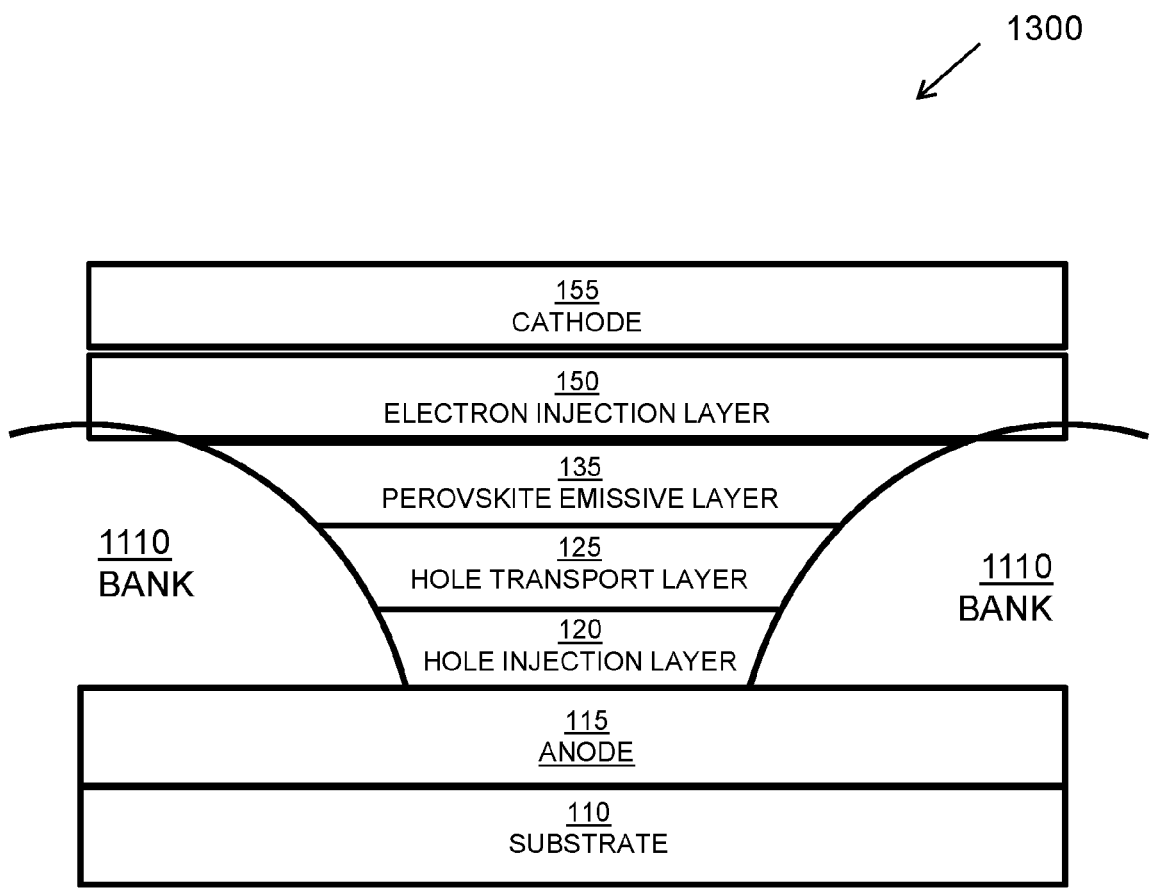
FIG. 13 depicts a cross-section of an exemplary perovskite light emitting device.

The present invention relates to perovskite ink formulations 1120, and to methods of using these perovskite ink formulations 1120 to assemble perovskite emissive layers 135. The present invention further relates to PeLEDs comprising one or more perovskite emissive layers 135 assembled using the disclosed methods and perovskite ink formulations 1120. FIG. 13 depicts a cross-section of an exemplary PeLED 1300 comprising a perovskite emissive layer 135 assembled using the disclosed method and perovskite ink formulations 1120. The PeLED 1300 comprises a substrate 110, an anode 115, a hole injection layer 120, a hole transport layer 125, a perovskite emissive layer 135, an electron injection layer 150 and a cathode 155. The PeLED 1300 further comprises a bank structure 1110. The PeLED 1300 is one example of a PeLED that may be fabricated using the disclosed method and perovskite ink formulations. Additional PeLED architectures may also be fabricated using the disclosed method, and these additional device architectures are also covered by this disclosure.

In one embodiment, a PeLED fabricated by the disclosed method may be incorporated into a sub-pixel of a display. Optionally, the display may be incorporated into a wide range of consumer products. Optionally, the display may be used in televisions, computer monitors, tablets, laptop computers, smart phones, cell phones, digital cameras, video recorders, smartwatches, fitness trackers, personal digital assistants, vehicle displays and other electronic devices. Optionally, the display may be used for micro-displays or heads-up displays. Optionally, the display may be used in light sources for interior or exterior illumination and/or signalling, in smart packaging or in billboards.

A person skilled in the art will understand that only a few examples of use are described, but that they are in no way limiting.

Modifications to embodiments of the invention described in the foregoing are possible without departing from the scope of the invention as defined by the accompanying claims. Expressions such as "including", "comprising", "incorporating", "consisting of", "have", "is" used to describe and claim the present invention are intended to be construed in a non-exclusive manner, namely allowing for items, components or elements not explicitly described also to be present. Reference to the singular is also to be construed to relate to the plural. Any numerals included within parentheses in the accompanying claims are intended to assist understanding of the claims and should not be construed in any way to limit subject matter claimed by these claims.

REFERENCES

Adjokatse et al., Broadly tunable metal halide perovskites for solid-state light-emission applications, Materials Today, Volume 20, Issue 8, Pages 413-424 (2017).
Byeong Jo Kim et al., Selective dissolution of halide perovskites as a step towards recycling solar cells, Nature Communications, Volume 7, Article 11735 (2016).
Hirose et al., High-efficiency Perovskite QLED Achieving BT.2020 Green Chromaticity, SID Symposium Digest of Technical Papers 2017, Volume 48, Pages 284-287 (2017).
Kumar et al., Efficient Blue Electroluminescence Using Quantum-Confined Two-Dimensional Perovskites, ACS Nano, Volume 10, Pages 9720-9729 (2016).
Soneira et al., iPhone X OLED Display Technology Shoot-Out, DisplayMate Technologies Corporation, http://www.displaymate.com/iPhoneX_ShootOut_1a.htm [accessed 20 May 2018].
Wang et al., Perovskite light-emitting diodes based on solution-processed, self-organised multiple quantum wells, Nature Photonics, Volume 10, Pages 699-704 (2016).

The invention claimed is:

1. A perovskite ink comprising:
a first polar solvent, wherein the first polar solvent has a boiling point of 150° C. or more and a melting point of 30° C. or less; and
a perovskite precursor material mixed in the first polar solvent, wherein the concentration of the perovskite precursor material in the perovskite ink is in the range of 0.01 wt. % to 10 wt. %;
wherein the perovskite precursor material is a precursor material, which participates in a chemical reaction to assemble a perovskite light emitting material;
wherein the perovskite ink further comprises a second solvent, which is a non-polar solvent; and
wherein the boiling point of the first polar solvent is lower than the boiling point of the non-polar solvent.

2. The perovskite ink of claim 1, wherein the first polar solvent has a boiling point of 200° C. or more.

3. The perovskite ink of claim 1, wherein the boiling point of the second solvent is 200° C. or higher.

4. The perovskite ink of claim 1, wherein the concentration of the second solvent in the perovskite ink is in the range of 0.01% wt. to 20% wt.

5. The perovskite ink of claim 1, wherein the first polar solvent has a boiling point in the range of 150° C. to 300° C.

6. The perovskite ink of claim 5, wherein the first polar solvent has a boiling point in the range of 200° C. to 300° C.

7. The perovskite ink of claim 6, wherein the first polar solvent has a boiling point in the range of 225° C. to 300° C.

8. The perovskite ink of claim 7, wherein the first polar solvent has a boiling point in the range of 250° C. to 300° C.

9. The perovskite ink of claim 1, wherein the first polar solvent is selected from the group consisting of: dimethylformamide (DMF), dimethylacetamide (DMAc), dimethyl sulfoxide (DMSO), cyclohexanone, cyclohexanol, 2-aminoethanol (MEA), benzonitrile, ethylene glycol (EG), N-Methyl-2-Pyrrolidone (NMP), Gamma-Butyrolactone (GBL), Gamma-Valerolactone (GVL), formamide, 1,3-Dimethyl-2-Imidazolidinone (DMI), Hexamethylphosphoramide (HMPA), Propylene Carbonate (PC), Ethylene Carbonate (EC), N,N'-Dimethylpropyleneurea (DMPU), dihydrolevoglucosenone (cyrene), diethylene glycol (DG), sulfolane, and glycerol.

10. The perovskite ink of claim 1, wherein the second solvent is acetophenone, amyl benzoate, anethole, 1,4-bezodioxane, benzyl acetone, benzyl butyl ether, 3-benzyl-4-heptanone, benzyl heptanoate, benzyl hexanoate, benzyl octanoate, benzyl valerate, bicyclohexyl, butoxy benzene, butyl benzoate, 1-butylnaphthalene, 1-butyl-[1,2,3,4-tetrahydro-naphthalene], butyl phenyl ether, cyclohexyl benzene, decylbenzene, dibenzyl ether, dicyclohexylmethane, 2,6-diethylnapthalene, 1,2-dimethoxybenzene, 1,3-dimethoxybenzene, 2,5-dimethoxytoluene, 1,2-dimethylnaphthalene, 1,2-dimethyl-3-propylbenzene, ethyl benzoate, ethyl cinnamate, 1-ethylnaphthalene, 4-ethylphenetole, 1-ethyl-3-propylbenzene, hexyl benzene, isopentyl benzoate, isopropyl cinnamate, methyl benzoate, nonylbenzene, o-isobutyl toluene, octylbenzene, octylbenzoate, p-anisaldehyde dimethyl acetal, pentaethylbenzene, 1,1,3,3,5-pentamethylindane, pentyl benzene, 3-phenoxytoluene, 4-(1-propenyl)-1, 2-dimethoxybenzene, propiophenone, 1-propylnaphthalene, 1-sec-butylnaphthalene, 2,2,5,7-tetraethyltetraline, or 1,2,3,5-tetraethylbenzene.

11. The perovskite ink of claim 1, wherein the perovskite precursor material is selected from any of the following: $CH_3NH_3I$ and $PbI_2$ configured to assemble $CH_3NH_3PbI_3$; $CH_3NH_3Br$ and $PbBr_2$ configured to assemble $CH_3NH_3PbBr_3$; $CH_3NH_3Cl$ and $PbCl_2$ configured to assemble $CH_3NH_3PbCl_3$; $CH(NH_2)_2I$ and $PbI_2$ configured to assemble $CH(NH_2)_2PbI_3$; $CH(NH_2)_2Br$ and $PbBr_2$ configured to assemble $CH(NH_2)_2PbBr_3$; $CH(NH_2)_2Cl$ and $PbCl_2$ configured to assemble $CH(NH_2)_2PbCl_3$; CsI and $PbI_2$ configured to assemble $CsPbI_3$; CsBr and $PbBr_2$ configured to assemble $CsPbBr_3$; CsCl and $PbCl_2$ configured to assemble $CsPbCl_3$; or any of these materials in which the divalent metal cation lead ($Pb^+$) is replaced with tin ($Sn^+$), copper ($Cu^+$) or europium ($Eu^+$).

12. The perovskite ink of claim 1, wherein the perovskite precursor material is configured to assemble a perovskite material selected from any of the following: $CH_3NH_3PbI_{3-x}Cl_x$; $CH_3NH_3PbI_{3-x}Br_x$; $CH_3NH_3PbCl_{3-x}Br_x$; $CH(NH_2)_2PbI_{3-x}Br_x$; $CH(NH_2)_2PbI_{3-x}Cl_x$; $CH(NH_2)_2PbCl_{3-x}Br_x$; $CsPbI_{3-x}Cl_x$; $CsPbI_{3-x}Br_x$ and $CsPbCl_{3-x}Br_x$, where x is in the range of 0-3; or any of these materials in which the divalent metal cation lead ($Pb^+$) is replaced with tin ($Sn^+$), copper ($Cu^+$) or europium ($Eu^+$).

13. The perovskite ink of claim 1, wherein the perovskite precursor material is selected from any of the following: $C_{10}H_7CH_2NH_3I$ and $PbI_2$ configured to assemble $(C_{10}H_7CH_2NH_3)_2PbI_4$; $C_{10}H_7CH_2NH_3Br$ and $PbBr_2$ configured to assemble $(C_{10}H_7CH_2NH_3)_2PbBr_4$; $C_{10}H_7CH_2NH_3Cl$ and $PbCl_2$ configured to assemble $(C_{10}H_7CH_2NH_3)_2PbCl_4$; $C_6H_5C_2H_4NH_3I$ and $PbI_2$ configured to assemble $(C_6H_5C_2H_4NH_3)_2PbI_4$; $C_6H_5C_2H_4NH_3Br$ and $PbBr_2$ configured to assemble $(C_6H_5C_2H_4NH_3)_2PbBr_4$; $C_6H_5C_2H_4NH_3Cl$ and $PbCl_2$ configured to assemble $(C_6H_5C_2H_4NH_3)_2PbCl_4$; or any of these materials in which the divalent metal cation lead ($Pb^+$) is replaced with tin ($Sn^+$), copper ($Cu^+$) or europium ($Eu^+$).

14. The perovskite ink of claim 1, wherein the perovskite precursor material is configured to assemble a perovskite material with mixed halides selected from any of the following: $(C_{10}H_7CH_2NH_3)_2PbI_{4-x}Cl_x$, $(C_{10}H_7CH_2NH_3)_2PbI_{4-x}Br_x$, $(C_{10}H_7CH_2NH_3)_2PbCl_{4-x}Br_x$, $(C_6H_5C_2H_4NH_3)_2PbI_{4-x}Cl_x$, $(C_6H_5C_2H_4NH_3)_2PbI_{4-x}Br_x$ and $(C_6H_5C_2H_4NH_3)_2PbCl_{4-x}Br_x$, where x is in the range of 0-4; or any of these materials in which the divalent metal cation lead ($Pb^+$) is replaced with tin ($Sn^+$), copper ($Cu^+$) or europium ($Eu^+$).

15. The perovskite ink of claim 1, wherein the perovskite precursor material is selected from any of the following: $C_6H_5C_2H_4NH_3Br$, $CH(NH_2)_2Br$ and $PbI_2$ configured to assemble $(C_6H_5C_2H_4NH_3)_2(CH(NH_2)_2PbBr_3)_{n-1}PbI_4$; $C_6H_5C_2H_4NH_3Br$, $CH(NH_2)_2Br$ and $PbBr_2$ configured to assemble $(C_6H_5C_2H_4NH_3)_2(CH(NH_2)_2PbBr_3)_{n-1}PbBr_4$; $C_6H_5C_2H_4NH_3Br$, $CH(NH_2)_2Br$ and $PbCl_2$ configured to assemble $(C_6H_5C_2H_4NH_3)_2(CH(NH_2)_2PbBr_3)_{n-1}PbCl_4$; $C_{10}H_7CH_2NH_3I$, $CH_3NH_3Br$ and $PbI_2$ configured to assemble $(C_{10}H_7CH_2NH_3)_2(CH_3NH_3PbI_2Br)_{n-1}PbI_4$; $C_{10}H_7CH_2NH_3I$, $CH_3NH_3Br$ and $PbBr_2$ configured to assemble $(C_{10}H_7CH_2NH_3)_2(CH_3NH_3PbI_2Br)_{n-1}PbBr_4$; and $C_{10}H_7CH_2NH_3I$, $CH_3NH_3Br$ and $PbCl_2$ configured to assemble $(C_{10}H_7CH_2NH_3)_2(CH_3NH_3PbI_2Br)_{n-1}PbCl_4$, where n is in the range of 2-10; or any of these materials in which the divalent metal cation lead ($Pb^+$) is replaced with tin ($Sn^+$), copper ($Cu^+$) or europium ($Eu^+$).

16. The perovskite ink of claim 1, wherein the perovskite precursor material is configured to assemble Quasi-2D perovskite materials with mixed halides selected from:
$(C_6H_5C_2H_4NH_3)_2(CH(NH_2)_2PbBr_3)_{n-1}PbI_{4-x}Cl_x$;
$(C_6H_5C_2H_4NH_3)_2(CH(NH_2)_2PbBr_3)_{n-1}PbI_{4-x}Br_x$;
$(C_6H_5C_2H_4NH_3)_2(CH(NH_2)_2PbBr_3)_{n-1}PbCl_{4-x}Br_x$;
$(C_{10}H_7CH_2NH_3)_2(CH_3NH_3PbI_2Br)_{n-1}PbI_{4-x}Cl_x$;
$(C_{10}H_7CH_2NH_3)_2(CH_3NH_3PbI_2Br)_{n-1}PbI_{4-x}Br_x$; and
$(C_{10}H_7CH_2NH_3)_2(CH_3NH_3PbI_2Br)_{n-1}PbCl_{4-x}Br_x$, where n is in the range of 2-10, and x is in the range of 0-4; or any of these materials in which the divalent metal cation lead ($Pb^+$) is replaced with tin ($Sn^+$), copper ($Cu^+$) or europium ($Eu^+$).

17. A method of assembling a perovskite emissive layer, comprising the steps of:
providing a substrate;
providing a perovskite ink; and
depositing the perovskite ink onto the substrate by a method of inkjet printing;
wherein the perovskite ink comprises:
a first polar solvent, wherein the first polar solvent has a boiling point of 150° C. or more and a melting point of 30° C. or less; and
perovskite precursor material mixed in the first polar solvent, wherein the concentration of the perovskite precursor material in the perovskite ink is in the range of 0.01 wt. % to 10 wt. %;
wherein the perovskite precursor material is precursor material, which participates in a chemical reaction to assemble a perovskite light emitting material;
wherein the perovskite ink further comprises a second solvent, which is a non-polar solvent; and
wherein the boiling point of the first polar solvent is lower than the boiling point of the non-polar solvent.

18. The method of claim 17, wherein the step of depositing the perovskite ink onto a substrate by the method of inkjet printing is followed by a step of vacuum drying the perovskite ink to assemble the perovskite emissive layer.

19. The method of claim 18, wherein the step of vacuum drying the perovskite ink to assemble a perovskite emissive layer is followed by a step of annealing the perovskite emissive layer.

20. A method of assembling a perovskite light emitting device, wherein at least one perovskite emissive layer of the perovskite light emitting device is assembled by a method comprising the steps of:
providing a substrate;
providing a perovskite ink; and
depositing the perovskite ink onto the substrate by a method of inkjet printing;
wherein the perovskite ink comprises:
a first polar solvent having a boiling point of 150° C. or more and a melting point of 30° C. or less; and
perovskite precursor material mixed in the first polar solvent, wherein the concentration of the perovskite precursor material in the perovskite ink is in the range of 0.01 wt. % to 10 wt. %;
wherein the perovskite precursor material is a precursor material which participates in a chemical reaction to assemble a perovskite light emitting material;

wherein the perovskite ink further comprises a second solvent, which is a non-polar solvent; and wherein the boiling point of the first polar solvent is lower than the boiling point of the non-polar solvent.

* * * * *